(12) United States Patent
Murakami et al.

(10) Patent No.: US 8,445,962 B2
(45) Date of Patent: May 21, 2013

(54) SEMICONDUCTOR DEVICE AND METHOD OF MANUFACTURING THE SAME

(75) Inventors: Satoshi Murakami, Kanagawa (JP); Shunpei Yamazaki, Tokyo (JP); Jun Koyama, Kanagawa (JP); Mitsuaki Osamè, Kanagawa (JP); Yukio Tanaka, Kanagawa (JP); Yoshiharu Hirakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 32 days.

(21) Appl. No.: 12/911,083

(22) Filed: Oct. 25, 2010

(65) Prior Publication Data

US 2011/0095312 A1    Apr. 28, 2011

Related U.S. Application Data

(62) Division of application No. 09/516,082, filed on Mar. 1, 2000, now Pat. No. 7,821,065.

(30) Foreign Application Priority Data

Mar. 2, 1999  (JP) .................................. 11-053424
Apr. 5, 1999  (JP) .................................. 11-097558

(51) Int. Cl.
*H01L 29/04*    (2006.01)
(52) U.S. Cl.
USPC ......... 257/347; 257/59; 257/72; 257/E29.151
(58) Field of Classification Search
USPC ............... 257/347, 59, 72, E29.151
See application file for complete search history.

(56) References Cited

U.S. PATENT DOCUMENTS

| | | | |
|---|---|---|---|
| 4,095,011 A | 6/1978 | Hawrylo et al. | |
| 4,802,873 A | 2/1989 | Barrow et al. | |
| 5,055,899 A | 10/1991 | Wakai et al. | |
| 5,247,190 A | 9/1993 | Friend et al. | |
| 5,287,205 A | 2/1994 | Yamazaki et al. | |
| 5,323,042 A | 6/1994 | Matsumoto | |
| 5,399,502 A | 3/1995 | Friend et al. | |

(Continued)

FOREIGN PATENT DOCUMENTS

| | | |
|---|---|---|
| EP | 0 541 295 A2 | 5/1993 |
| EP | 0 645 802 A2 | 3/1995 |

(Continued)

OTHER PUBLICATIONS

Yoshida, T. et al, "33.2: A Full-Color Thresholdless Antiferroelectric LCD Exhibiting Wide Viewing Angle with Fast Response Time," SID Digest 97: SID International Symposium Digest of Technical Papers, vol. 28, 1997, pp. 841-844.

(Continued)

*Primary Examiner* — Eugene Lee
(74) *Attorney, Agent, or Firm* — Husch Blackwell LLP

(57) ABSTRACT

An object of the present invention is to provide a semiconductor device having high operation characteristic and reliability. The measures taken are: A pixel capacitor is formed between an electrode comprising anodic capable material over an organic resin film, an anodic oxide film of the electrode and a pixel electrode above. Since the anodic oxide film is anodically oxidized by applied voltage per unit time at 15V/min, there is no wrap around on the electrode, and film peeling can be prevented.

28 Claims, 33 Drawing Sheets

701: n-CHANNEL TFT

U.S. PATENT DOCUMENTS

| Patent No. | | Date | Inventor |
|---|---|---|---|
| 5,403,772 | A | 4/1995 | Zhang et al. |
| 5,412,493 | A | 5/1995 | Kunii et al. |
| 5,414,547 | A | 5/1995 | Matsuo et al. |
| 5,441,618 | A | 8/1995 | Matsuda et al. |
| 5,499,123 | A | 3/1996 | Mikoshiba |
| 5,565,742 | A | 10/1996 | Shichao et al. |
| 5,585,951 | A | 12/1996 | Noda et al. |
| 5,594,569 | A | 1/1997 | Konuma et al. |
| 5,595,638 | A | 1/1997 | Konuma et al. |
| 5,643,826 | A | 7/1997 | Ohtani et al. |
| 5,659,375 | A | 8/1997 | Yamashita et al. |
| 5,677,207 | A | 10/1997 | Ha |
| 5,706,064 | A | 1/1998 | Fukunaga et al. |
| 5,708,485 | A | 1/1998 | Sato et al. |
| 5,708,486 | A | 1/1998 | Miyawaki et al. |
| 5,721,601 | A | 2/1998 | Yamaji et al. |
| 5,726,720 | A | 3/1998 | Watanabe et al. |
| 5,733,420 | A | 3/1998 | Matsuda et al. |
| 5,736,434 | A | 4/1998 | Konuma et al. |
| 5,747,830 | A * | 5/1998 | Okita .............................. 257/72 |
| 5,757,451 | A | 5/1998 | Miyazaki et al. |
| 5,776,622 | A | 7/1998 | Hung et al. |
| 5,815,223 | A | 9/1998 | Watanabe et al. |
| 5,815,226 | A | 9/1998 | Yamazaki et al. |
| 5,818,550 | A | 10/1998 | Kadota et al. |
| 5,821,622 | A | 10/1998 | Tsuji et al. |
| 5,905,548 | A | 5/1999 | Shimada |
| 5,917,563 | A | 6/1999 | Matsushima |
| 5,923,962 | A | 7/1999 | Ohtani et al. |
| 5,933,208 | A | 8/1999 | Kim |
| 5,952,708 | A | 9/1999 | Yamazaki |
| 5,969,832 | A | 10/1999 | Nakanishi et al. |
| 5,990,542 | A | 11/1999 | Yamazaki |
| 5,994,721 | A | 11/1999 | Zhong et al. |
| 6,001,539 | A | 12/1999 | Lyu et al. |
| 6,002,462 | A | 12/1999 | Sato et al. |
| 6,011,274 | A | 1/2000 | Gu et al. |
| 6,013,928 | A | 1/2000 | Yamazaki et al. |
| 6,020,598 | A | 2/2000 | Yamazaki |
| 6,031,290 | A | 2/2000 | Miyazaki et al. |
| 6,031,512 | A | 2/2000 | Kadota et al. |
| 6,049,092 | A | 4/2000 | Konuma et al. |
| 6,078,060 | A | 6/2000 | Shibuya et al. |
| 6,084,006 | A | 7/2000 | Kashiwazaki et al. |
| 6,087,679 | A | 7/2000 | Yamazaki et al. |
| 6,100,954 | A | 8/2000 | Kim et al. |
| 6,104,461 | A | 8/2000 | Zhang et al. |
| 6,111,361 | A | 8/2000 | Xu et al. |
| 6,115,094 | A | 9/2000 | Fukunaga |
| 6,118,505 | A | 9/2000 | Nagata et al. |
| 6,118,506 | A | 9/2000 | Yamazaki et al. |
| 6,137,552 | A | 10/2000 | Yanai |
| 6,141,066 | A | 10/2000 | Matsushima |
| 6,153,445 | A | 11/2000 | Yamazaki et al. |
| 6,153,893 | A | 11/2000 | Inoue et al. |
| 6,169,293 | B1 | 1/2001 | Yamazaki |
| 6,188,452 | B1 | 2/2001 | Kim et al. |
| 6,191,835 | B1 | 2/2001 | Choi |
| 6,201,585 | B1 | 3/2001 | Takano et al. |
| 6,211,928 | B1 | 4/2001 | Oh et al. |
| 6,222,595 | B1 | 4/2001 | Zhang et al. |
| 6,226,059 | B1 | 5/2001 | Yamamoto et al. |
| 6,238,754 | B1 | 5/2001 | Shohara et al. |
| 6,239,470 | B1 | 5/2001 | Yamazaki |
| 6,262,438 | B1 | 7/2001 | Yamazaki et al. |
| 6,323,521 | B1 | 11/2001 | Seo |
| 6,341,003 | B1 | 1/2002 | Ashizawa et al. |
| 6,346,718 | B1 | 2/2002 | Yamanaka et al. |
| 6,359,606 | B1 | 3/2002 | Yudasaka |
| 6,359,665 | B1 | 3/2002 | Matsushima |
| 6,362,028 | B1 | 3/2002 | Chen et al. |
| 6,384,818 | B1 | 5/2002 | Yamazaki et al. |
| 6,433,355 | B1 | 8/2002 | Riess et al. |
| 6,441,468 | B1 | 8/2002 | Yamazaki |
| 6,445,059 | B1 | 9/2002 | Yamazaki |
| 6,503,772 | B1 | 1/2003 | Ohtsu et al. |
| 6,507,381 | B1 | 1/2003 | Katsuya et al. |
| 6,627,957 | B1 | 9/2003 | Yamazaki |
| 6,692,983 | B1 | 2/2004 | Chen et al. |
| 6,734,839 | B2 | 5/2004 | Yudasaka |
| 6,757,032 | B1 | 6/2004 | Zhang et al. |
| 6,765,562 | B2 | 7/2004 | Yamazaki et al. |
| 6,787,887 | B2 | 9/2004 | Yamazaki |
| 6,798,474 | B2 | 9/2004 | Matsushima et al. |
| 6,800,875 | B1 | 10/2004 | Yamazaki |
| 6,806,932 | B2 | 10/2004 | Matsushima |
| 6,867,431 | B2 | 3/2005 | Konuma et al. |
| 6,867,434 | B2 | 3/2005 | Yamazaki |
| 7,019,385 | B1 | 3/2006 | Zhang et al. |
| 7,037,737 | B2 | 5/2006 | Kiguchi et al. |
| 7,057,691 | B2 | 6/2006 | Matsushima |
| 7,145,613 | B2 | 12/2006 | Zhang et al. |
| 7,190,418 | B2 | 3/2007 | Matsushima |
| 7,381,599 | B2 | 6/2008 | Konuma et al. |
| 7,525,158 | B2 | 4/2009 | Konuma et al. |
| 7,569,856 | B2 | 8/2009 | Konuma et al. |
| 2001/0025958 | A1 | 10/2001 | Yamazaki et al. |
| 2002/0089497 | A1 | 7/2002 | Yudasaka |
| 2004/0257357 | A1 | 12/2004 | Yamazaki et al. |
| 2005/0023526 | A1 | 2/2005 | Yamazaki |
| 2005/0082529 | A1 | 4/2005 | Yamazaki |
| 2005/0088433 | A1 | 4/2005 | Yamazaki et al. |
| 2005/0093852 | A1 | 5/2005 | Yamazaki et al. |
| 2006/0097275 | A1 | 5/2006 | Tsai et al. |
| 2009/0289254 | A1 | 11/2009 | Konuma et al. |

FOREIGN PATENT DOCUMENTS

| | | |
|---|---|---|
| EP | 0 961 525 A1 | 12/1999 |
| EP | 1 564 799 A2 | 8/2005 |
| EP | 1 564 800 A2 | 8/2005 |
| JP | 60-191289 | 9/1985 |
| JP | 62-143027 | 6/1987 |
| JP | 63-104025 | 5/1988 |
| JP | 64-40889 | 2/1989 |
| JP | 2-54217 | 2/1990 |
| JP | 3-194895 | 8/1991 |
| JP | 4-125683 | 4/1992 |
| JP | 4-163528 | 6/1992 |
| JP | 4-253028 | 9/1992 |
| JP | 6-82829 | 3/1994 |
| JP | 6-186544 | 7/1994 |
| JP | 6-242433 | 9/1994 |
| JP | 7-130652 | 5/1995 |
| JP | 7-169974 | 7/1995 |
| JP | 7-209670 | 8/1995 |
| JP | 7-258893 | 10/1995 |
| JP | 8-122522 | 5/1996 |
| JP | 8-146402 | 6/1996 |
| JP | 8-152651 | 6/1996 |
| JP | 8-160464 | 6/1996 |
| JP | 8-179376 | 7/1996 |
| JP | 8-327991 | 12/1996 |
| JP | 8-328000 | 12/1996 |
| JP | 8-334787 | 12/1996 |
| JP | 9-127556 | 5/1997 |
| JP | 9-171196 | 6/1997 |
| JP | 9-274990 | 10/1997 |
| JP | 10-39292 | 2/1998 |
| JP | 10-68970 | 3/1998 |
| JP | 10-92576 | 4/1998 |
| JP | 10-104663 | 4/1998 |
| JP | 10-154814 | 6/1998 |
| JP | 10-161156 | 6/1998 |
| JP | 10-170961 | 6/1998 |
| JP | 10-189998 | 7/1998 |
| JP | 10-239698 | 9/1998 |
| JP | 10-247735 | 9/1998 |
| JP | 11-44885 | 2/1999 |
| JP | 11-52415 | 2/1999 |
| JP | 11-64890 | 3/1999 |
| JP | 11-74073 | 3/1999 |
| JP | 2000-155312 | 6/2000 |
| JP | 2000-315798 | 11/2000 |
| WO | WO 90/13148 A1 | 11/1990 |

OTHER PUBLICATIONS

Furue, H. et al, "P-78: Characteristics and Driving Scheme of Polymer-Stabilized Monostable FLCD Exhibiting Fast Response Time and High Contrast Ratio with Gray-Scale Capability," SID Digest 98: SID International Symposium Digest of Technical Papers, vol. 29, 1998, pp. 782-785.

Ono, Y.A. et al, "White-Light Emitting Thin Film Electroluminescent Devices with Stacked SrS:Ce/CaS:Eu Active Layers," Japanese Journal of Applied Physics, vol. 66, No. 11, Dec. 1, 1989, pp. 5564-5571.

Yoshida, T. et al, "33.2: A Full-Color Thresholdless Antiferroelectric LCD Exhibiting Wide Viewing Angle with Fast Response Time," SID 97 Digest, 1997, pp. 841-844.

Furue, H. et al, "P-78: Characteristics and Driving Scheme of Polymer-Stabilized Monostable FLCD Exhibiting Fast Response Time and High Contrast Ratio with Gray-Scale Capability," SID 98 Digest, 1998, pp. 782-785.

Shimokawa, R. et al, "Characterization of High-Efficiency Cast-Si Solar Cell Wafers by MBIC Measurement," Japanese Journal of Applied Physics, vol. 27, No. 5, May 1988, pp. 751-758.

Schenk, H. et al, "Polymers for Light Emitting Diodes," EuroDisplay '99, Proceedings of the 19th International Display Research Conference, Berlin, Germany, Sep. 6-9, 1999, pp. 33-37.

\* cited by examiner

SEM PHOTOGRAPH (CROSS SECTION)

SCHEMATIC DIAGRAM OF ENLARGED ELECTRODE EDGE PORTION

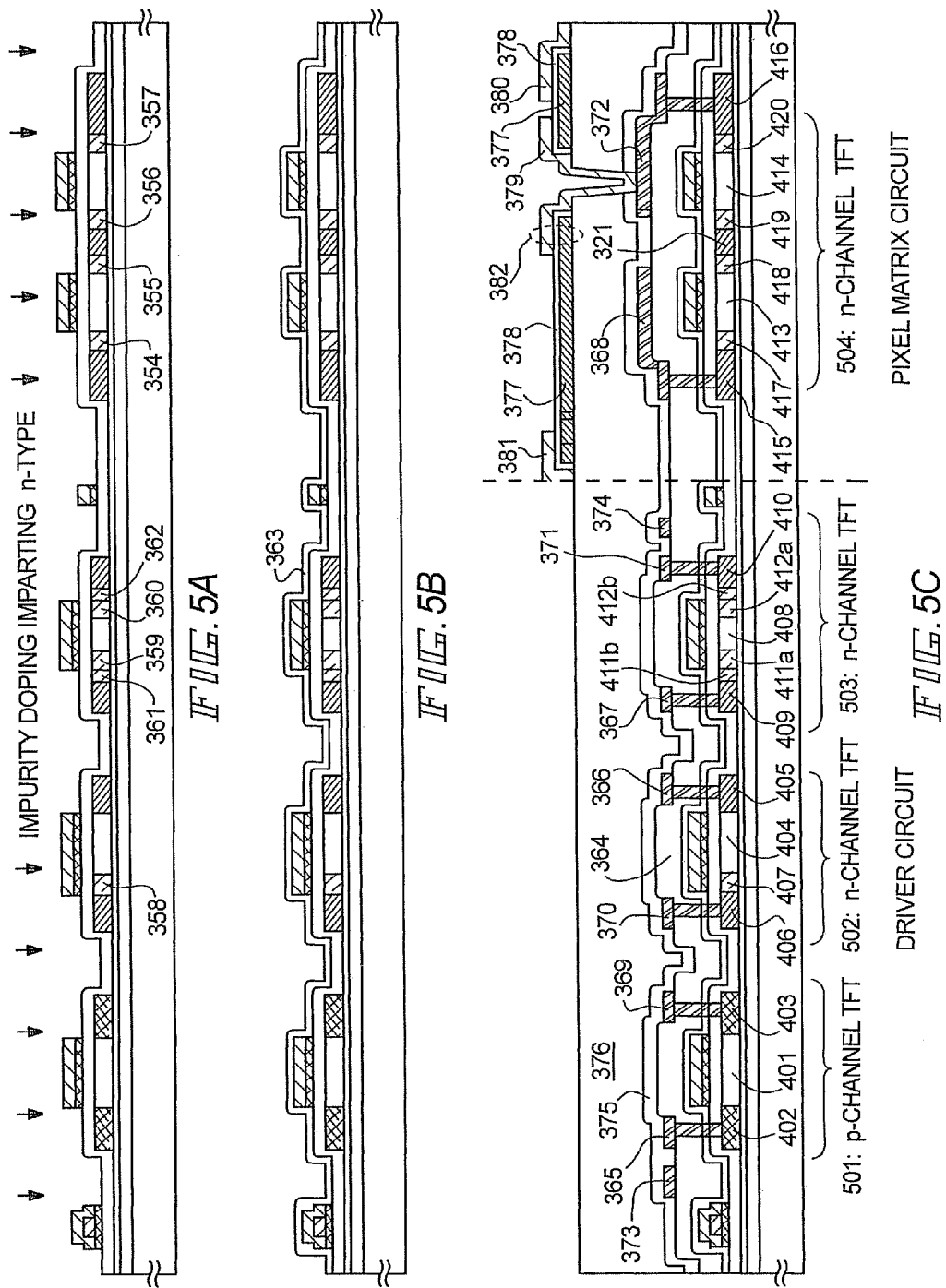

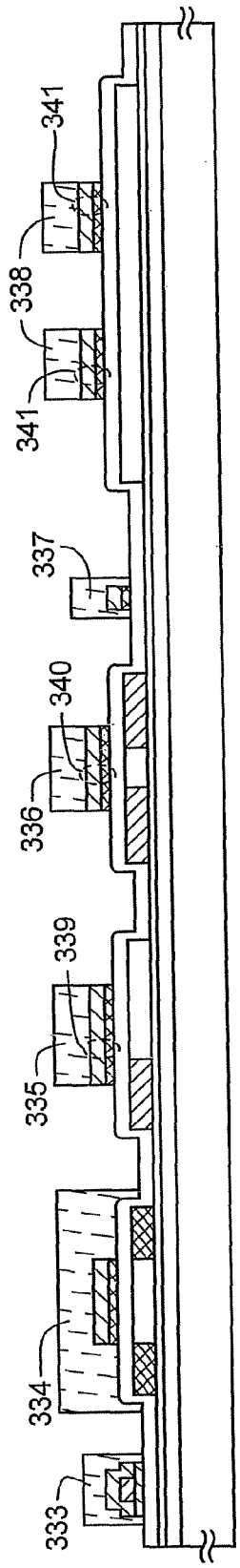
FIG. 18A
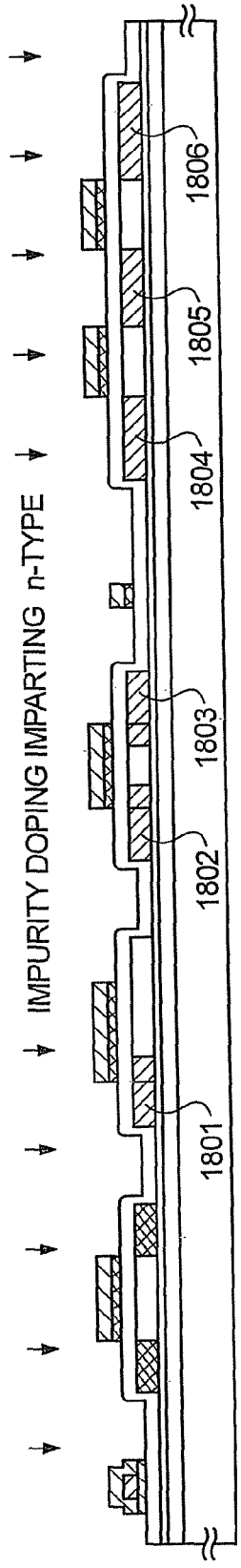
FIG. 18B FORMING n-- REGION
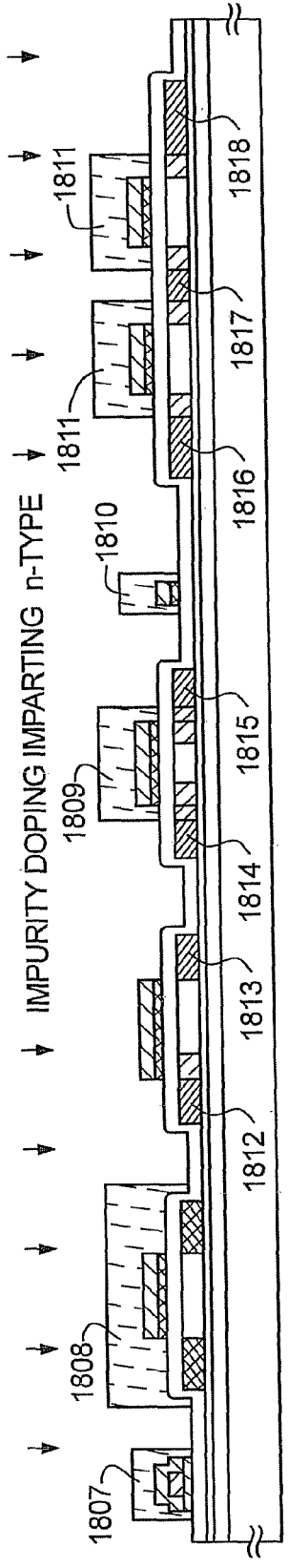
FIG. 18C FORMING n+ REGION

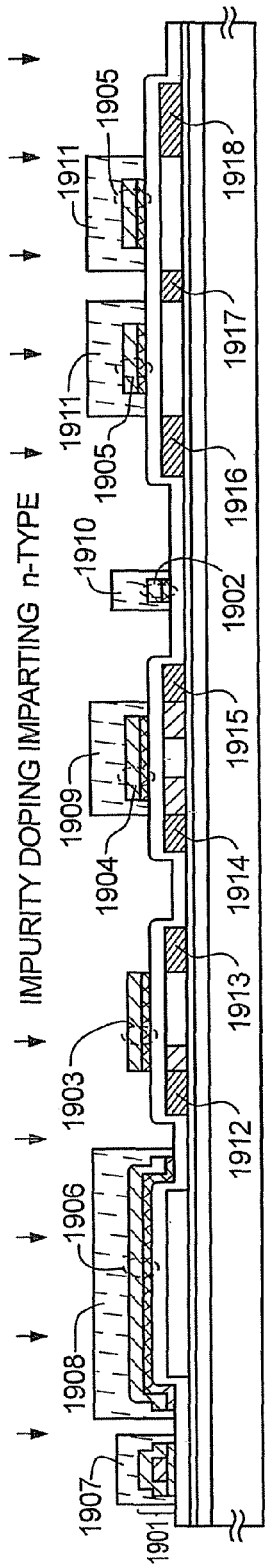
FIG. 19A FORMING n+ REGION
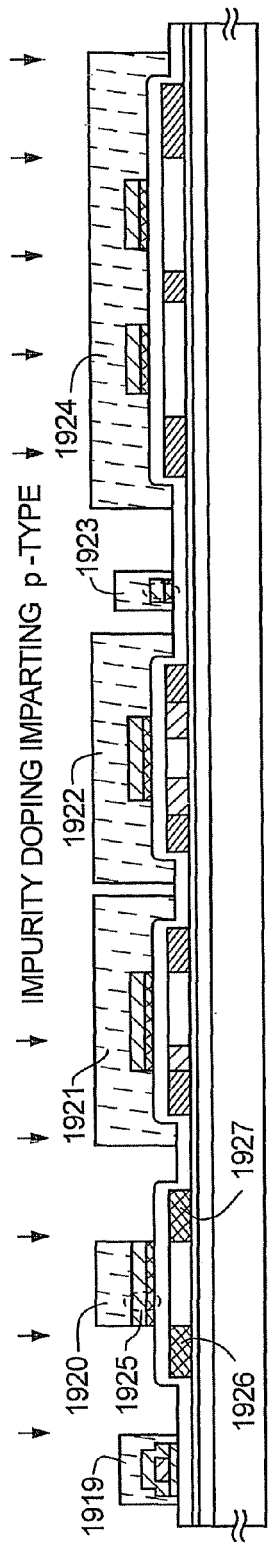
FIG. 19B FORMING p-ch TFT GATE WIRING, FORMING p++ REGION
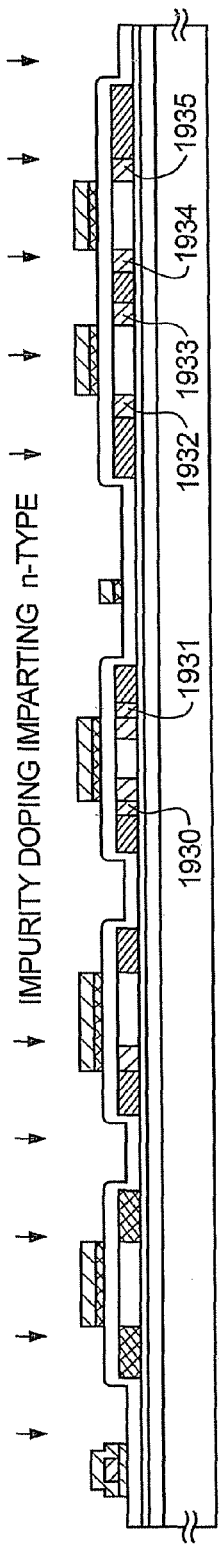
FIG. 19C FORMING n-- REGION

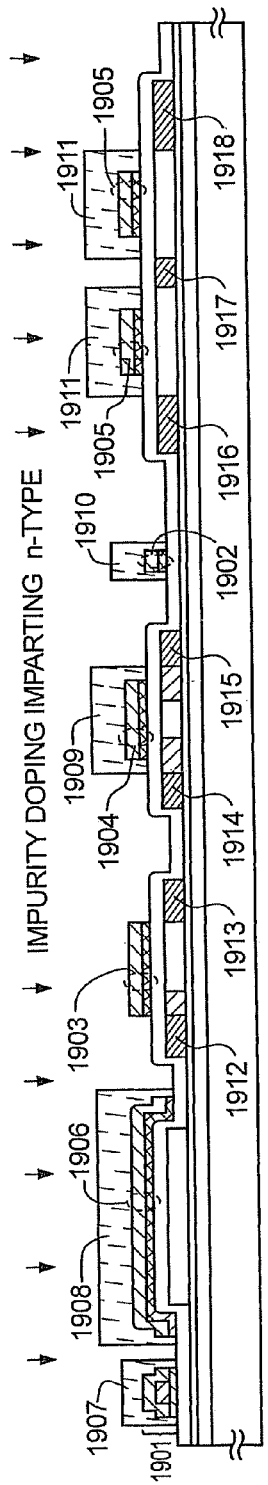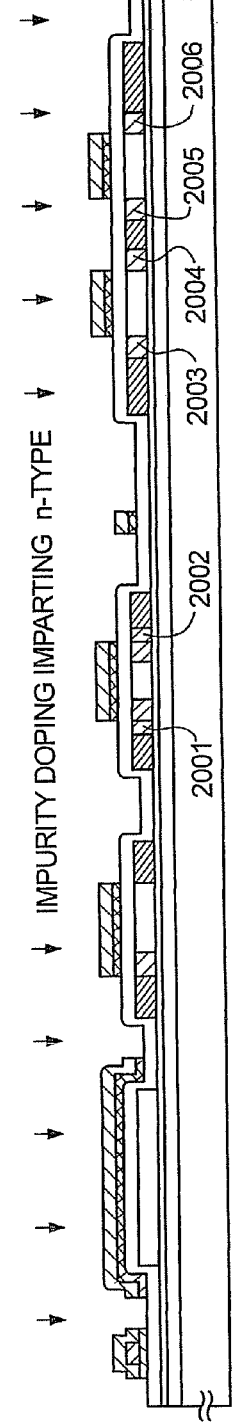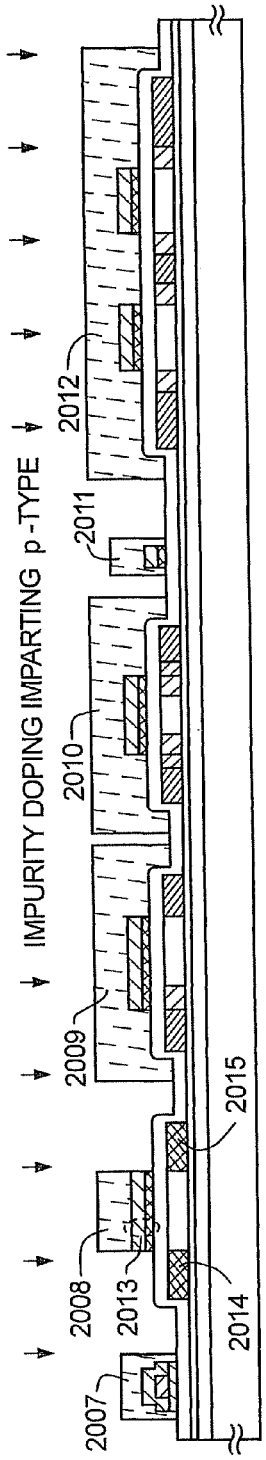

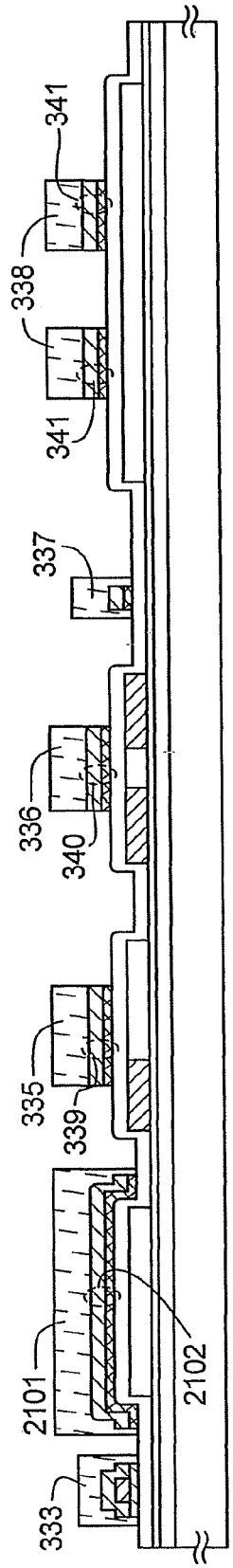
FIG. 21A FORMING n-ch TFT GATE WIRING
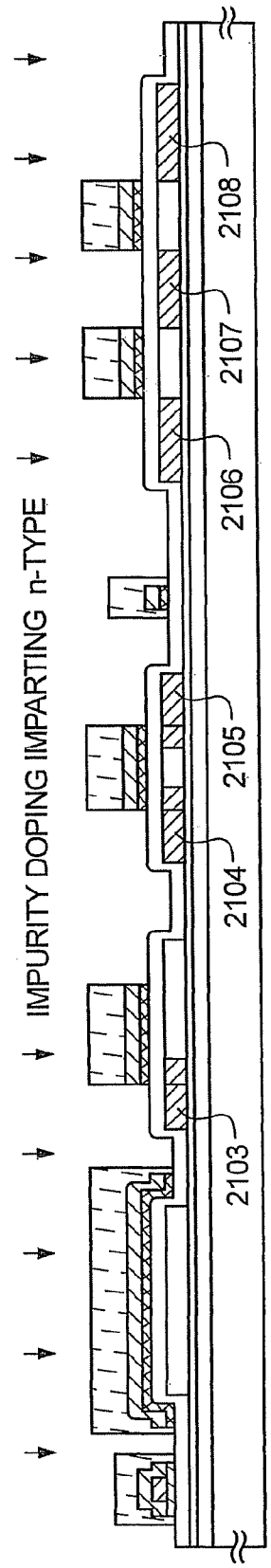
FIG. 21B FORMING n-- REGION

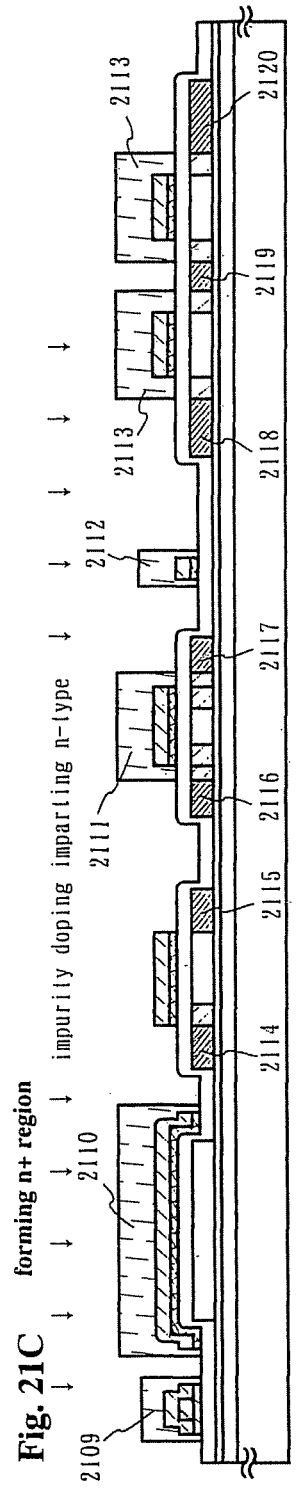
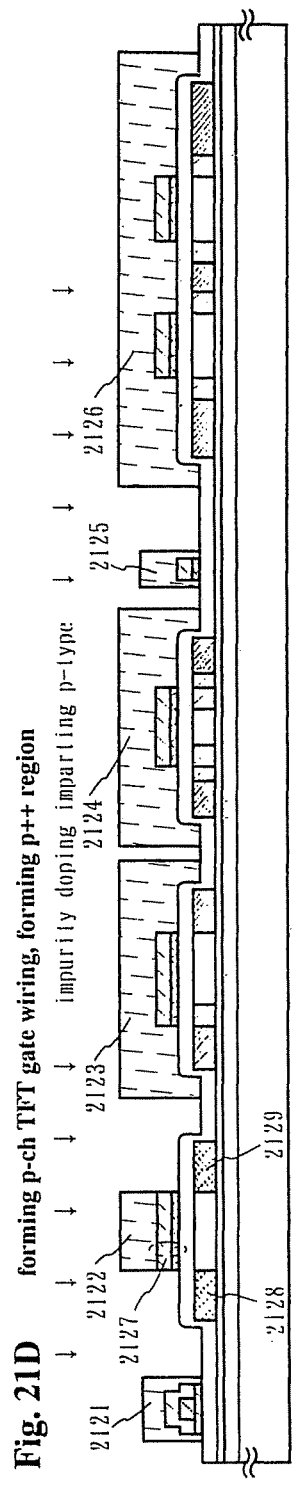
Fig. 21C forming n+ region impurity doping imparting n-type
Fig. 21D forming p-ch TFT gate wiring, forming p++ region impurity doping imparting p-type

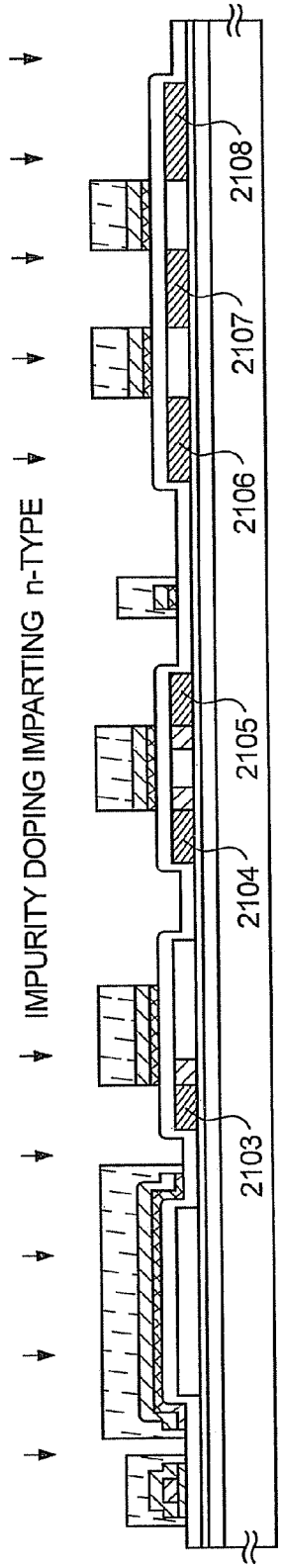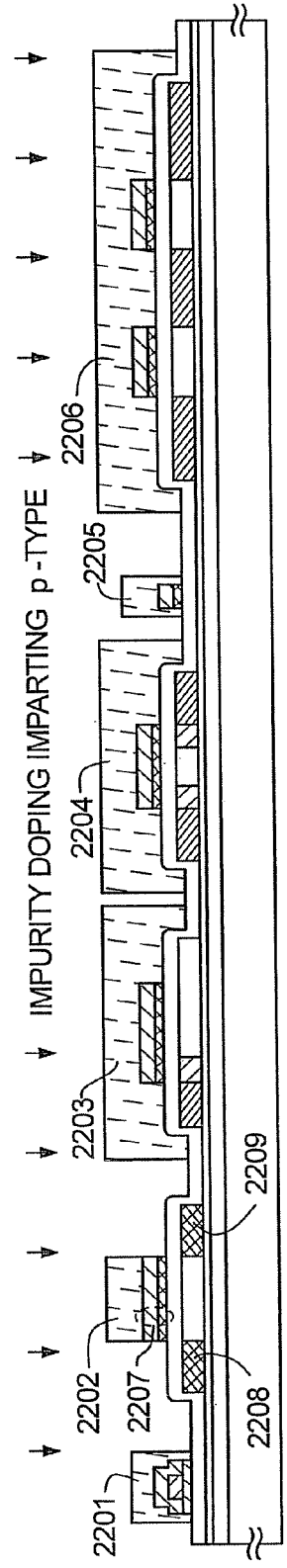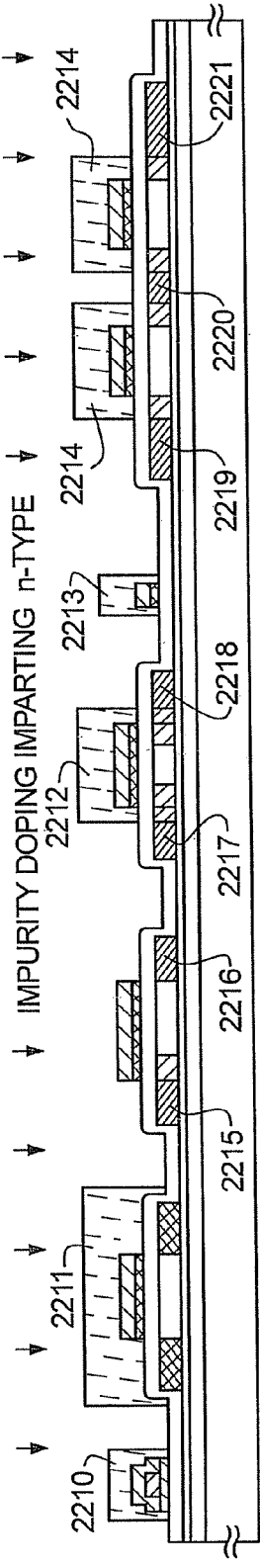

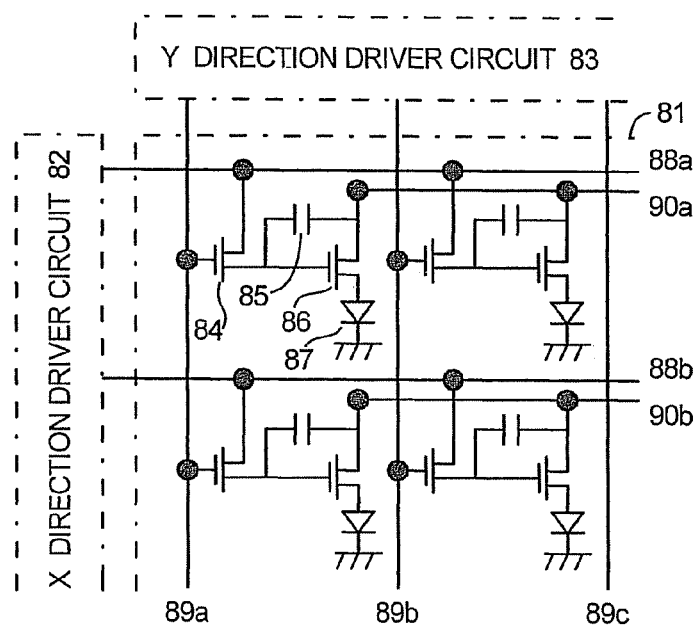
FIG. 24A  EL PANEL CIRCUIT DIAGRAM
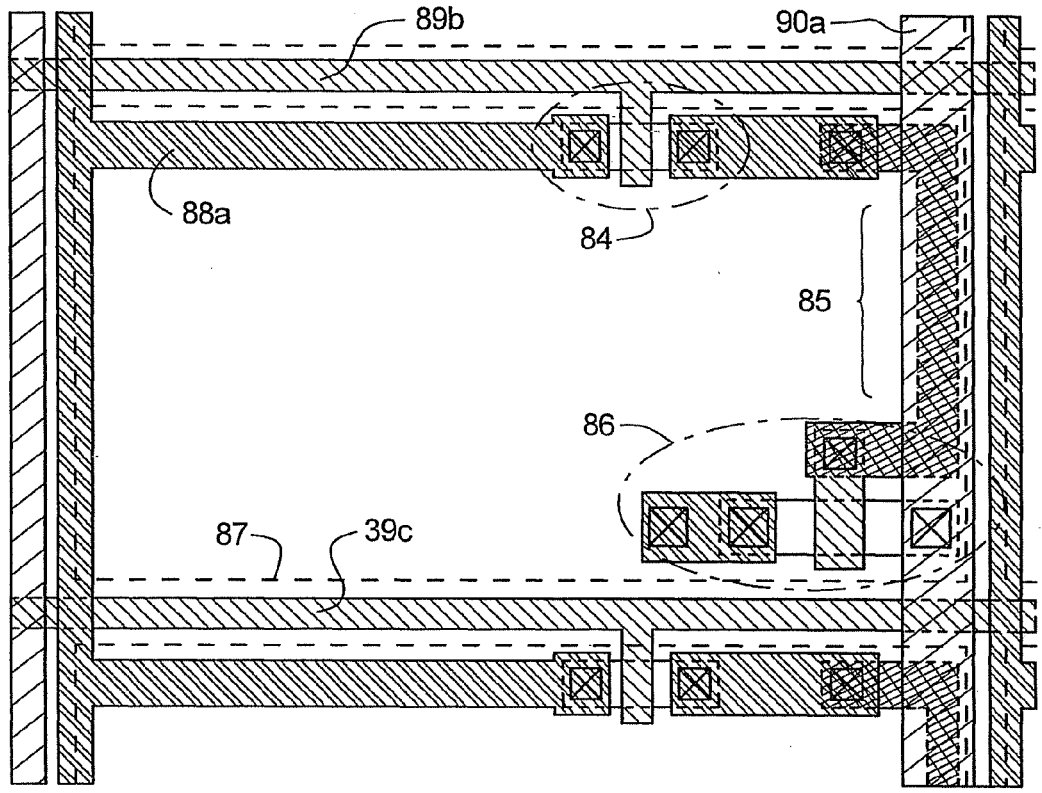
FIG. 24B  TOP VIEW OF EL PANEL PIXEL SECTION DIAGRAM SHOWING THE RELATIONSHIP BETWEEN VOLTAGE AND ELECTRIC CURRENT BETWEEN THE ELECTRODES IN A CONVENTIONAL ANODIC OXIDATION PROCESS

SEM PHOTOGRAPH (CROSS SECTION)

SCHEMATIC DIAGRAM OF ENLARGED ELECTRODE EDGE PORTION

701: n-CHANNEL TFT

701: n-CHANNEL TFT

SEM PHOTOGRAPH (CROSS SECTION)

SCHEMETIC DIAGRAM OF ENLARGED
ELECTRODE EDGE PORTION

PROJECTION DEVICE (THREE PLATE TYPE)

OPTICAL LIGHT
SOURCE SYSTEM

SEMICONDUCTOR DEVICE AND METHOD OF MANUFACTURING THE SAME

This application is a divisional of application Ser. No. 09/516,082 filed on Mar. 1, 2000 now U.S. Pat. No. 7,821,065.

BACKGROUND OF THE INVENTION

1. Field of the Invention

The present invention relates to a semiconductor device having a circuit structured by a thin film transistor (hereafter referred to as TFT), and to a method of manufacturing the same. For example, the present invention relates to an electro-optical device, typically a liquid crystal display panel, and to electronic equipment with an electro-optical device installed as a component.

Note that, throughout this specification, the semiconductor device indicates general devices that can function by using semiconductor characteristics, and that electro-optical devices, semiconductor circuits, and electronic equipment are all categorized as semiconductor devices.

2. Description of the Related Art

Techniques for using semiconductor thin films (with a thickness on the order of several nm to several hundreds of nm) formed on a substrate having an insulating surface to structure a thin film transistor (TFT) have been in the spotlight in recent years. Thin film transistors are widely applied to electronic devices such as ICs and electro-optical devices, and the rapid development thereof as switching elements for image display devices is desired.

For example, the application of TFTs is being attempted in every electric circuit in a liquid crystal display device, such as pixel matrix circuits that control each of the pixels, arranged in a matrix shape, driver circuits that control the pixel matrix circuits, and in addition, logic circuits (such as processor circuits and memory circuits) which process external data signals; in all electric circuits.

Conducting materials such as Al, Ta, and Ti are conventionally used as wiring materials for the above TFT. A method is known of forming an anodic oxide film having high resistance by an anodic oxidation process on the surface of an electrode made from the above conducting materials, protecting the surface of the electrode, and insulating between semiconductor device electrodes.

In a conventional anodic oxidation process, an anode of a d.c. power supply electrode is first connected to an electrode formed on an insulating surface from a material capable of anodic oxidation. A platinum cathodic electrode is connected to an cathode of the d.c. power supply electrode, the electrode and the cathodic electrode are immersed in an anodic oxidation solution, and anodic oxidation is performed by applying a d.c. voltage between the two.

The current flowing between the anode and the cathode, and the voltage between them, generally change as shown below.

As shown in FIG. 26, conventionally the current is first controlled to be a constant value for an optional amount of time (this state is called a constant current state). An anodic oxide film then begins to form on the metallic wiring, the electrode resistance increases as the film gets thicker, and the voltage gradually increases. Note that in a fixed current state, the film thickness of the anodic oxide film is proportional to the voltage level.

Then, after reaching an arbitrary voltage level (ultimate voltage), the voltage is controlled so as to be constant (this state is referred to as a constant voltage state). Then, the amount of current begins to decrease, and the voltage is maintained at that value for several tens of minutes, and the anodic oxidation process is completed afterward. Although not shown in the figure, the voltage at the time of completion is zero.

Thus, in order to form an anodic oxide film conventionally with superior film quality and uniformity, a process in which a constant current state is shifted to a constant voltage state, is used.

However, for cases where conventional anodic oxidation is perforated after forming the wiring from a material capable of anodic oxidation on a material that has poor adhesiveness to the material capable of anodic oxidation, problems such as the wiring peeling off or being destroyed develop. In particular, resin films, which have come into use in recent years as interlayer insulating films with superior levelness accompanying further refining and multiple layering in semiconductor devices, have poor adhesiveness to the anodic oxidation capable material, and the films are often peeled off. One such example of film peeling developing is shown in FIGS. 27A and 27B for the case of anodic oxidation being performed by using a conventional process after forming an electrode 4102 made from aluminum on a polyimide resin, film 4101.

It is thought that one cause of the film peeling shown in FIG. 27A is that anodic oxidation does not occur uniformly, particularly at the edge of the electrode 4102, the solution wraps around into (penetrates) the bottom of the electrode 4102 during the anodic oxidation process, and that an anodic oxide film 4103 is formed under the edge of the electrode 4102. The larger the amount of wrap around (amount of penetration) X becomes, the more conspicuous the film peeling becomes. In this specification, when the distance from the point where the electrode 4102 contacts the resin film to the side face of the anodic oxide film 4103 is taken as Xa, and when the film thickness of the anodic oxide film 4103 formed on the side face of the electrode is taken as Xb, then the distance when Xb is subtracted from Xa is defined as the "amount of wrap around X". The amount of wrap around in FIG. 27A is X=Xa−Xb=on the order of 0.6 to 0.7 μm.

A novel anodic oxidation process, in which film peeling etc. do not develop even when an anodic oxidation is performed on an electrode formed on a material film with poor adhesiveness, is thus demanded.

SUMMARY OF THE INVENTION

The present invention has been made to answer the above-mentioned demand, and an object of the present invention is to provide an electro-optical device possessing high reliability by using an electrode, which has an anodic oxide film on its surface with a uniform film thickness in accordance with the novel anodic oxidation process of the present invention, as a wiring for each circuit of the electro-optical device, typically an AM-LCD.

In particular, an object of the present invention is to provide an electro-optical device having a capacitor with the anodic oxide film of the electrode, formed on a resin, as a dielectric.

According to the structure of the present invention disclosed in this specification, there is provided a semiconductor device having a capacitor comprising: a first electrode on an organic resin film; an oxidized film on at least a portion of the first electrode; and a second electrode covering at least a portion of the oxidized film.

Further, according to another structure of the present invention, there is provided a semiconductor device having a capacitor comprising: an inorganic film on an organic resin film; a first electrode on the inorganic resin film; an oxidized film on at least a portion of the first electrode; and a second electrode covering at least a portion of the oxidized film.

In the above-mentioned structure, it is characterized in that the inorganic film is formed by sputtering.

Further, in each of the above-mentioned structure, it is characterized in that the first electrode comprises a material that is capable of anodic oxidation.

Still further, in each of the above-mentioned structure, the amount of wrap around X of the oxide film around the edge portion of the first electrode is characterized by being 0.5 µm or less.

It is preferable that the amount of wrap around X of the oxide film around the edge portion of the first electrode be 0.1 µm or less.

Further, according to another structure of the present invention, there is provided a semiconductor device including at least a pixel matrix circuit on a substrate, characterized in that a storage capacitor of the pixel matrix circuit comprises a shielding film formed on an organic resin film, an oxide film of the shielding film, and a pixel electrode formed on the oxide film.

Still further, according to another structure of the present invention, there is provided a semiconductor device including at least a pixel matrix circuit and a driver circuit on the same substrate, characterized in that:

at least a portion of, or all of, an LDD region of an n-channel TFT forming the driver circuit is arranged so as to overlap a gate wiring of the n-channel TFT;

an LDD region of a pixel TFT forming the pixel matrix circuit is arranged so as not to overlap a gate wiring of the pixel TFT;

a storage capacitor of the pixel matrix circuit is formed by a shielding film formed on an organic resin film, an oxide film of the shielding film, and a pixel electrode; and an n-type conductivity imparting impurity element is contained in the LDD region of the n-channel TFT forming the driver circuit at a higher concentration than in the LDD region of the pixel TFT.

In addition, in the above-mentioned structures, it is characterized in that the shielding film comprises a material that is capable of anodic oxidation.

Further, preferably the amount of wrap around X around the edge portion of the shielding film is 0.5 µm or less.

Still further, in each of the above-mentioned structure, it is characterized in that the pixel matrix circuit is flattened by a color filter.

Yet further, in each of the above-mentioned structure, it is characterized in that the pixel electrode comprises a transparent conductive film.

Furthermore, in each of the above-mentioned structure, it is characterized in that the pixel electrode is made up of a material having reflective properties.

Further, in order to realize the above structure, according to the present invention, there is provided a method of manufacturing a semiconductor device, comprising:

a step of forming a resin film on a TFT;

a step of forming a first electrode on the resin film;

a step of forming an oxide film of the first electrode; and a step of forming a second electrode by covering at least a portion of the oxide film;

characterized in that a capacitor is formed by the first electrode, the oxide film of the first electrode, and the second electrode.

Still further, according to another structure of the present invention, there is provided a method of manufacturing a semiconductor device, comprising:

a step of forming a resin film on a TFT;

a step of forming an inorganic film on the resin film;

a step of forming a first electrode on the inorganic film;

a step of forming an oxide film of the first electrode; and a step of forming a second electrode by covering at least a portion of the oxide film;

characterized in that a capacitor is formed by the first electrode, the oxide film of the first electrode, and the second electrode.

In addition, in the above structure, it is characterized in that the step of forming the inorganic film on the resin film is a sputtering.

Furthermore, in each of the above-mentioned structures, it is characterized in that in the step of anodically oxidizing the electrode, the applied voltage/supply time is 11 V/min or greater.

Further, according to another structure of the present invention, there is provided a method of manufacturing a semiconductor device having at least a pixel matrix circuit and a driver circuit on the same substrate, comprising:

a step of forming a channel forming region, a source region, a drain region, and an LDD region, sandwiched by the channel forming region and the drain region or the source region, in an active layer of an n-channel TFT forming the driver circuit;

a step of forming a channel forming region, a source region, and a drain region in an active layer of a p-channel TFT forming the driver circuit;

a step of forming a channel forming region, a source region, a drain region, and an LDD region, sandwiched by the channel forming region and the drain region or the source region, in an active layer of a pixel TFT forming the pixel matrix circuit;

a step of forming an interlayer insulating film made from an organic resin film on the n-channel TFT and the p-channel TFT forming the driver circuit, and on the pixel TFT forming the pixel matrix circuit;

a step of forming a shielding film on the interlayer insulating film;

a step of forming an oxide film of the shielding film on the surface of the shielding film;

and a step of forming a pixel electrode so that it contacts the oxide film of the shielding film, and so that it overlaps with the shielding film;

characterized in that:

the LDD region of the n-channel TFT forming the driver circuit is arranged such that it overlaps at least a portion of, or all of, a gate wiring of the n-channel TFT;

the LDD region of the pixel TFT is arranged such that it does not overlap the gate wiring of the pixel TFT; and an n-type conductivity imparting impurity element is doped into the LDD region of the n-channel TFT forming the driver circuit at a higher concentration than in the LDD region of the pixel TFT.

In addition, in the above-mentioned structure, it is characterized in that the step of forming the shielding film of the oxide film is a step of anodic oxidation in which the applied voltage/supply time is 11 V/min or greater.

Still further, according to another structure of the present invention, there is provided a semiconductor device having at least a pixel matrix circuit on a substrate, it is characterized in that the pixel matrix circuit is flattened by a color filter.

BRIEF DESCRIPTION OF THE DRAWINGS

In the accompanying drawings:

FIGS. 5A to 5C are diagrams showing the manufacturing process of the AM-LCD;

FIGS. 18A to 18C are diagrams showing the manufacturing process of the pixel matrix circuit and the driver circuit;

FIGS. 19A to 19C are diagrams showing the manufacturing process of the pixel matrix circuit and the driver circuit;

FIGS. 20A to 20C are diagrams showing the manufacturing process of the pixel matrix circuit and the driver circuit;

FIGS. 21A to 21D are diagrams showing the manufacturing process of the pixel matrix circuit and the driver circuit;

FIGS. 22A to 22C are diagrams showing the manufacturing process of the pixel matrix circuit and the driver circuit;

FIGS. 24A and 24B are diagrams showing the structure of an active matrix type EL display device;

DETAILED DESCRIPTION OF THE PREFERRED EMBODIMENTS

Embodiment Mode

The embodiments of the present invention are explained below. The present invention is characterized by a structure having an anodic oxide film on the surface of a material capable of anodic oxidation which is used as an electrode for each circuit formed on the same substrate of an electro-optic device, typically an AM-LCD.

Note that the present invention is the most effective technique for a structure in which a capacitor is formed by taking a material film that has poor adhesiveness with an anodic oxidation capable material, an organic resin film, for example, as a base, forming a first electrode on top which is made from a material capable of anodic oxidation, forming an anodic oxide film on the surface of the electrode, and in addition, forming a second electrode on the anodic oxide film.

A valve metal film (such as an aluminum film, a tantalum film, a niobium film, a hafnium film, a zirconium film, a chromium film, or a titanium film, for example), or a silicon film having conductivity (such as a phosphorus-doped silicon film or boron-doped silicon film) may be used as the anodic oxidation capable material used by the present invention. In addition, a material in which a silicide film of the above valve metal films, or a nitrated valve metal film (such as a tantalum nitride film, a tungsten nitride film, or a titanium nitride film), is the principal constituent can be used as the anodic oxidation capable material of the invention. Further, it is possible to use a eutectic alloy with another metallic element (such as a tungsten film or a molybdenum film), such as a molybdenum tantalum alloy, for example. In addition, a laminate in which these are freely combined may also be used.

A valve metal indicates a metal which may anodically develop a barrier type anodic oxide film which allows a cathode current to flow but does not allow an anode current to flow. In other words, it refers to a metal showing a valve-like action. (See Electro-chemical Handbook, $4^{th}$ ed., Electro-chemical Society Proceedings, p. 370, Maruzen, 1985.)

In addition, the structure of the first electrode, made up of the above anodic oxidation capable materials, may be an electrode made from a single layer film, or may be an electrode made from a multilayer film. Note that throughout this specification, an "electrode" is a portion of a "wiring", and the electrode indicates a point where the portion of a wiring electrically connects to another wiring, or it indicates a point where the portion of a wiring intersects a semiconductor layer. Therefore, for convenience of explanation, while "wiring" and "electrode" are used distinctively, "wiring" is intended to be always included when the term "electrode" is used.

Figure 1A:
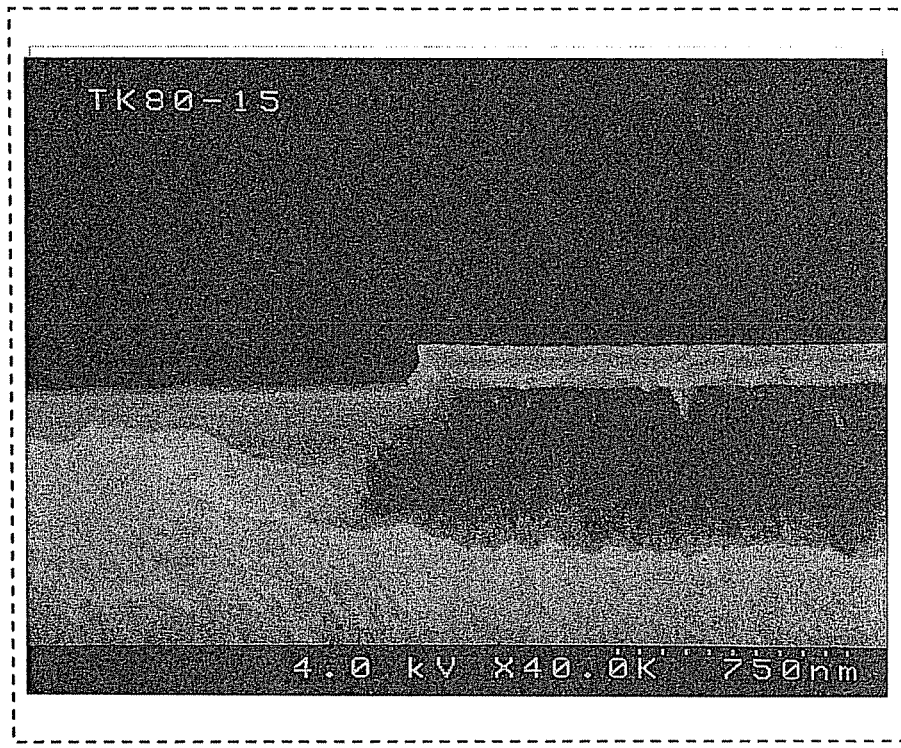
FIGS. 1A and 1B are a SEM photograph view and a schematic diagram, respectively, of the anodic oxidation of the present invention.
Figure 1B:
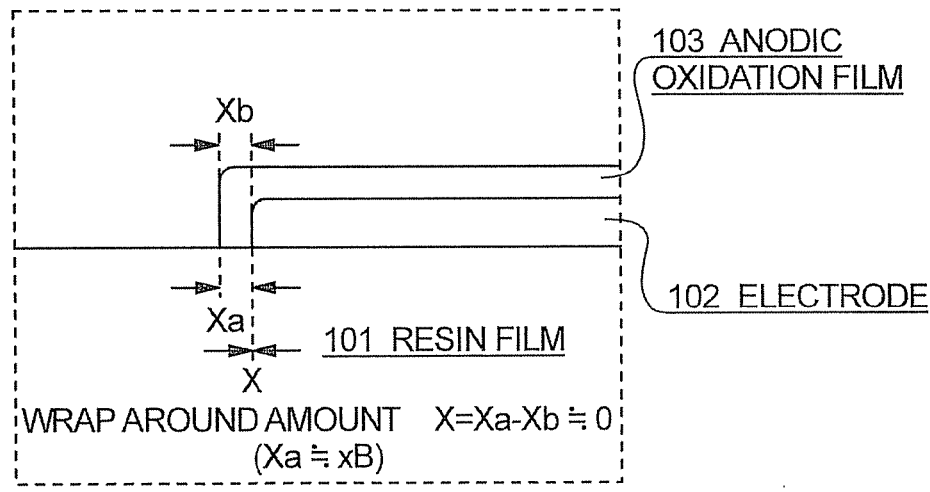

FIG. 1A is a SEM (scanning electron microscopy) photograph showing an electrode formed on an organic resin film (a polyimide film) and prepared with an anodic oxide film 103 on its surface. FIG. 1B is a schematic diagram of the SEM photograph. Compared to FIGS. 27A and 27B, an electrode edge portion with an extremely small amount of wrap around X (X=0 to 0.02 μm) is shown in FIGS. 1A and 1B. Ideally, a state in which the amount of wrap around X=0 is preferable, and in addition, it is also desirable that the anodic oxide film on the upper surface and the side surfaces be formed with a uniform film thickness.

In order to realize the above structure, it is necessary to form the anodic oxide film with high controllability, and the present invention is characterized by such a method of formation.

The inventors of the present invention performed experiments by forming an electrode on a resin film and testing various anodic oxidation conditions. With the conventional method, namely a process which moves from a state of constant current flow to a state of constant voltage, no matter what was tried, non-uniform anodic oxidation occurs at the electrode edge section, and anodic oxide film wrap around develops.

The experimental procedure is stated simply below.

A polyimide resin film with a thickness of 0.8 µm is deposited by coating on a substrate. Plasma processing using $CF_4$ gas is performed next in order to increase the adhesiveness with a metallic film to be deposited later. Next, after depositing a 125 nm thick Al—Ti film by sputtering, patterning is performed, forming an electrode. Heat treatment is performed next for 1 hour at 250° C. in order to bake the resin film. An anodic oxidation device probe is then connected to the electrode, and a barrier type anodic oxide film is formed on the surface of the electrode. Note that the barrier type anodic oxide film is alumina. The anodic oxide film thus formed was observed by SEM.

As for the anodic oxidation conditions, an ethylene glycol solution containing 3% tartaric acid was used as an electrolyte solution, and the solution temperature was set to 30° C. The constant voltage time (the time for which a state of constant voltage is maintained), the rate of increase (the applied voltage value per unit time), and the current supplied per substrate were set, respectively, according to conditions 1 to 4, and the amount of wrap around X was measured. Note that the ultimate voltage was set to 35 V in order to form an anodic oxide film with a film thickness of 50 nm on the electrode. A comparison of the amount of wrap around X for the current values and rates of increase by condition 1, condition 2, and condition 3 was performed, and a comparison of the amount of wrap around X due to the presence of, or lack of, a constant voltage time in condition 2 and condition 4 was performed.

The experimental results are shown here in Table 1.

Compared to the conventional, the current value per unit area of electrode to be anodically oxidized by the anodic oxidation process of the present invention, and the voltage value applied per unit time, are set to be large, and if the process is ended at the stage where the target voltage has been reached, then the amount of wrap around X can be made small. In addition, in order to shorten the amount of time for the anodic oxidation process, the anodic oxide film is formed with a constant voltage state time of from several seconds to several minutes, or with a constant voltage state time of zero.

Figure 2:
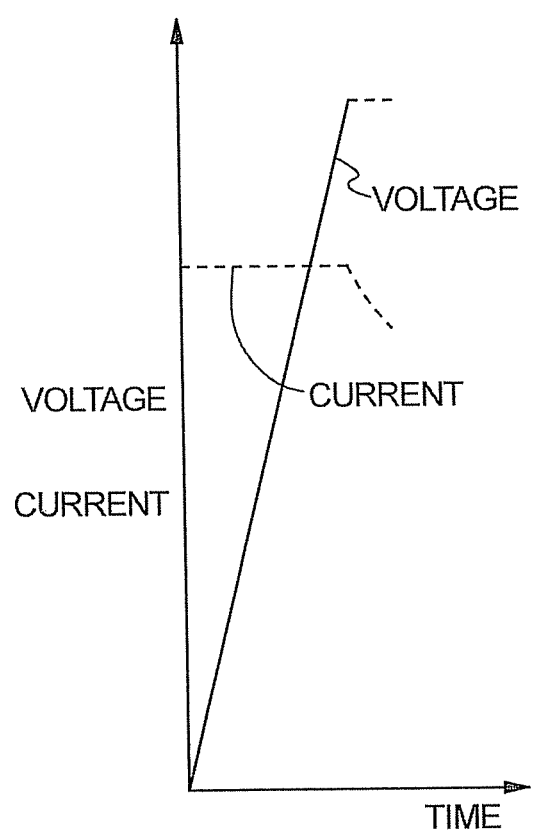
FIG. 2 is a diagram showing the relationship between the applied voltage and the current in the anodic oxidation process of the present invention.

An example of the method of formation of the present invention is explained below using FIG. 2. Note that although the voltage naturally becomes zero at the stage where the anodic oxidation process is completed, this is not shown in FIG. 2.

Specifically, it is preferable that the current density (the amount of current per unit area) of the electrode to be anodically oxidized be between 1 and 20 $mA/cm^2$. Note that this is a large current density compared to the current density of the conventional process (on the order of approximately 0.3 $mA/cm^2$)

Further, the voltage rate of increase (the value of the voltage increase per unit time) is 11 V/min or greater, preferably 100 V/min or greater. This is similarly large compared to the voltage rate of increase of the conventional process (on the order of approximately 10 V/min).

As a result, the amount of wrap around X of the anodic oxide film in the edge portion of the electrode formed on the resin film can be suppressed with good controllability, and the desired anodic oxide film can be formed.

The inventors of the present invention thus discovered a novel anodic oxidation process that completely differs from the conventional anodic oxidation processes.

A cross-sectional diagram of an AM-LCD with an anodic oxide film formed, by using the above stated technique of the present invention, as a dielectric of a storage capacitor for a TFT placed in a pixel matrix circuit is shown in FIG. 5C. Note that a CMOS circuit is shown here as a basic circuit structuring a driver circuit, and that a double gate structure TFT is shown as a pixel matrix circuit. Of course, the structure is not limited to a double gate structure, and structures such as a triple gate structure and a single gate structure may be used.

TABLE 1

Extent of wrap around X due to anodic oxidation conditions

| Condition | Ultimate voltage (V) | Current value (mA/substrate) | Current density (mA/cm²) | Voltage rate of increase | Time of increase (sec) | Constant voltage time (min) | Power supply time (sec) | Amount of wrap around X (m) |
|---|---|---|---|---|---|---|---|---|
| 1 | 35 | 1 | 0.027 | 0.5-0.6 | 3765 | 0 | 3765 | 1-2 |
| 2 | 35 | 20 | 0.541 | 13.8 | 122 | 0 | 122 | 0.45 |
| 3 | 35 | 100 | 2.703 | 87-430 | 7 | 0 | 7 | 0-0.02 |
| 4 | 35 | 20 | 0.541 | 13.8 | 128 | 15 | 128 | 0.62 |

Figure 27A:
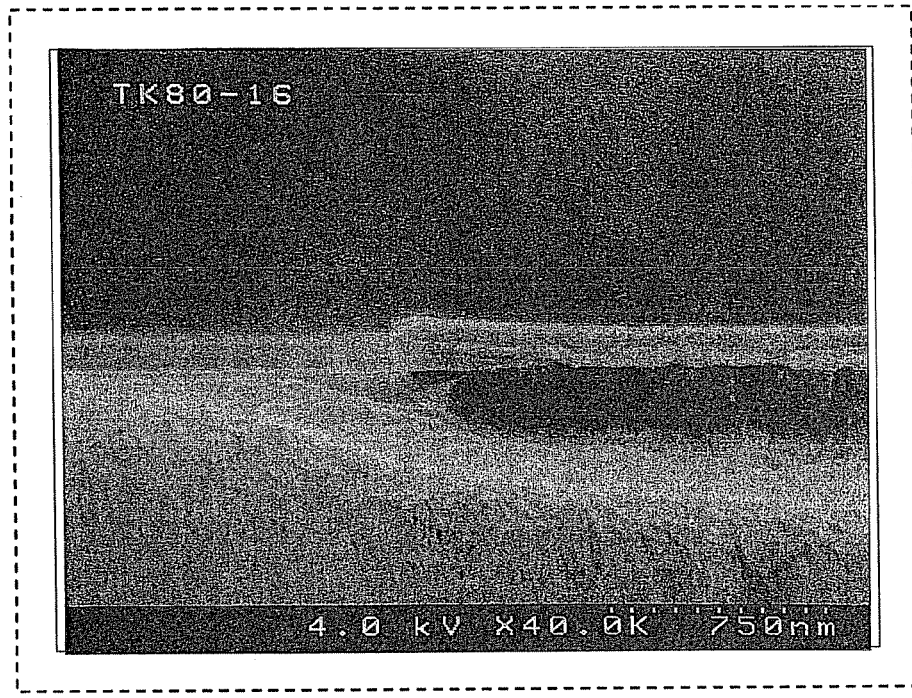
FIGS. 27A and 27B are a SEM photograph view and a schematic diagram, respectively, of the anodic oxidation of the comparison example.
Figure 27B:
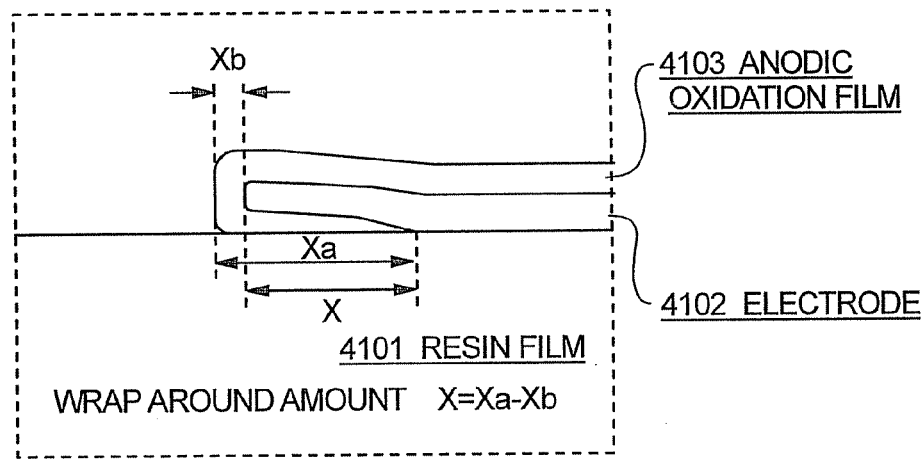

Note that FIG. 1A is a SEM observation photograph of condition 3, and that FIG. 27A is a SEM observation photograph of condition 4.

From the experimental results, the inventors of the present invention discovered that the amount of wrap around X is proportional to the voltage rate of increase and to the power supply time of the anodic oxidation process.

An electrode (a shielding film 377) made from a material capable of anodic oxidation (aluminum) is formed on an organic resin film 376 (polyimide) having leveling characteristics and which covers an n-channel TFT 504 in FIG. 5C. The shielding film 377 is effective in the shielding of light and the shielding of electric fields, and in addition, an anodic oxide film 378 is formed on its surface.

The anodic oxide film 378 has film qualities as a dielectric of the pixel storage capacitor, and a storage capacitor 382 is formed with the electrode (the shielding film 377) as the lower electrode and with a pixel electrode 379 as the upper electrode.

Further, if a transmission type AM-LCD is to be manufactured, then a transparent conductive film, typically ITO film, may be used as the pixel electrode 379. If a reflective type AM-LCD is to be manufactured as the pixel electrode 379, then a metallic film with a high reflectivity, typically aluminum, silver, or an alloy of these (an Al—Ag alloy) may be used.

Furthermore, when using an electrode made from an aluminum film as the shielding film, the light shielding ability of the electrode with a formed anodic oxide film is important. With three different starting film thickness conditions (65 nm, 95 nm, and 125 nm), an anodic oxide film was formed with a thickness of 50 nm under the same anodic oxidation conditions. By doing so, the electrode film thickness that was not anodically oxidized was 30 nm, 60 nm, and 90 nm, respectively.

Figure 12:
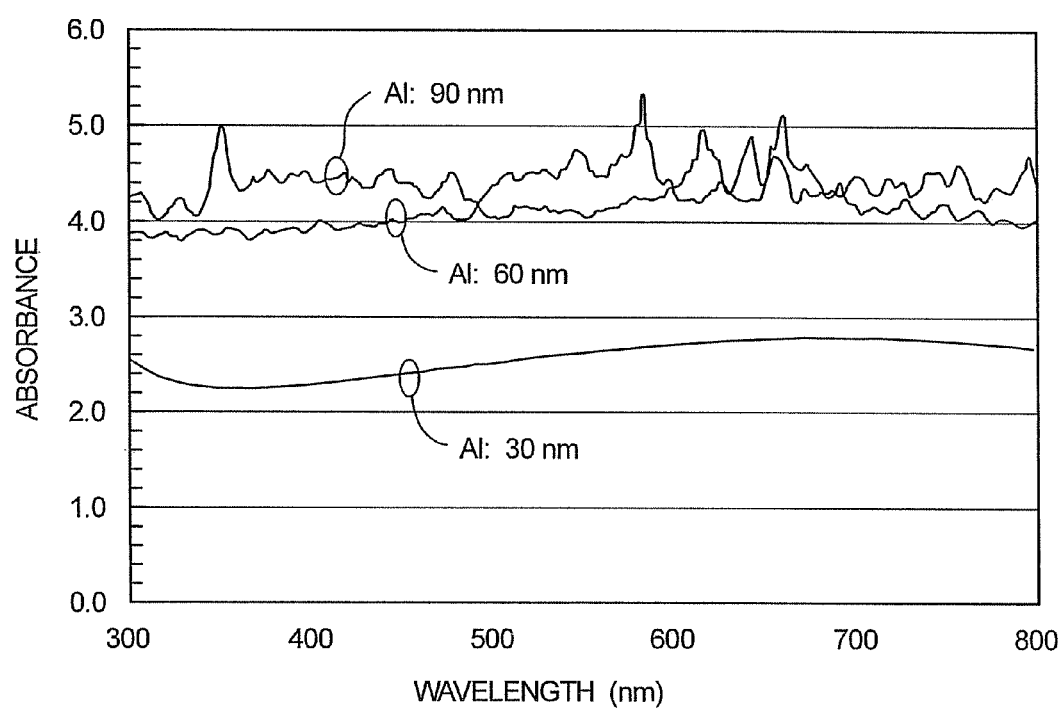
FIG. 12 is a diagram showing the absorbance of an aluminum film.

The results, measured by using a Hitachi U-4000 spectrophotometer, are shown in FIG. 12. Reading from FIG. 12, at 550 nm the light absorbance is 2.6 for the 30 nm film thickness electrode; the light absorbance is 4 for the 60 nm film thickness electrode; and the absorbance is 4.6 for the 90 nm film thickness electrode. The necessary light absorbance for cases in which the electrode is used as a shielding film is 3 or greater (at 550 nm). Therefore, with a 60 nm or greater film thickness, the electrode functions as a shielding film without any problems. Further, considering the leakage of light due to the step, a thin light shielding film is preferable.

Note that in FIG. 5C, the pixel electrode 379 is electrically connected to a drain region 416 of the pixel matrix circuit TFT through a drain electrode 372, but a structure may be used in which the pixel electrode and the drain region are directly connected.

An AM-LCD with the above structure is characterized by high reliability and good productivity. This is because the pixel matrix circuit is formed, furnished with the storage capacitor 382 with an anodic oxide film having a uniform film thickness, and formed in accordance with the anodic oxidation process in which film peeling does not develop, as the dielectric.

A more detailed explanation of the present invention, with the above structure, is made by the embodiments shown below.

Embodiment 1

FIGS. 3A to 5C are used to explain the structure of embodiment 1 of the present invention, a method of manufacturing an active matrix substrate in which a pixel matrix circuit and CMOS circuits, the basic form for driver circuits formed around the pixel matrix circuit, are formed at the same time.

First, a nitrated silicon oxide film 302a with a thickness of 50 to 500 nm, typically 100 nm, is formed as a base film on a substrate 301. The nitrated silicon oxide 302a is manufactured with $SiH_4$, $N_2O$, and $NH_3$ as raw material gasses, and is made so that it contains a nitrogen concentration of at least 25 atomic %, and less than 50 atomic %. Heat treatment in a nitrogen atmosphere at between 450 and 650° C. is performed next, refining the nitrated silicon oxide film 302a.

Further, a nitrated silicon oxide film 302b with a thickness of 100 to 500 nm, typically 200 nm, and an amorphous semiconductor film (not shown) with a thickness of 20 to 80 nm, are formed successively. An amorphous silicon film is used as the amorphous semiconductor film in embodiment 1, but a microcrystalline silicon film or an amorphous silicon germanium film may be used.

The amorphous silicon film is crystallized in accordance with the crystallization means described in Japanese Patent Application Laid-open No. Hei 7-130652 (corresponding to U.S. Pat. No. 5,643,826), and a crystalline silicon film (not shown) is formed. The technique described in the publication is a crystallization means in which a catalytic element is used (a single type of element, or multiple element types, selected from nickel, cobalt, germanium, tin, lead, palladium, iron, and copper, typically nickel) to promote crystallization when the amorphous silicon film is crystallized. Specifically, heat treatment is performed in a state where the catalytic element is maintained in the surface of the amorphous silicon film, changing the amorphous silicon film into a crystalline silicon film.

After thus forming the crystalline silicon film, crystallization of any remaining amorphous components is performed by irradiation of excimer laser light, increasing the overall crystallinity. Note that both a pulse emission type and a continuous emission type excimer laser may be used, and that a large size substrate can also be handled by processing the beam into a linear shape and then irradiating.

The crystalline silicon film is patterned next, forming active layers 303 to 306, and in addition, these are covered by forming a gate insulating film 307. The gate insulating film 307 is a nitrated silicon oxide film manufactured from $SiH_4$ and $N_2O$, and it is formed with a thickness of between 10 and 200 nm here, preferably from 50 to 150 nm. (See FIG. 3A.)

Resist masks 308 to 311 are formed next to cover the entire surface of the active layers 303 and 306, and to cover a portion of the active layers 304 and 305 (including the channel forming region). An impurity element that imparts n-type conductivity (phosphorus in embodiment 1) is then doped by ion doping using phosphine ($PH_3$), forming n⁻ regions 312 to 314 that later become Lov regions or Loff regions. The acceleration voltage is set to 65 keV in this process because phosphorous is doped through the gate insulating film 307 and into the active layers below. It is preferable that the concentration of the phosphorous doped into the active layers be in the range of $2\times10^{16}$ to $5\times10^{19}$ atoms/cm³, and it is set to $1\times10^{18}$ atoms/cm³ here. (See FIG. 3B.)

A first conductive film 315 is formed next from tantalum nitride (TaN) by sputtering. A second conductive film 316 with aluminum as its principal constituent is then formed with a film thickness between 100 and 300 nm. (See FIG. 3C.)

The second conductive film is then etched, forming a wiring 317. The second conductive film is Al in embodiment 1, and therefore its selectivity compared with the TaN base film is very good for a phosphoric acid solution. Further, a third conductive film 318 is formed on the first conductive film 315 and the wiring 317 from tantalum (Ta) with a thickness of 100 to 400 nm (200 nm in embodiment 1). Note that an additional tantalum nitride film may be formed on the tantalum film. (See FIG. 3D.)

Resist masks 319 to 324 are formed next, and a portion of the first conductive film and of the third conductive film are removed by etching, forming a connection wiring 325 with low resistance, a gate wiring 326 of a p-channel TFT, and a gate wiring 327 of a pixel matrix circuit. Note that the conductive films 328 to 330 are left above regions that become an n-channel TFT. Further, the connection wiring 325 is formed in a section in which the wiring resistance is made as small as possible (for example, from an external signal input/output terminal to a driver circuit input/output terminal). However, the wiring width becomes somewhat wide structurally, and this is unsuitable for an area in which a very thin wiring is required.

The above etching of the first conductive film (TaN film) and the second conductive film (Ta film) can be performed by a CF, and $O_2$ gas mixture. The resist masks 319 to 324 are then left as it is, and a process is performed to dope an impurity element that imparts p-type conductivity into a portion of the active layer 303 that forms the p-channel TFT. Boron is doped here as the impurity element by ion doping (of course ion implantation may also be used) using diborane ($B_2H_6$). The doping concentration of boron is set to between $5\times10^{20}$ and $3\times10^{21}$ atoms/cm$^3$ ($2\times10^{21}$ atoms/cm$^3$ in embodiment 1). Thus p$^{++}$ regions 331 and 332, in which boron is doped at a high concentration, are formed. (See FIG. 4A.)

Note that in this process, the gate insulating film 307 may be etched by using the resist masks 319 to 324 as masks, and the boron doping process may be performed after exposing a portion of the active layer 303. In that case, damage imparted to the active layer is little because the acceleration voltage reduced, and the throughput is also increased.

New resist masks 333 to 338 are formed next, after removing the resist masks 319 to 324. This is in order to form gate wiring for the n-channel TFT, and gate wirings 339 to 341 are formed for the n-channel TFT by dry etching. The gate wirings 339 and 340 are formed so as to overlap a portion of the n$^-$ regions 312 to 314 at this point. (See FIG. 4B.)

New resist masks 342 to 347 are formed next, after removing the resist masks 333 to 338. The resist masks 344 and 346 are formed with a shape covering the gate wirings 340 and 341 of the n-channel TFT, and a portion of the n$^-$ regions.

An impurity element that imparts n-type conductivity (phosphorous is used in embodiment 1) is then doped to a concentration of $1\times10^{20}$ to $1\times10^{21}$ atoms/cm$^3$ ($5\times10^{20}$ atoms/cm$^3$ in embodiment 1), forming n$^+$ regions 347 to 353 in the active layers 304 to 306. (See FIG. 4C.)

Note that in this process, the gate insulating film 307 may be removed by etching using the resist masks 342 to 347, and a phosphorous doping process may be performed after exposing a portion of the active layers 304 to 306. In that case, damage imparted to the active layer is little because the acceleration voltage reduced, and the throughput is also increased.

The resist masks 342 to 346 are removed next, and a process of doping an n-type conductivity imparting impurity element (phosphorous in embodiment 1) into the active layer 306, which becomes the n-channel TFT of the pixel matrix circuit, is performed. Thus n$^{--}$ regions 354 to 357, with a doped phosphorous concentration which is ½ to ¹⁄₁₀ that of the n$^-$ regions (specifically, $1\times10^{16}$ to $5\times10^{18}$ atoms/cm$^3$), are formed.

Further, with the exception of the impurity regions 358 to 360, hidden by the gate wirings, all of the impurity regions are doped with phosphorous at an n$^{--}$ concentration by this process. In practice, this concentration is an extremely low, and can be ignored. However, strictly speaking, the regions denoted by 359 and 360 are n$^-$ regions, while the regions denoted by 361 and 362 become (n$^-$ and n$^{--}$) regions, containing phosphorous at a slightly higher concentration. (See FIG. 5A.)

A protection insulating film 363 with a thickness of 100 to 400 nm is formed from a nitrated silicon oxide film by plasma CVD using SiH$_4$, N$_2$O, and NH$_3$ as raw materials. It is preferable to form the nitrated silicon oxide film so that the concentration of hydrogen contained throughout the nitrated silicon oxide film is between 1 and 30 atomic %. Further, a silicon oxide film, a silicon nitride film, or a laminate film of a combination of these films can be used as the protection insulating film 344.

A heat treatment process is performed next in order to activate the impurity elements that impart n-type or p-type conductivity and which have been doped at their respective concentrations. Furnace annealing, laser annealing, or rapid thermal annealing (RTA) can be performed for, this process. The activation process is performed by furnace annealing here. Heat treatment is performed in a nitrogen atmosphere at between 300 and 650° C., preferably from 400 to 550° C., at 450° C. for 2 hours here.

Further, a hydrogenation process is performed on the active layers by performing heat treatment in an atmosphere containing 3 to 100% hydrogen for 1 to 12 hours at between 300 and 450° C. This process is a process to terminate dangling bonds in the semiconductor layers by thermally activated hydrogen. Plasma hydrogenation (using hydrogen activated by a plasma) may be performed as another hydrogenation means. (See FIG. 5B.)

After completing the activation process, an interlayer insulating film 364 with a 0.5 to 1.5 μm thickness is formed on the protection insulating film 363. The laminate film of the protection insulating film 363 and the interlayer insulating film 364 is taken as a first interlayer insulating film.

Contact holes are then formed in order to reach the source regions or the drain regions of the respective TFTs, and source wirings 365 to 368, and drain wirings 369 to 372 are formed. Note that, although not shown in the figures, the drain wirings 369 and 370 are connected as the same drain wiring in order to form a CMOS circuit. Further, connection wirings 373 and 374 are also formed at the same time for connecting between input terminals and between circuits. Note that, although not shown in the figures, in embodiment 1 the electrodes are made with a three-layer structure laminate film of a 100 nm Ti film, a 300 nm aluminum film containing Ti, and a 150 nm Ti film formed successively by sputtering.

A silicon nitride film, a silicon oxide film, or a nitrated silicon oxide film is formed to a thickness of between 50 and 500 nm (typically 200 to 300 nm) next as a passivation film 375. The passivation film 375 may be a nitrated silicon oxide film formed from SiH$_4$, N$_2$O, and NH$_3$ by plasma CVD, or it may be a silicon nitride film manufactured from SiH$_4$, N$_2$, and NH$_3$ by plasma CVD.

A hydrogenation process is performed first, preceding formation of the film, by introducing N$_2$O, N$_2$, NH$_3$, etc. and performing plasma hydrogenation. The hydrogen that is activated by the plasma processing is supplied throughout the first interlayer insulating film, and if the substrate is heated to between 200 and 400° C., then the hydrogen is diffused even on the underlayer side, and the active layers can be hydrogenated. There are no particular limitations on the manufacturing conditions of the passivation film, but it is preferable that the film be refined.

Further, after forming the passivation film, an additional hydrogenation process may be performed. For example, it is good to perform heat treatment for 1 to 12 hours at between 300 and 450° C. in an atmosphere including from 3 to 100% hydrogen. Or, a similar result can be obtained by using plasma hydrogenation. Note that openings may be formed here in the passivation film 375 at positions where contact holes will be formed later in order to connect the pixel electrode and the drain wirings.

A second interlayer insulating film 376 made from an organic resin is formed next with an approximately 1 μm thickness. Polyimide, acrylic, polyamide, polyimide amide, BCB (benzocyclobutene), etc., can be used as the organic resin. The following points can be given as the benefits of using an organic resin film: easy film deposition; the parasitic capacitance can be reduced because the specific dielectric constant is low; and superior levelness. Note that in addition to the above, other organic resin films, organic SiO compounds, etc. can be used. A thermal polymerization type polyimide is used here, and after application to the substrate, it is baked at 300° C. to form the film.

A shielding film 377 is formed next on the second interlayer insulating film 376 in the region that becomes the pixel matrix circuit. The shielding film 377 is a film of an element chosen from among aluminum (Al), titanium (Ti), and tantalum (Ta), or a film with one of these as its principal constituent, formed to a thickness of between 100 and 300 nm. Note that if an insulating film such as a silicon oxide film is formed to a thickness of 5 to 50 nm on the second interlayer insulating film 376, then the adhesiveness of the shielding film formed on top can be increased. Further, if plasma processing using $CF_4$ gas is performed on the surface of the second interlayer insulating film 376, which is formed by an organic resin, then the adhesiveness to the shielding film formed on this film can be increased by surface refinement.

Further, it is possible to form other connecting wirings, not only the shielding film. For example, a connecting wiring for connecting between circuits can be formed inside the driver circuit. However, in this case, before depositing the material that forms the shielding film or the connecting wiring, it is necessary to form contact holes, in advance, in the second interlayer insulating film.

Next, the anodic oxide film 378 with a thickness from 10 to 100 nm (preferably between 15 and 75 nm) is formed on the surface of the shielding film 377 by anodic oxidation. An aluminum oxide film (alumina film) is formed here as the anodic oxide film 378 because an aluminum film, or a film with aluminum as its principal constituent, is used as the shielding film 377 in embodiment 1.

When performing anodic oxidation processing, a tartaric acid ethylene glycol solution with a sufficiently low alkaline ion concentration is first manufactured. This is a solution in which a 15% tartaric acid ammonium aqueous solution and an ethylene glycol solution are mixed in a 2:8 ratio. Aqueous ammonia is added thereto so that the pH is regulated to be 7±0.5. A platinum electrode is placed in the solution as a cathode, the substrate on which the shielding film 377 is formed is immersed in the solution, and a constant dc current (from several mA to several hundred mA) is applied with the shielding film 377 as an anode. It is preferable to perform anodic oxidation while controlling the current density to be in the range of 1.0 $mA/cm^2$ to 20.0 $mA/cm^2$.

A 100 mA current is passed through one substrate in embodiment 1, and the voltage value per unit time is set to between 87 and 430 V/min. The voltage between the cathode and the anode in the solution changes along with time in accordance with the oxide film growth. The voltage is regulated so that the current is constant, and the process is stopped when the voltage becomes 35 V. The anodic oxidation process time is 7 seconds in embodiment 1.

Thus the anodic oxide film 378 can be formed with a thickness of between 20 and 30 nm in the side faces of the edge portion of the shielding film 377, as shown in FIG. 1A. Note that the numerical values shown here for the anodic oxidation process are only examples, and that they may naturally be changed to the most suitable values depending upon the size of the element being manufactured, etc.

Further, the structure used here has the insulating film being formed only on the surface of the shielding film, but the insulating film may also be performed by a gas phase method, such as plasma CVD, thermal CVD, or sputtering. In that case, it is preferable to make the film thickness from 30 to 150 nm (more preferably between 50 and 75 nm). Furthermore, a silicon oxide film, a silicon nitride film, a nitrated silicon oxide film, a DLC (diamond like carbon) film, or an organic resin film may also be used. Further, a combined laminate film of these may be used.

Contact holes are formed next in the second interlayer insulating film 376 and in the passivation film 375 in order to reach the drain wiring 372, and the pixel electrode 379 is formed. Note that pixel electrodes 380 and 381 are each separate pixel electrodes for adjoining pixels. A transparent conductive film may be used for the pixel electrodes 379 to 381 for the case of a transmission type liquid crystal display device, while a metallic film having reflective characteristics (for example, aluminum, silver, an Al—Ag alloy) may be used for a reflective type liquid crystal display device. An indium tin oxide (ITO) film with a thickness of 100 nm is formed here by sputtering because a transmission type liquid crystal display device is used here.

Further, a storage capacitor is formed at this point in the region 382 where the pixel electrode 379 and the shielding film 377 overlap through the anodic oxide film 378.

Thus, the active matrix substrate, containing the CMOS circuit, which becomes a driver circuit, and the pixel matrix circuit on the same substrate, is completed. Note that a p-channel TFT 501, and n-channel TFTs 502 and 503 are formed in the driver circuit, and that a pixel TFT 504 is formed from an n-channel TFT in the pixel matrix circuit. (See FIG. 5C.)

A channel forming region 401 and a source region 402 and a drain region 403 each formed by a $p^+$ region in the p-channel TFT 501 of the CMOS circuit are formed.

Further, a channel forming region 404, a source region 405, and a drain region 406 are formed in the n-channel TFT 502, and an Lov region 407 is formed in one side of the channel forming region 404. The source region 405 is formed by $(n^{--}+n^+)$ region and the drain region 406 is formed by an $(n^-+n^++n^{--})$ region at this point, and the Lov region 407 is formed by an $n^-$ region. Further, the Lov region 407 is formed to wholly overlap the gate wiring.

Additionally, a channel forming region 408, a source region 409, and a drain region 410 are formed in the n-channel TFT 503. Lov regions 411a and 412a, and Loff regions 411b and 412b are formed in both sides of the channel forming region 408. The source region 409 and the drain region 410 are each formed by a $(n^-+n^++n^{--})$ region, the Lov regions 411a and 412a are each formed by an $n^-$ region, and the Loff regions 411b and 412b are each formed by an $(n^{--}+n^-)$ region. Note that the Lov regions and the Loff regions are realized because a portion of the LDD region is placed so as to overlap with the gate wiring in this structure.

Further, channel forming regions 413 and 414, a source region 415, a drain region 416, Loff regions 417 to 420, and an $n^+$ region 421 contacting the Loff regions 418 and 419 are formed in the pixel TFT 504. The source region 415, and the drain region 416 are each formed by $(n^++n^{--})$ regions at this point, and the Loff regions 417 to 420 are formed by $n^{--}$ regions.

The structure of the TFTs forming each of the circuits of the pixel matrix circuit and the driver circuits can be optimized to correspond to the required circuit specifications, and the operation performance of the semiconductor device and its reliability can be increased in embodiment 1. Specifically, the LDD region placement in an n-channel TFT is made to differ depending upon the circuit specifications, and by using an Lov region or an Loff region properly, TFT structures with fast operating speeds and which place great importance on measures to counter hot carriers, and TFT structures that place great importance on low off current operation, can be realized on the same substrate.

For the case of an active matrix type liquid crystal display device, for example, the n-channel TFT 502 is suitable for logic circuits that place great importance on high speed, such as a shift register circuit, a frequency divider circuit, a signal divider circuit, a level shifter circuit, and a buffer circuit. In other words, by placing the Lov region in only one side (the drain region side) of the channel forming region, this becomes a structure that reduces the resistive constituents as much while placing great importance on hot carrier countermeasures. This is because, for the case of the above circuit group, the source region and the drain region functions do not change, and the carrier (electron) movement direction is constant. However, if necessary, Lov regions can be placed in both sides of the channel forming region.

Further, the n-channel TFT 503 is suitable for a sampling circuit (a sample hold circuit) which places emphasis on both hot carrier countermeasures and low off current operation. In other words, hot carrier countermeasures can be realized by placement of the Lov region, and in addition, low off current operation is realized by placement of the Loff region. Furthermore, the functions of the source region and the drain region of a sampling circuit reverse, and the carrier movement direction changes by 180°; therefore a structure that has linear symmetry with the center of the gate wiring must be used. Note that it is possible to only form the Lov region, depending upon the circumstances.

Further, the n-channel TFT 504 is suitable for a pixel matrix circuit or a sampling circuit (sample hold circuit) which place great importance on low off current operation. Namely, the Lov region, which is a cause of an increase in the off current value, is not employed, only the Loff region is used, allowing low off current operation to be realized. Furthermore, by utilizing an LDD region with a concentration lower than that of the driver circuit LDD region as the Loff region, although the on current value will fall a little, it is a thorough measure for lowering the off current value. Additionally, it has been confirmed that an $n^+$ region 321 is extremely effective in lowering the off current value.

Further, the length (width) of the Lov region 407 of the n-channel TFT 502 may be between 0.5 and 3.0 μm, typically from 1.0 to 1.5 μm, for a channel length of 3 to 7 μm. Further, the length (width) of the Lov regions 411a and 412a of the n-channel TFT 503 may be from 0.5 to 3.0 μm, typically between 1.0 and 1.5 μm, and the length (width) of the Loff regions 411b and 412b may be from 1.0 to 3.5 μm, typically between 1.5 and 2.0 μm. Moreover, the length (width) of the Loff regions 417 to 420 formed in the pixel TFT 504 may be from 0.5 to 3.5 μm, typically between 2.0 and 2.5 μm.

Further, another characteristic is that the p-channel TFT 501 is formed in a self aligning manner, while the n-channel TFTs 502 to 504 are formed in a non-self aligning manner.

Embodiment 2

Figure 6:
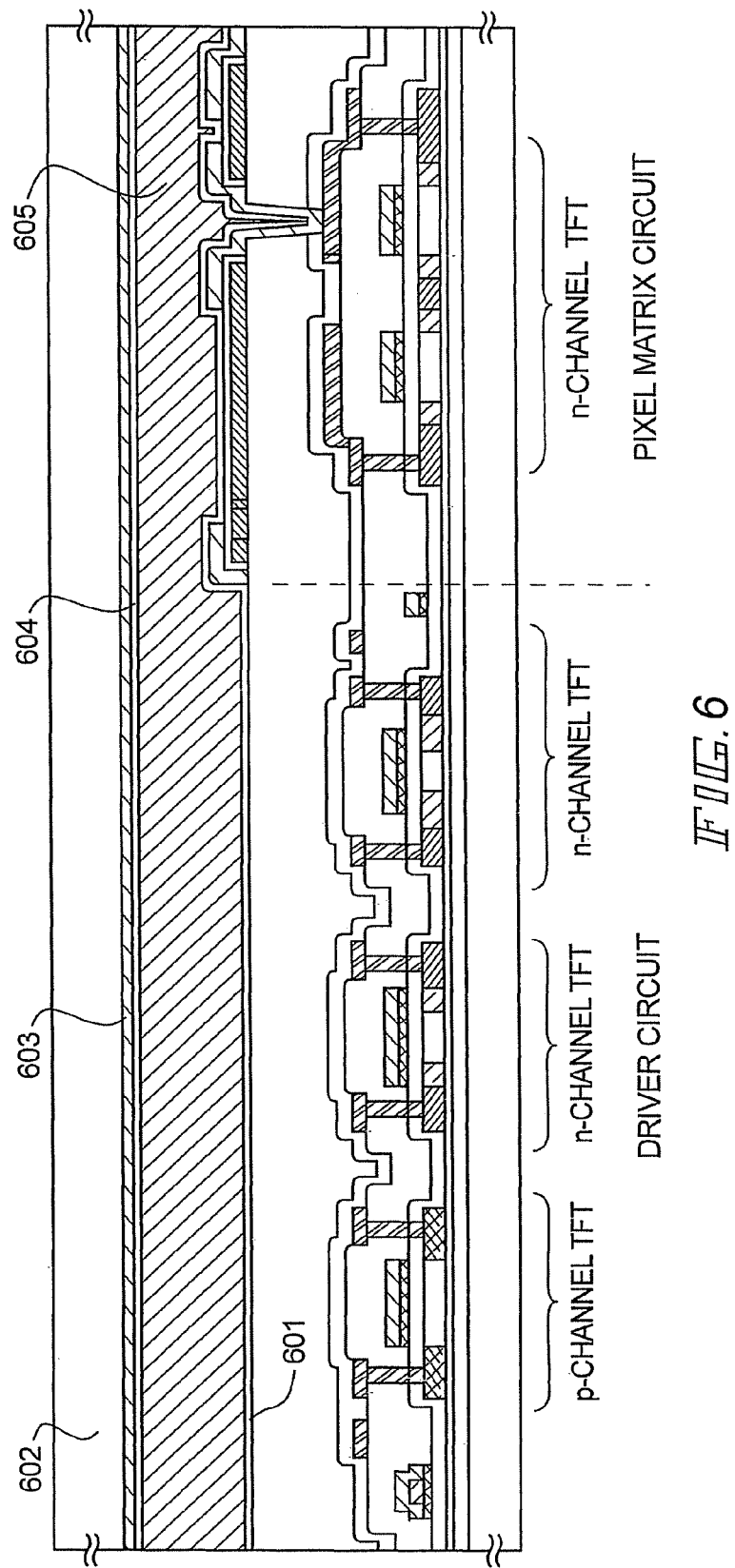
FIG. 6 is a cross sectional structure diagram of an active matrix type liquid crystal display device.

A process of manufacturing an active matrix type liquid crystal display device from an active matrix substrate is explained in embodiment 2. As shown in FIG. 6, an alignment film 601 is formed for the substrate in the state of FIG. 5C. In general, a polyimide resin film is often used for the alignment film of a liquid crystal display device. A opposing electrode 603, from a transparent conductive film, and an alignment film 604 are formed on an opposing substrate 602. After forming the alignment films, a rubbing process is performed to give the liquid crystal molecules a certain fixed pre-tilt angle, so that they are aligned. The active matrix substrate, on which a pixel matrix circuit and CMOS circuits are formed, and the opposing substrate are stuck together through a sealing material or spacers (not shown in the figures) in accordance with a known cell assembly process. A liquid crystal material 605 is next injected between both substrates, and the cell is completely sealed by a sealant (not shown in the figures). A known liquid crystal material may be used as the liquid crystal material. Thus the active matrix type liquid crystal display device shown in FIG. 6 is completed.

Embodiment 3

Figure 7:
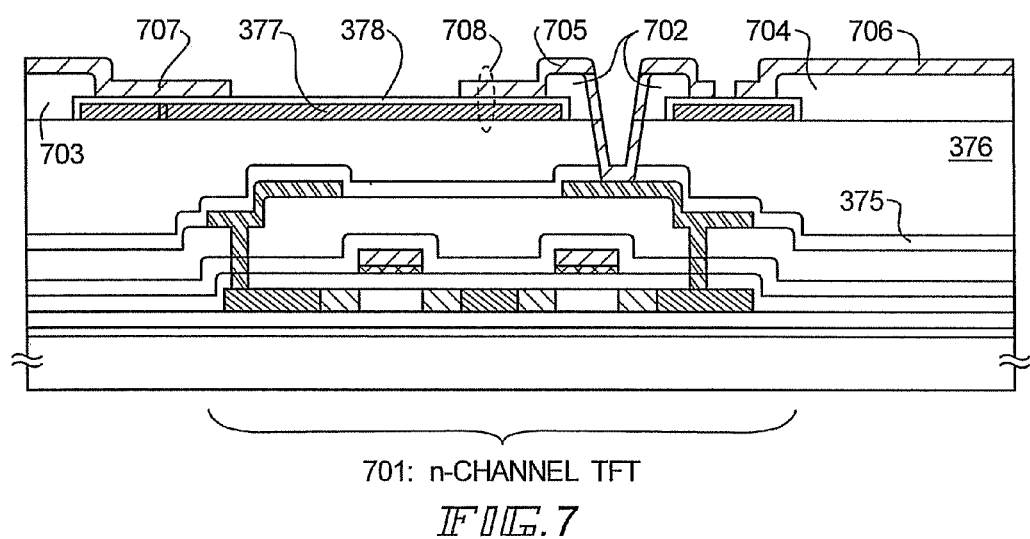
FIG. 7 is a cross sectional diagram showing the structure of a storage capacitor.

Another structure for a storage capacitor connected to an n-channel TFT of a pixel matrix circuit on an active matrix substrate is explained in embodiment 3 using FIG. 7. Note that the same manufacturing process as in embodiment 1 is followed, through the formation of the anodic oxide film 378, for the cross sectional structure of FIG. 7, and that structures up to that point have already been explained in FIGS. 3A to 5C. In embodiment 3, therefore, only the points that differ from embodiment 1 will be focused upon and explained.

After forming the shielding film 377, and the anodic oxide film 378 obtained by anodic oxidation of the shielding film 377, in accordance with the processes of embodiment 1, spacers 702 to 704 are formed from an organic resin film. A film chosen from among polyimide, polyamide, polyimide amide, acrylic, and BOB (benzocyclobutene) can be used as the organic resin film. The spacer 702, the second interlayer insulating film 376, and the passivation film 375 are next etched, contact holes are formed, and a pixel electrode 705 is formed from the same material as that of embodiment 1. Note that pixel electrodes 706 and 707 are pixel electrodes for separate, neighboring pixels.

Thus a storage capacitor 708 is formed in a region in which the shielding film 377 and the pixel electrode 705 overlap through the anodic oxide film 378. By forming spacers 702 to 704 in this way, shorts (short circuits) can be prevented from developing between the shielding film 377 and the pixel electrodes 705 to 707.

Note that it is possible to combine the structure of embodiment 3 with that of embodiment 2.

Embodiment 4

Figure 8A:
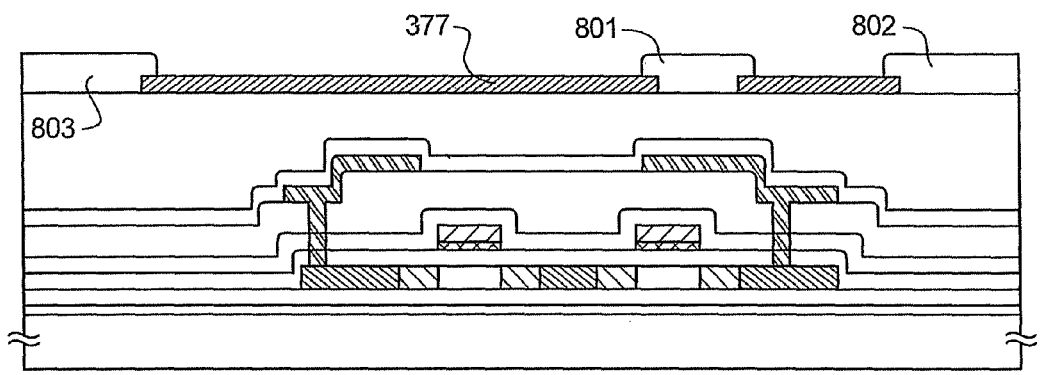
FIGS. 8A to 8C are diagrams showing the manufacturing process of a pixel matrix circuit.
Figure 8B:
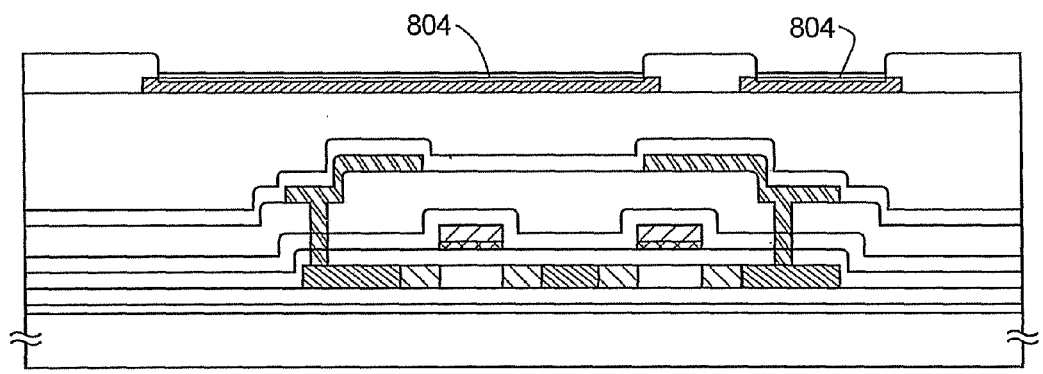
Figure 8C:
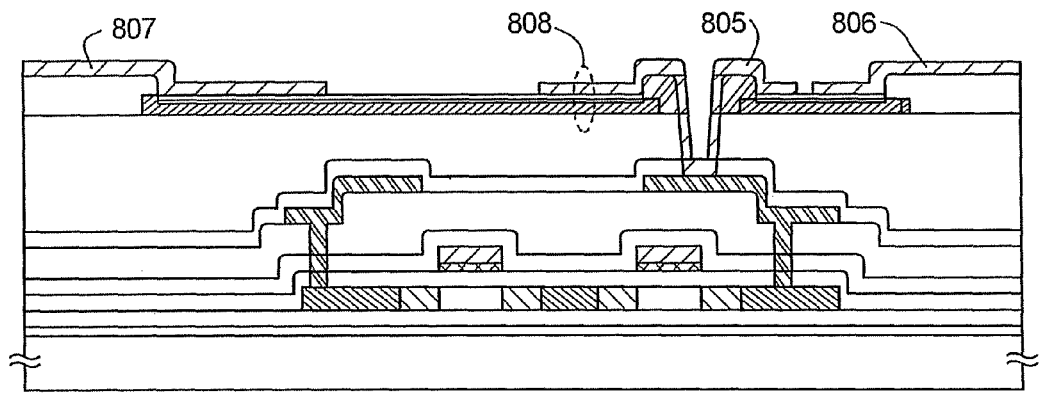

Another structure for a storage capacitor connected to an n-channel TFT of a pixel matrix circuit on an active matrix substrate is explained in embodiment 4 using FIGS. 8A to 8C. Note that the same manufacturing process as in embodiment 1 is followed, through the formation of the shielding film 377, for the cross sectional structure of FIG. 8A, and that structures up to that point have already been explained in FIGS. 3A to 5C. In embodiment 4, therefore, only the points that differ from embodiment 1 will be focused upon and explained.

After forming the shielding film 377 in accordance with the processes of embodiment 1, spacers 801 to 803 are formed from an organic resin film so as to cover the edge portion of the shielding film 377. A film chosen from among polyimide, polyamide, polyimide amide, acrylic, and BCB (benzocyclobutene) can be used as the organic resin film. (See FIG. 8A.)

An oxide film 804 is formed next on the exposed surface of the shielding film 377 by anodic oxidation or by plasma oxidation. Note that the oxide film 804 is not formed in areas that contact the spacers 801 to 803. (See FIG. 8B.)

The spacer 801, the second interlayer insulating film 376, and the passivation film 375 are next etched, contact holes are formed, and a pixel electrode 805 is formed from the same material as that of embodiment 1. Note that pixel electrodes 806 and 807 are pixel electrodes for separate, neighboring pixels.

Thus a storage capacitor 808 is fouled in a region in which the shielding film 377 and the pixel electrode 805 overlap through the oxide film 804. By forming spacers 801 to 803 in this way, shorts (short circuits) can be prevented from developing between the shielding film 377 and the pixel electrodes 805 to 807.

Note that it is possible to combine the structure of embodiment 4 with that of embodiment 2.

Embodiment 5

Figure 9A:
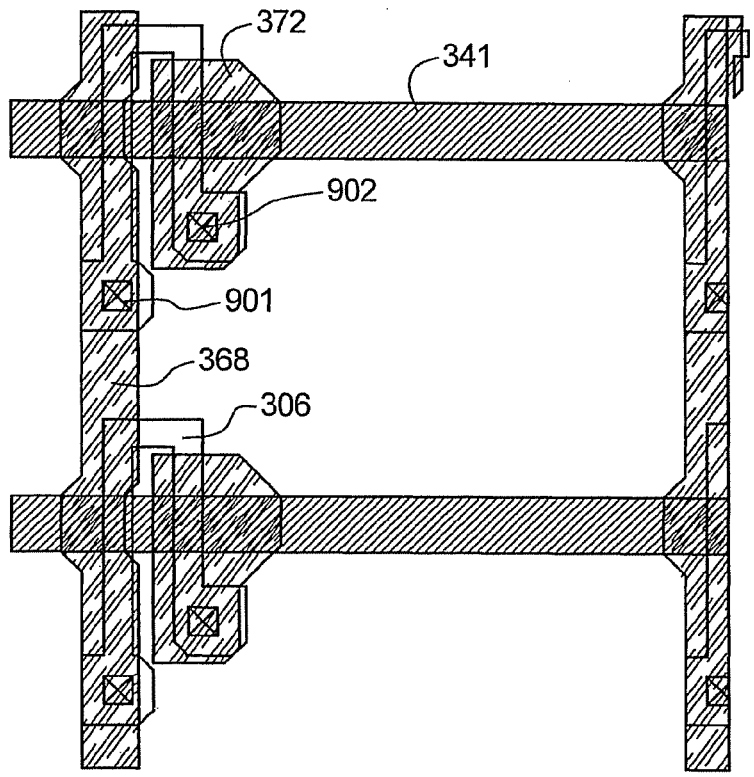
FIGS. 9A and 9B are diagrams showing top views of the pixel matrix circuit.
Figure 9B:
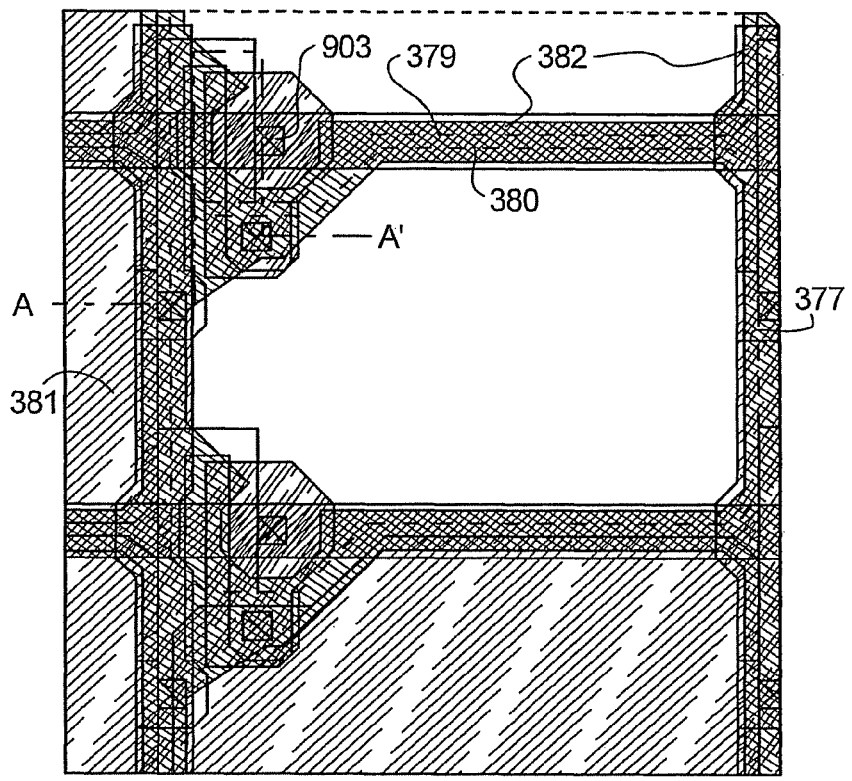

The top views of FIGS. 9A and 9B are used to explain the structure of an active matrix type liquid crystal display device. Note that in order to make FIGS. 9A and 9B correspond to the cross sectional structures of FIGS. 3A to 5C, and therefore common reference symbols are used. Furthermore, the cross sectional structure taken along the line A-A' shown in FIG. 9B corresponds to the cross sectional diagram of the pixel matrix circuit shown in FIG. 5C.

FIGS. 9A and 9B are top views showing a portion (a pixel) of a pixel matrix circuit. FIG. 9A is an top view showing the overlap of an active layer, a gate wiring, and a source wiring, while FIG. 9B is a top view showing the overlap state of a shielding film and a pixel electrode on FIG. 9A. The gate wiring 341 in FIG. 9A intersects with the island-like semiconductor film 306 below, through a gate insulating film not shown in the figures. Further, although not shown in the figures, a source region, a drain region, and an Loff region made up of an n⁻⁻ region is formed in the island-like semiconductor film 306. Further, reference numeral 901 denotes a contact area between the source wiring 368 and the island semiconductor layer 306, and reference numeral 902 denotes a contact area between the drain wiring 372 and the island semiconductor layer 306.

Further, the shielding film 377, on whose surface an anodic oxide film (not shown in the figures here, but denoted by the anodic oxide film 378 in FIG. 5C), and the pixel electrodes 379 to 381 formed for each pixel, are formed on a pixel TFT in FIG. 9B. The storage capacitor 382 is then formed in the region in which the shielding film 377 and the pixel electrode 379 overlap through the anodic oxide film. Note that reference numeral 903 denotes a contact area between the drain wiring 372 and the pixel electrode 379.

An alumina film with a high specific dielectric constant of between 7 and 9 is used in embodiment 5 as the storage capacitor dielectric, and therefore it is possible to reduce the area necessary to form the required capacity. Further, by using the shielding film formed on the pixel electrode as one electrode of the storage capacitor as in embodiment 5, the aperture ratio of the image display section of the active matrix type liquid crystal display device can be increased.

Note that the active matrix type liquid crystal display device of embodiment 5 is explained while compared with the structure explained in embodiment 4, but the active matrix type liquid crystal display device can be manufactured by freely combining the structure of any of embodiments 1 to 4.

Embodiment 6

Regarding a storage capacitor formed for each pixel of a pixel matrix circuit, by placing a fixed electric potential on an electrode (in embodiment 6, a shielding film) which is not connected to a pixel electrode, the storage capacitor can be formed. In this case, it is preferable to set the shielding film to a floating state (an electrically isolated state) or to a common electric potential (the median electric potential of an image signal sent as data).

Figure 10A:
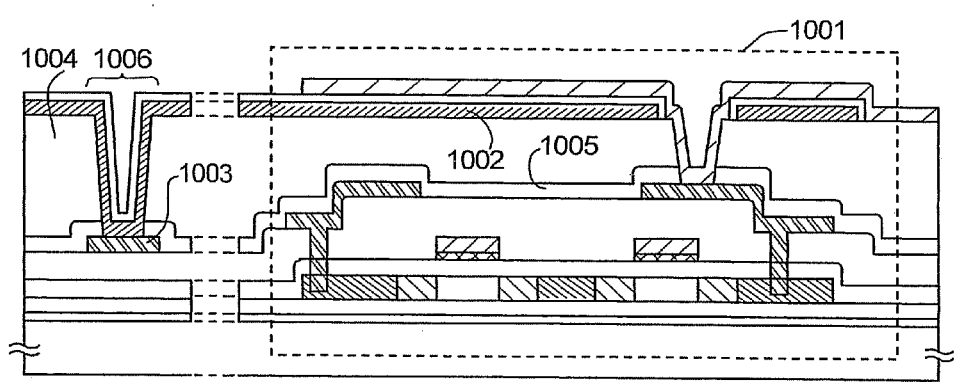
FIGS. 10A and 10B are cross sectional diagrams showing the structure of a storage capacitor.
Figure 10B:
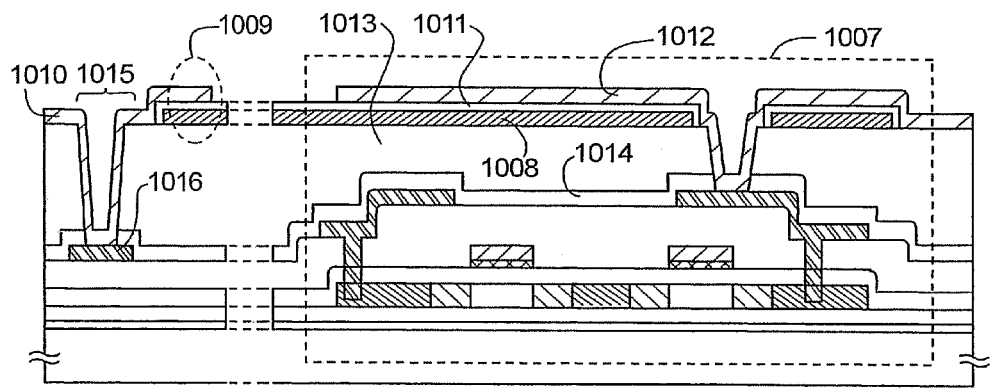

A connection method for the case where the shielding film is fixed to a common electric potential is explained in embodiment 6 using FIGS. 10A and 10B. In FIG. 10A, reference numeral 1001 denotes a pixel TFT manufactured similarly to that of embodiment 1, and reference numeral 1002 denotes a shielding film that functions as one electrode of a storage capacitor. The shielding film 1002 is extended to the outside of the pixel matrix circuit, and is connected to a power supply line 1003 for imparting the common electric potential through a contact hole 1006 formed in a second interlayer insulating film 1004 and a passivation film 1005.

Thus by electrically connecting to the power supply line for imparting the common electrical potential on the outside of the pixel matrix circuit, the common electric potential may be obtained. Therefore, it requires a step of etching the second interlayer insulating film 1004 and the passivation film 1005 before forming the shielding film 1002 in this case.

Next, in FIG. 10B reference numeral 1007 denotes a pixel TFT manufactured similarly to that of embodiment 1, and reference numeral 1008 denotes a shielding film that functions as one electrode of a storage capacitor. The shielding film 1008 is extended to the outside of the pixel matrix circuit, and overlaps with a conductive film 1010 through an oxide film 1011 in a region shown by reference numeral 1009. The conductive film 1010 is a conductive film formed at the same time as a pixel electrode 1012.

The conductive film 1010 is connected to a power supply line 1016 that imparts the common electric potential, through a contact hole 1015 formed in a second interlayer insulating film 1013 and a passivation film 1014. At this point, a capacitor is formed in the region 1009 by the shielding film 1008, the oxide film 1011, and the conductive film 1010: The capacitor is essentially short circuited by performing ac operation. In other words, the shielding film 1008 and the conductive film 1010 are electrically connected by static coupling in the region 1009, and therefore the shielding film 1008 and the power supply line 1016 are essentially connected.

Thus it is possible to set the shielding film to the common electric potential, without increasing the number of process steps, by employing the structure of FIG. 10B.

Note that it is possible to freely combine the structure of embodiment 6 with the structure of any of embodiments 1 to 5.

Embodiment 7

Figure 11A:
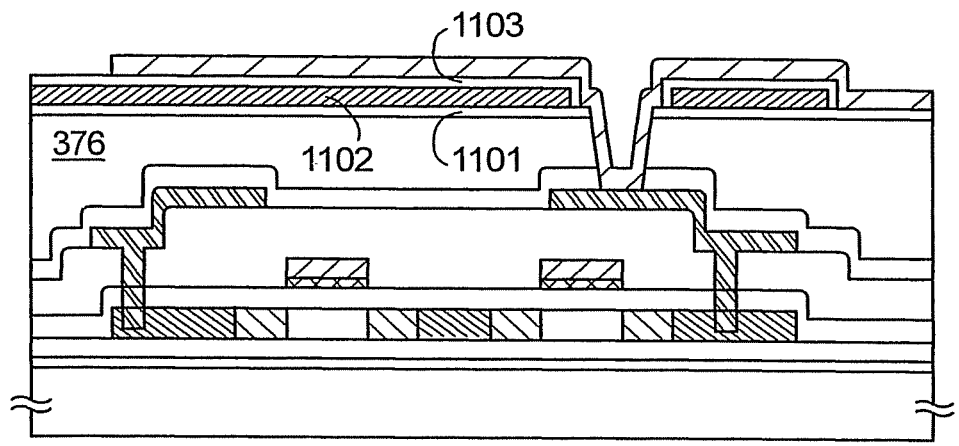
FIGS. 11A and 11B are cross sectional diagrams showing the structure of the storage capacitor.
Figure 11B:
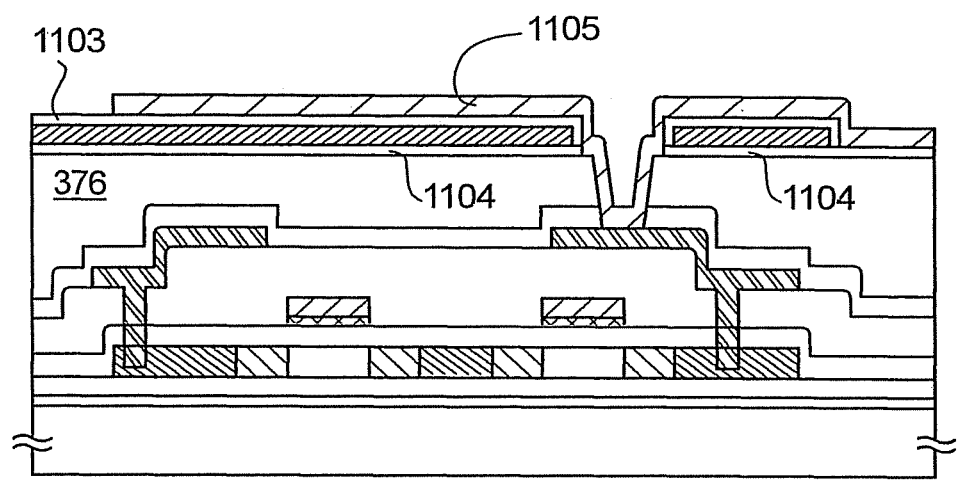

A technique is provided in embodiment 7 to increase the adhesiveness between a shielding film and an organic resin film in the pixel matrix circuit shown in embodiment 1. FIGS. 11A and 11B are used in the explanation.

After forming the organic resin film 376 in accordance with embodiment 1, a 10 to 200 nm thick inorganic film is formed by sputtering in embodiment 7. A silicon oxide film is formed here, and in addition, a high purity aluminum film is formed successively. The high purity aluminum film is etched, forming a shielding film 1102. In FIG. 11A, reference numeral 1101 denotes a silicon oxide film, 1102 denotes a shielding film, and 1103 denotes an anodic oxide film.

The silicon oxide film 1101 functions as a buffer layer in order to increase the adhesiveness between the organic resin film 376 and the shielding film 1102, made from the high purity aluminum film. By forming this silicon oxide film, even better adhesiveness can be secured in the case where the oxide film 1103 is formed by the anodic oxidation method shown in the embodiment mode of the present invention. Further, in addition to a silicon oxide film, an insulating film containing silicon (indicating a general term for a silicon nitride film or a nitrated silicon oxide film in this specification) can be used as an inorganic film 1104. Note that throughout this specification, a nitrated silicon oxide film is an insulating film expressed by $SiO_xN_y$ (where 0<x and y<1), and indicates an insulating film containing silicon, oxygen, and nitrogen at a predetermined ratio.

Furthermore, a plasma process may performed on the surface of the second interlayer insulating film 376, formed by an organic resin, or on the surface of the silicon oxide film, using $CF_4$ gas, refining the surface and increasing the adhesiveness of the shielding film formed on top.

Figure 30A:
FIGS. 30A and 30B are a SEM photograph view and a schematic diagram, respectively, of the storage capacitor of FIG. 11B.
Figure 30B:
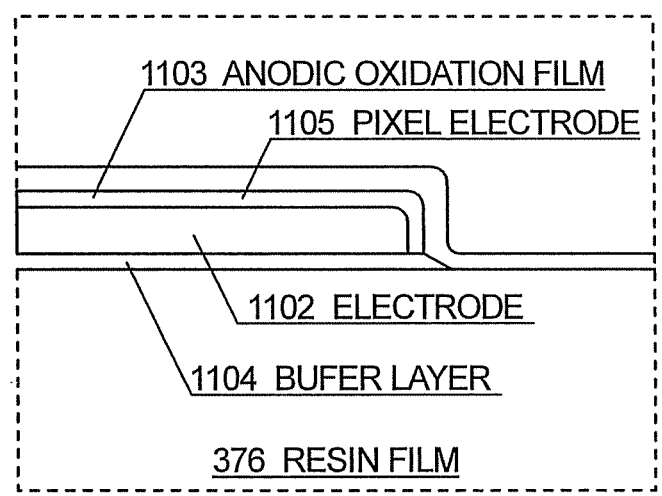

Note that patterning of the silicon oxide film into the structure shown in FIG. 11B may be performed after anodic oxidation of the shielding film 1102 by using shielding film 1102 and anodic oxide film as a mask in order to made contact hole formation easier. A SEM photograph and a schematic diagram of the cross sectional structure of FIG. 11B are shown in FIGS. 30A and 30B, respectively. Note that the same symbols as used in FIG. 11 are used in FIG. 30B.

Further, patterning of the silicon oxide film may be performed at the same time as patterning of the shielding film.

Note that it is possible to freely combine the structure of embodiment 7 with the structure of any of embodiments 1 to 6.

Embodiment 8

Figure 13:
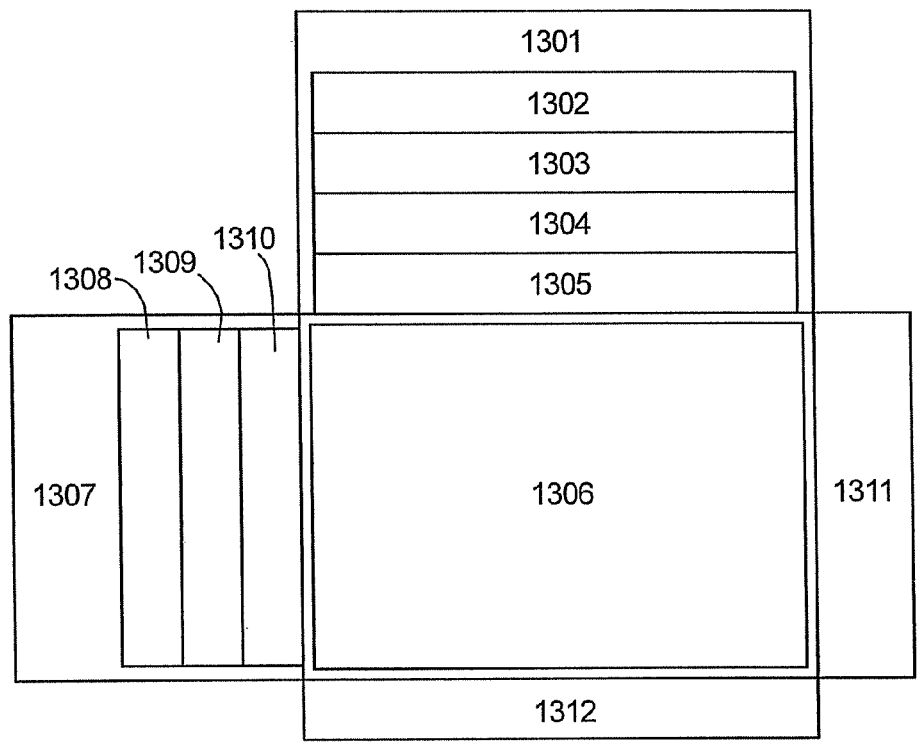
FIG. 13 is a block diagram of the AM-LCD circuit.

FIG. 13 shows an example circuit structure of the active matrix substrate shown in embodiment 1. The active matrix substrate of embodiment 8 has a source signal line side driver circuit 1301, a gate signal line side driver circuit (A) 1307, a gate signal line side driver circuit (B) 1311, a pre-charge circuit 1312, and a pixel matrix circuit 1306. The source signal line side driver circuit 1301 is provided with a shift register circuit 1302, a level shifter circuit 1303, a buffer circuit 1304, and a sampling circuit 1305. Further, the gate signal line side driver circuit (A) 1307 is provided with a shift register circuit 1308, a level shifter circuit 1309, and a buffer circuit 1310. The gate signal line side driver circuit (B) 1311 has a similar structure.

The driver voltages for the shift register circuits 1302 and 1308 is between 5 and 16 V here (typically 10 V), and the structure shown by reference numeral 502 in FIG. 5C is suitable for n-channel TFTs used in the CMOS circuits forming the shift register circuits.

Furthermore, the driver voltage becomes high at between 14 and 16 V for the level shifter circuits 1303 and 1309, and the buffer circuits 1304 and 1310, but similar to the shift register circuits, CMOS circuits containing the n-channel TFT 502 shown in FIG. 5C are suitable. Note that using a double gate structure for the gate wiring is effective in increasing the circuit reliability.

Further, the sampling circuit 1305 has a driver voltage of between 14 and 16 V, but the source region and the drain region are inverted and it is necessary to reduce the off current value, so CMOS circuits containing the n-channel TFT 503 of FIG. 5C are suitable. Note that only the n-channel TFT is shown in FIG. 5C, but in practice the n-channel TFT and a p-channel TFT are combined when forming the sampling circuit.

Further, the pixel matrix circuit 1306 has a driver voltage of between 14 and 16 V, but it is necessary to reduce the off current value even lower than that of the sampling circuit 1305. Therefore a complete LDD structure (a structure having no Lov region) is preferable, and it is preferable to use the n-channel TFT 504 of FIG. 5C as the pixel TFT.

Figure 14:
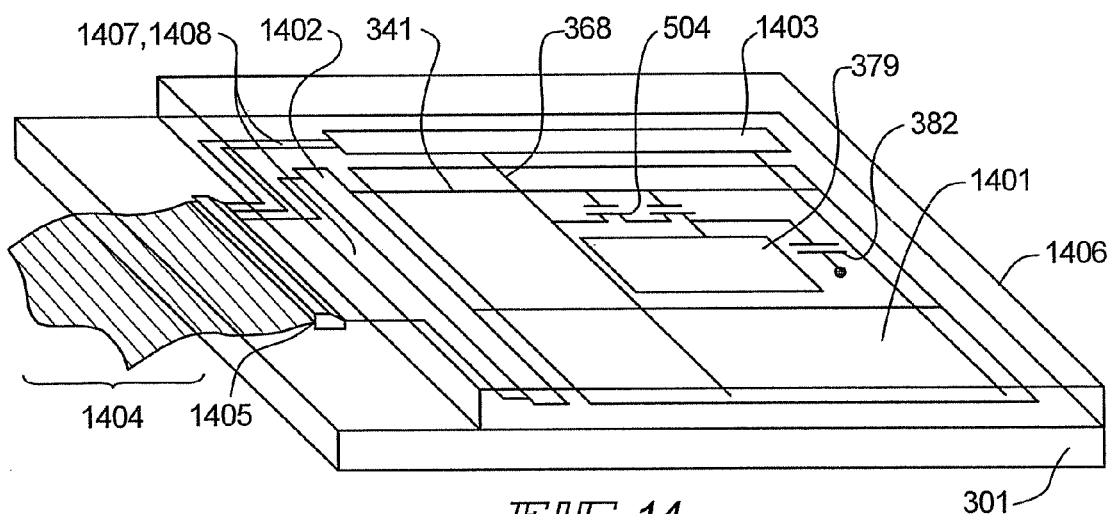
FIG. 14 is a diagram showing the outside of the AM-LCD.

Further, a perspective view of an active matrix type liquid crystal display device is shown in FIG. 14. Note that in FIG. 14, common reference symbols as that of FIGS. 3A to 5C are used so that FIG. 14 corresponds to the cross sectional views shown in FIGS. 3A to 5C.

The active matrix substrate is composed of a pixel matrix circuit 1401, a scanning (gate) line driver circuit 1402, and a signal (source) line driver circuit 1403 formed on the glass substrate 301. The pixel TFT 504 of the pixel matrix circuit is an n-channel TFT, and the driver circuits formed in the surrounding area are based on CMOS circuits. The scanning (gate) line driver circuit 1402 and the signal (source) line driver circuit 1403 are connected to the pixel matrix circuit 1401 by the gate wiring 341 and the source wiring 368, respectively. Further, connection wirings 1407 and 1408 are formed to connect from an external input/output terminal 1405 that is connected to an FPC 1404, to an input/output terminal of the driver circuit.

Note that it is possible to freely combine the structure of embodiment 8 with the structure of any of embodiments 1 to 7.

Embodiment 9

FIGS. 15A to 15E are used in embodiment 9 to explain the formation process of an active layer that becomes a TFT active layer. First, a base film 1502 is formed from a 200 nm thick nitrated silicon oxide film on a substrate (a glass substrate in embodiment 9) 1501, and an amorphous semiconductor film (an amorphous silicon film in embodiment 9) 1503 with a 50 nm thickness is formed successively without exposure to the atmosphere.

Next, an aqueous solution containing 10 ppm by weight of a catalytic element (nickel in embodiment 9) is applied by spin coating, forming a catalytic element containing layer 1504 on the entire surface of the amorphous semiconductor film 1503. In addition to nickel (Ni), it is possible to use the following elements as the catalytic element here: germanium (Ge), iron (Fe), palladium (Pd), tin (Sn), lead (Pb), cobalt (Co), platinum (Pt), copper (Cu), and gold (Au). (See FIG. 15A.)

A nickel doping method by spin coating is used in embodiment 9, but a thin film may also be formed from the catalytic element (a nickel film in the case of embodiment 9) on the amorphous semiconductor film by a means such as evaporation or sputtering.

A heat treatment process at 400 to 500° C. for approximately 1 hour is performed preceding a crystallization process, and after removing hydrogen from within the film, heat treatment is performed at between 500 and 650° C. (preferably from 550 to 570° C.) for 4 to 12 hours (preferably between 4 and 6 hours). Heat treatment is performed at 550° C. for 4 hours in embodiment 9, forming a crystalline semiconductor film (a crystalline silicon film in embodiment 9) 1505. (See FIG. 15B.)

A gettering process for removing the nickel used in the crystallization process from the crystalline silicon film is performed next. First, a mask insulating film 1506 is formed to a thickness of 150 nm on the surface of the crystalline semiconductor film 1505, and an open section 1507 is formed by patterning. A process for doping a periodic table group 15 element (phosphorous in embodiment 9) into the exposed crystalline semiconductor film is then performed. A gettering region 1508 containing a phosphorous concentration of between $1\times10^{19}$ and $1\times10^{20}$ atoms/cm$^3$ is thus formed. (See FIG. 15C.)

A heat treatment process is performed next in a nitrogen atmosphere at between 450 and 650° C. (preferably from 500 to 550° C.) for 4 to 24 hours (preferably between 6 and 12 hours). The nickel in the crystalline semiconductor film is made to move in the direction of the arrows by this heat treatment process, and is captured in the gettering region 1508 by a phosphorous gettering effect. In other words, the concentration of nickel contained in a crystalline semiconductor film 1509 can be reduced below $1\times10^{17}$ atoms/cm$^3$, preferably to $1\times10^{16}$ atoms/cm$^3$, because nickel is removed from the crystalline semiconductor film. (See FIG. 15D.)

Figure 15A:
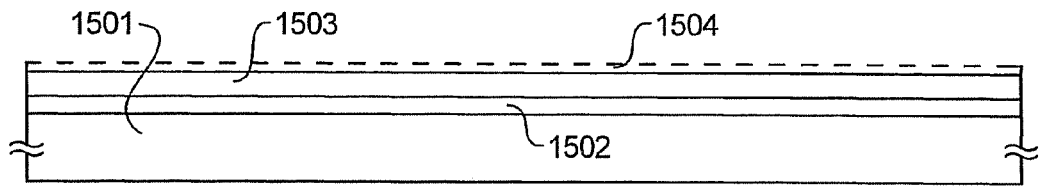
FIGS. 15A to 15E are cross sectional diagrams showing the manufacturing process of a crystalline semiconductor film.
Figure 15B:
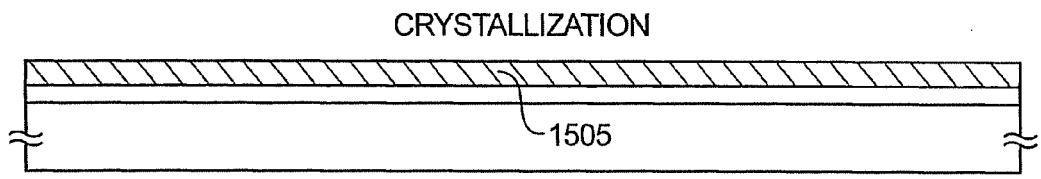
Figure 15C:
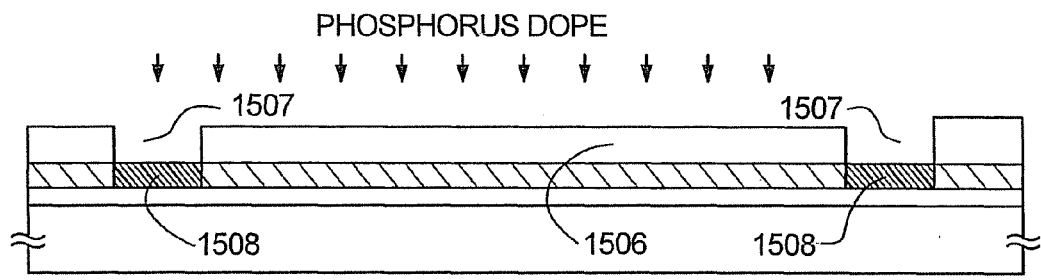
Figure 15D:
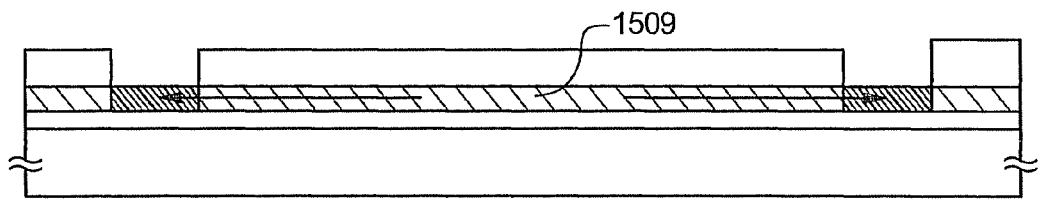
Figure 15E:
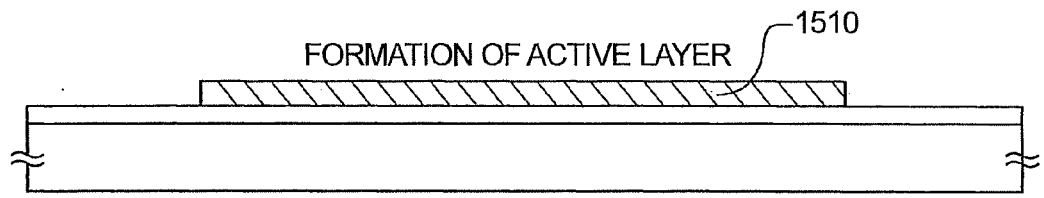

After then removing the mask insulating film 1506, the gettering region 1508 is patterned so that it is completely removed, and an active layer 1510 is obtained. Note that only one active layer 1510 is shown in FIG. 15E, but a plural number of active layers are of course formed on the substrate at the same time.

By using the catalytic element to promote crystallization (nickel here), the active layer 1510 thus formed is a crystalline semiconductor film having extremely good crystallinity. Further, the catalytic element is removed by the phosphorous gettering effect after crystallization, and the concentration of the catalytic element remaining in the active layer 1510 is less than $1\times10^{17}$ atoms/cm$^3$, preferably $1\times10^{16}$ atoms/cm$^3$.

Note that it is possible to freely combine the structure of embodiment 9 with the structure of any of embodiments 1 to 8.

Embodiment 10

FIGS. 16A to 16E are used in embodiment 10 to explain the formation process of an active layer that becomes a TFT active layer. Specifically, the technique described in Japanese Patent Application Laid-open No. Hei 10-247735 (corresponding to U.S. patent Ser. No. 09/034,041) is used.

First, a base film 1602 is formed from a 200 nm thick nitrated silicon oxide film on a substrate (a glass substrate in embodiment 10) 1601, and an amorphous semiconductor film (an amorphous silicon film in embodiment 9) 1603 with a 50 nm thickness is formed successively without exposure to the atmosphere. A mask insulating film 1604 is then formed from a silicon oxide film to a thickness of 200 nm, and an open section 1605 is formed.

Next, an aqueous solution containing 100 ppm by weight of a catalytic element (nickel in embodiment 10) is applied by spin coating, forming a catalytic element containing layer 1606. The catalytic element containing layer 1606 is selectively in contact with the amorphous semiconductor film 1603 at this point in the region where the open section 1605 is formed. In addition to nickel (Ni) it is possible to use the following elements as the catalytic element here: germanium (Ge), iron (Fe), palladium (Pd), tin (Sn), lead (Pb), cobalt (Co), platinum (Pt), copper (Cu), and gold (Au). (See FIG. 16A.)

A nickel doping method by spin coating is used in embodiment 10, but a thin film may also be formed from the catalytic element (a nickel film in the case of embodiment 10) on the amorphous semiconductor film by a means such as evaporation or sputtering.

A heat treatment process at 400 to 500° C. for approximately 1 hour is performed preceding a crystallization process, and after removing hydrogen from within the film, heat treatment is performed at between 500 and 650° C. (preferably from 550 to 600° C.) for 6 to 16 hours (preferably between 8 and 14 hours). Heat treatment is performed at 570° C. for 14 hours in embodiment 10. As a result, crystallization proceeds roughly parallel to the substrate (in the direction shown by the arrows) with the open section 1605 as a starting point, forming a crystalline semiconductor film (a crystalline silicon film in embodiment 10) 1607, in which the growth directions of the crystals are macroscopically in alignment. (See FIG. 16B.)

A gettering process for removing the nickel used in the crystallization process from the crystalline silicon film is performed next. A process for doping a periodic table group 15 element (phosphorous in embodiment 10) is performed with the mask insulating film 1604 previously formed as a mask as it is, forming a gettering region 1608 containing a phosphorous concentration of between $1\times10^{19}$ and $1\times10^{20}$ atoms/cm$^3$ in the crystalline semiconductor film exposed by the open section 1605. (See FIG. 16C.)

A heat treatment process is performed next in a nitrogen atmosphere at between 450 and 650° C. (preferably from 500 to 550° C.) for 4 to 24 hours (preferably between 6 and 12 hours). The nickel in the crystalline semiconductor film is made to move in the direction of the arrows by this heat treatment process, and is captured in the gettering region 1608 by a phosphorous gettering effect. In other words, the concentration of nickel contained in a crystalline semiconductor film 1609 can be reduced below $1\times10^{17}$ atoms/cm$^3$, preferably to $1\times10^{16}$ atoms/cm$^3$, because nickel is removed from the crystalline semiconductor film. (See FIG. 16D.)

Figure 16A:
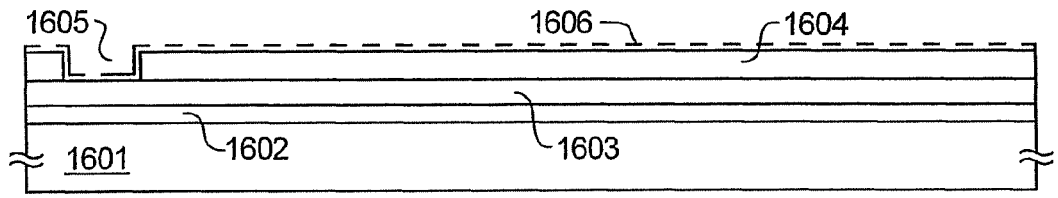
FIGS. 16A to 16E are cross sectional diagrams showing the manufacturing process of the crystalline semiconductor film.
Figure 16B:
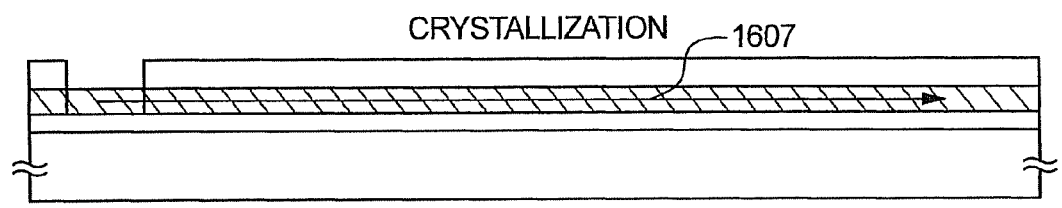
Figure 16C:
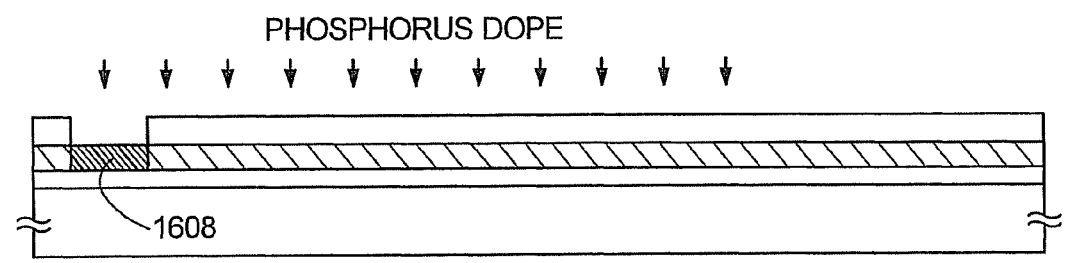
Figure 16D:
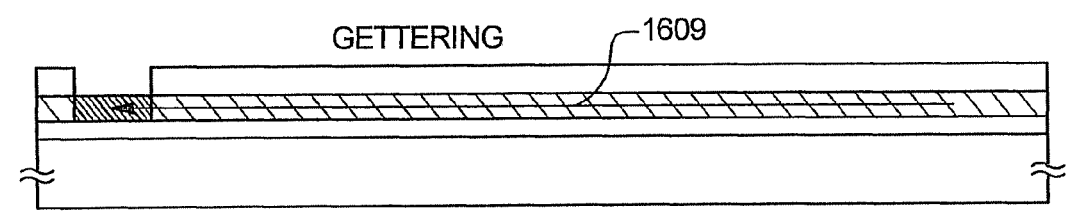
Figure 16E:
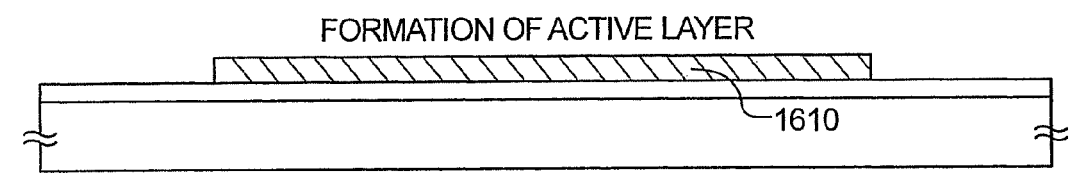

After then removing the mask insulating film 1604, the gettering region 1608 is patterned so that it is completely removed, and an active layer 1610 is obtained. Note that only one active layer 1610 is shown in FIG. 16E, but a plural number of active layers are of course formed on the substrate at the same time.

By selectively doping the catalytic element to promote crystallization (nickel here) and then performing crystallization, the active layer 1610 thus formed is a crystalline semiconductor film having extremely good crystallinity. Specifically, it has a crystal structure in which bar-like or column-like crystals are lined up with a fixed directionality. Additionally, the catalytic element is removed by the phosphorous gettering effect after crystallization, and the concentration of the catalytic element remaining in the active layer 1610 is less than $1\times10^{17}$ atoms/cm$^3$, preferably $1\times10^{16}$ atoms/cm$^3$.

Note that it is possible to freely combine the structure of embodiment 10 with the structure of any of embodiments 1 to 9.

Embodiment 11

Phosphorous is employed in order to getter a catalytic element used for crystallizing a semiconductor film in embodiments 9 and 10, but a case of using another element to getter the above stated catalytic element is explained in embodiment 11.

First, a crystalline semiconductor film is obtained in accordance with the processes of embodiment 9 or embodiment 10. However, a substrate that can be used in embodiment 11 is a heat resistant substrate that can endure 700° C. or greater, typically a quartz substrate, a metallic substrate, or a silicon substrate. Furthermore, the concentration of a catalytic element used in crystallization (a nickel example here) is reduced as much as possible in embodiment 11. Specifically, a 0.5 to 3 ppm by weight nickel containing layer is formed on an amorphous semiconductor film, and heat treatment is performed for crystallization. The nickel concentration in the crystalline semiconductor film thus formed is between $1\times10^{17}$ and $1\times10^{19}$ atoms/cm$^3$ (typically from $5\times10^{17}$ to $1\times10^{18}$ atoms/cm$^3$).

Heat treatment is then performed in an oxidizing atmosphere containing a halogen element after forming the crystalline semiconductor film. The temperature is set between 800 and 1150° C. (preferably from 900 to 1000° C.), and the processing time is made from 10 minutes to 4 hours (preferably between 30 minutes and 1 hour).

Heat treatment is performed at 950° C. for 30 minutes in embodiment 11 in an oxygen atmosphere containing between 3 and 10% by volume hydrogen chloride. The nickel within the crystalline semiconductor film forms a volatile chloride compound (nickel chloride) by this process and is desorbed throughout the process atmosphere. In other words, it is possible to remove nickel by a halogen element gettering effect. However, if the concentration of nickel existing within the crystalline semiconductor film is too high, then a problem develops in which oxidation proceeds abnormally in the nickel segregated area. It is therefore necessary to reduce the concentration of nickel used at the crystallization stage to as low as possible.

The concentration of nickel remaining in the crystalline semiconductor film thus formed is $1\times10^{17}$ atoms/cm$^3$ or less, preferably $1\times10^{16}$ atoms/cm$^3$. The crystalline semiconductor film is patterned next, forming an active layer, and therefore it is possible to use this as a TFT active layer.

Note that it is possible to freely combine the structure of embodiment 11 with the structure of any of embodiments 1 to 10. In other words, it is possible to use this together with the phosphorous gettering process shown in embodiments 9 and 10.

Embodiment 12

A process for improving the crystallinity of the crystalline semiconductor film (a crystalline silicon film is taken as an example) used in the present invention is explained in embodiment 12. An active layer is formed first in accordance with the processes of any of embodiments 8 to 10. However, it is necessary to use a substrate material that can withstand the temperature between 800 and 1150° C. as the substrate for forming a TFT in Embodiment 12. A quartz substrate, a metallic substrate, a silicon substrate, and a ceramic substrate (including ceramic glass substrates) can be given as examples of this kind of substrate.

A gate insulating film is then formed on the substrate from a nitrated silicon oxide film, a silicon oxide film, or a laminate film of a silicon nitride film and a silicon oxide film. The film thickness of the gate insulating film is made between 20 and 120 nm (typically between 60 and 80 nm).

Heat treatment is performed in an oxidizing atmosphere after forming the gate insulating film. The temperature is from 800 to 1150° C., (preferably between 900 and 1000° C.), and the processing time is set from 10 minutes to 4 hours (preferably between 30 minutes and 1 hour). Note that a dry oxidation method is the most preferable in this case, but a wet oxidation method may also be used. Furthermore, a 100% oxygen atmosphere may be used, or an atmosphere containing a halogen element like that of embodiment 11 may be used.

The active layer is oxidized near the interface of the active layer and the gate insulating film by the heat treatment process, forming a thermal oxide film. As a result, the level of the above interface is reduced, and it shows extremely good interface characteristics. Further, the film thickness of the active layer is reduced by oxidation, and the amount of defects within the film is greatly reduced by the surplus of silicon generated during oxidation, and therefore the semiconductor film becomes one having an extremely low defect density and with good crystallinity.

The final active layer film thickness is regulated to be between 20 and 60 nm, and the gate insulating film thickness is regulated to be from 50 to 150 nm (typically between 80 and 120 nm), when implementing embodiment 12. Furthermore, to sufficiently extract the effect of reducing the defect density, it is preferable to oxidize the active layer to at least 50 nm with crystal lattice.

By following processes like those above, the crystal structure of the active layer is a unique crystal structure possessing continuity in the crystal lattice. The characteristics of such are explained below.

Looking microscopically at the crystalline silicon film formed in accordance with the above manufacturing processes, one finds a crystal structure consisting of a plurality of bar-like or column-like crystals. It is easy to confirm this by observation using a TEM (transmission electron microscope).

Further, it has been verified by using electron beam diffraction and x-ray diffraction that although there is some crystal axis deviation on the surface of the active layer (the channel forming portion), the principal orientation face is {110}. As a result of detailed observation of electron beam diffraction photographs with a spot diameter of 1.5 μm, the applicant of the present invention found that the diffraction spot appeared cleanly in correspondence to the {110} face, but that each spot had a concentric distribution.

Furthermore, the applicant of the present invention observed the grain boundaries formed by each of the contacting bar-like crystals using an HR-TEM (high, resolution transmission electron microscope) and verified that the crystal lattice in the grain boundaries has continuity. This was easily verified by the continuous connection of the observed lattice stripes in the grain boundaries.

Note that the continuity of the crystal lattice in the crystal grain boundaries originates in the fact that the crystal grain boundaries are "planar shape grain boundaries." The definition of the planar shape grain boundaries in this specification is "planar boundary" described in "Characterization of High-Efficiency Cast-Si Solar Cell Wafers by MBIC Measurement, Ryuichi Shimokawa and Yutaka Hayashi, Japanese Journal of Applied Physics vol. 27, No. 5, pp. 751-8, 1988."

According to the above paper, planar shape grain boundaries include twin crystal grain boundaries, special stacking faults, special twist grain boundaries, etc. This planar shape grain boundary possesses a characteristic in that it is not active electrically. Namely, the grain boundaries can essentially be seen as non-existent because they do not function as a trap that obstructs the movement of a carrier.

Particularly for cases in which the crystal axis (the axis perpendicular to the crystal face) is the <110> axis, {211} twin crystal grain boundaries can be called grain boundaries corresponding to Σ3. The Σ value is a parameter that indicates the degree of matching in corresponding grain boundaries, and it is known that smaller Σ values signify good grain boundary matching.

Using a TEM, the applicant of the present invention observed in detail a crystalline silicon film obtained by implementing the present embodiment, and found that most of the crystal grain boundaries (more than 90%, typically more than 95%) had grain boundaries corresponding to Σ3. In other words, were {211} twin grain boundaries.

For the case of two crystals having a {110} face orientation, if the lattice stripe corresponding to the {111} face in the crystal grain boundary formed between both crystal grains has an angle θ, then when θ=70.5°, it is known that the grain boundaries correspond to Σ3.

Neighboring crystal grain lattice stripe in the crystal grain boundaries of the crystal silicon film used in embodiment 12 is continuous at just about 70.5°. From this one can conclude that the crystal grain boundaries are {211} twin grain boundaries.

Note that when θ=38.9°, the grain boundaries correspond to Σ9, and that other crystal grain boundaries like this also exist.

This type of corresponding grain boundary is only formed between crystal grains in the same face orientation. In other words, orientation roughly matched to {110}, and therefore this corresponding grain boundary is formed over a wide area.

This type of crystal structure (literally, crystal grain boundary structure) shows that two different crystal grains are joined together with very good matching in the grain crystal boundaries. Namely, a crystal structure in which the crystal lattice has continuity in the crystal grain boundaries, and in which it is very difficult to create a trap level caused by crystal defects, etc. Therefore it is possible to regard the crystalline silicon films having this type of crystal structure as ones in which crystal grain boundaries do not substantially exist.

Further, it has been verified by TEM observation that defects within the crystal grain boundaries almost completely disappear with a heat treatment process (a thermal oxidation process or a gettering process in this embodiment) at a high temperature of 700 to 1150° C., It is evident that there is a large decrease in the number of defects before and after this type of heat treatment process.

The difference in the number of defects appears as the difference in spin density by electron spin resonance (ESR). At present, crystalline silicon films manufactured in accordance with the processes in embodiment 12 have been shown to have a spin density of at least $5\times10^{17}$ spins/cm$^3$ or less (preferably $3\times10^{17}$ spins/cm$^3$ or less). However, this measurement value is near the detection limits of the present measuring equipment, and it is expected that the real spin density is even lower.

From the above, it can be considered that the crystalline silicon film obtained by implementing embodiment 12 is a single crystal silicon film or an essentially single crystal silicon film because the crystal grains and the crystal grain boundaries essentially do not exist.

(Knowledge Related to TFT Electrical Characteristics)

The TFT employing the active layer of embodiment 12 displays electrical characteristics equivalent to a MOSFET. Data showing the following was obtained from a TFT tested by the applicant of the present invention (however, the film thickness of the active layer is 30 nm, the film thickness of the gate insulating film is 100 nm):

1. The sub-threshold coefficient, which characterizes the switching performance (the quickness of on/off operation switching), is small at between 60 and 100 mV/decade (typically from 60 to 85 mV/decade) for both an n-channel TFT and a p-channel TFT.

2. The electric field effect mobility ($\mu_{FE}$), which characterizes the TFT operation speed, is large at between 200 and 650 cm$^2$/Vs (typically between 300 and 500 cm$^2$/Vs) for an n-channel TFT, and between 100 and 300 cm$^2$/Vs (typically between 150 and 200 cm$^2$/Vs) for a p-channel TFT.

3. The threshold voltage ($V_{th}$), which characterizes the driving voltage for the TFT, is small at between −0.5 and 1.5 V for an n-channel TFT, and between −1.5 and 0.5 V for a p-channel TFT.

The above verifies that it is possible to realize very superior switching characteristics and high speed operation characteristics. Note that it is possible to freely combine the structure of embodiment 12 with the structure of any of embodiments 1 to 11. However, it is important to use the catalytic element to promote crystallization as shown in embodiments 9 to 11 for the crystallization of the amorphous semiconductor film.

Embodiment 13

Figure 17A:
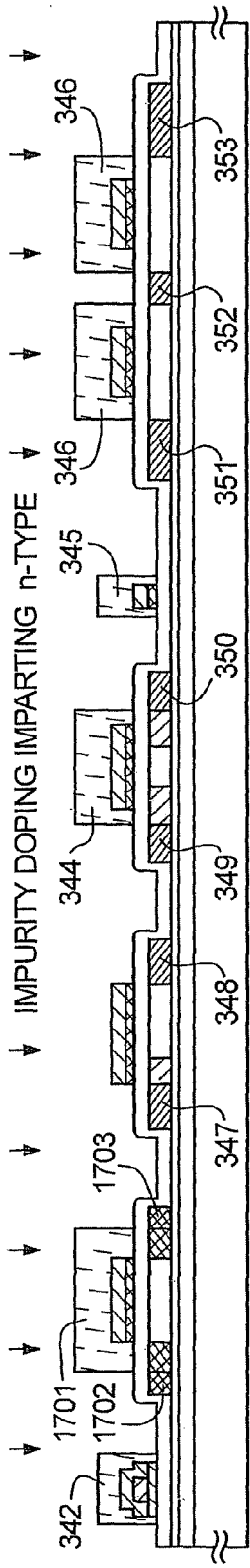
FIGS. 17A to 17C are diagrams showing the manufacturing process of the pixel, matrix circuit and a driver circuit.
Figure 17B:
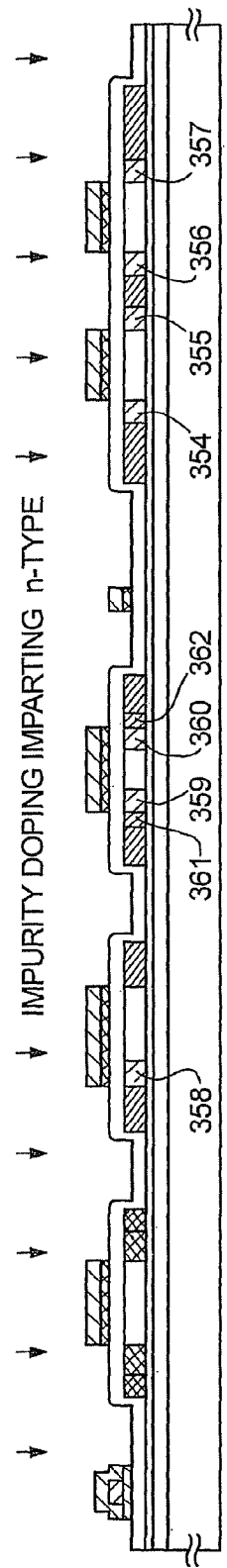
Figure 17C:
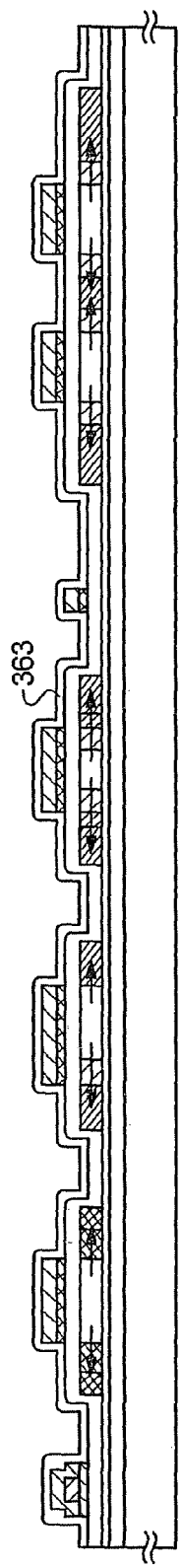

A means of gettering a catalytic element used for the crystallization (nickel is taken as an example in embodiment 13) from a crystalline semiconductor film (a crystalline silicon film is taken as an example) crystallized in accordance with the means shown in either embodiment 9 or embodiment 10 is explained in embodiment 13. FIGS. 17A to 17C are used in the explanation.

Figure 4A:
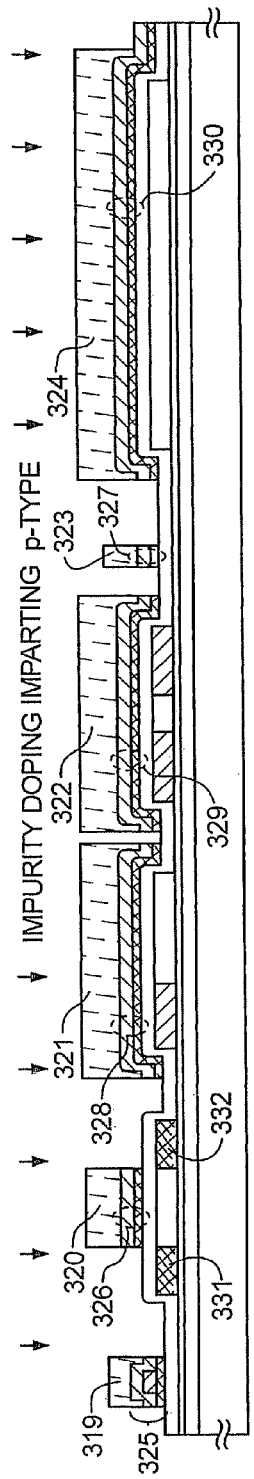
FIGS. 4A to 4C are diagrams showing the manufacturing process of the AM-LCD.
Figure 4B:
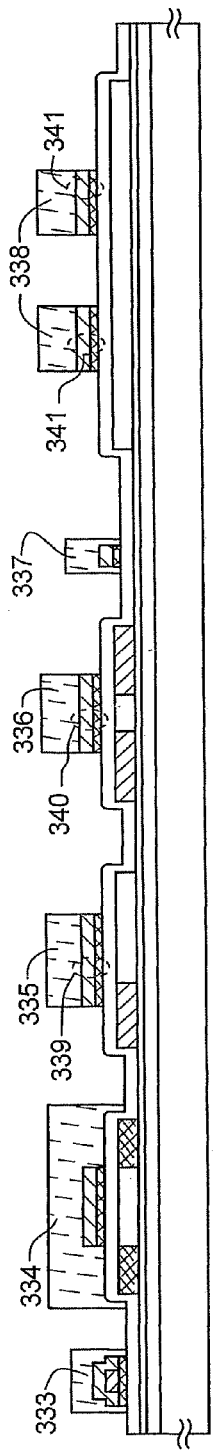

The state of FIG. 4B is first obtained in accordance with processes similar to those of embodiment 1. Phosphorous is doped next using processes similar to those of FIG. 4C. A resist mask 1701, shown in FIG. 17A, is used in embodiment 13 in place of the resist mask 343 of FIG. 4C. In other words, the resist mask is formed in FIG. 4C so as to cover the entire region that becomes the p-channel TFT, but in FIG. 17A, the resist mask is formed so as not to cover the edge portion of a p$^{++}$ region.

Figure 4C:
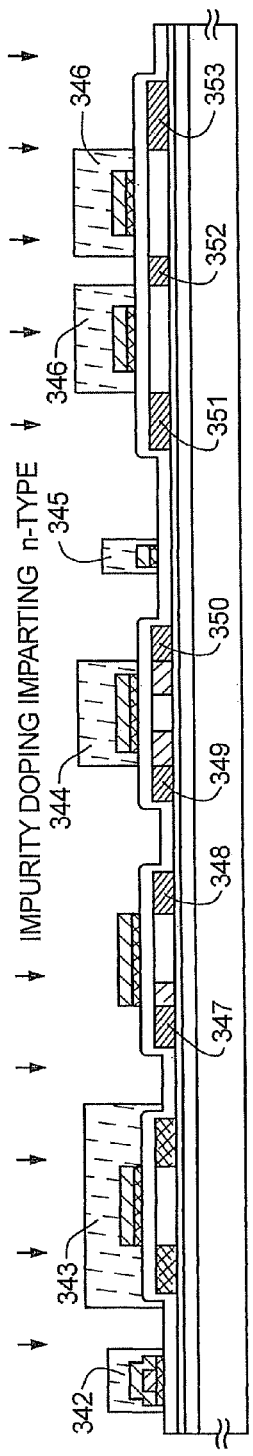

Phosphorous is doped in this state with conditions similar to those of the processes of FIG. 4C. As a result, phosphorous is doped into the edge portions of the p$^{++}$ regions 331 and 332 of the p-channel TFT, forming (p$^{++}$+n$^+$) regions 1702 and 1703. However, the concentration of the impurity element in the p$^{++}$ regions, which imparts p-type conductivity, is doped to a sufficiently higher concentration than that of the phosphorous contained in the n$^+$ region, and therefore it can be maintained as the p$^{++}$ region.

After next removing the resist masks 1701, 342, and 344 to 346, a phosphorous doping process at the same concentration as that of FIG. 5A of embodiment 1 is performed. The n$^{--}$ regions 361, 362, and 354 to 357 are formed by this process. (See FIG. 17B.)

A process of activating the doped impurity element (phosphorous or boron) is performed next, similar to that of FIG. 5B of embodiment 1. It is preferable to perform this activation process by furnace annealing or lamp annealing in embodiment 13. For the case when furnace annealing is used, heat treatment is performed at between 450 and 650° C., preferably from 500 to 550° C., and at 500° C. for 4 hours here. (See FIG. 17C.)

In embodiment 13, a source region or a drain region of both n-channel TFT and p-channel TFT has a region containing phosphorous with concentration corresponding to the n$^+$ region. Due to this, a nickel gettering effect can be obtained by the phosphorous when performing heat treatment process for thermal activation. In other words, nickel moves from a channel forming region in the direction of the arrows, and is gettered by the action of the phosphorous contained in the source region or in the drain region.

If embodiment 13 is thus executed, the activation process of the impurity element doped into the active layer may serve as the gettering process of the catalytic element used for crystallization, which is effective in simplifying the process.

Note that it is possible to freely combine the structure of embodiment 13 with the structure of any of embodiments 1 to 12. However, it is an effective technique for cases when a catalytic element for promoting the crystallization is used when crystallizing an amorphous semiconductor film.

Embodiment 14

FIGS. 18A to 18C are used in embodiment 14 to explain the case of manufacturing a TFT with a different process order than that of embodiment 1. Note that the processes are the same as those of embodiment 1 up to a certain point, and that identical symbols are used for the same processes. Further, this is an example in which the same impurity element as that doped in embodiment 1 is used.

First, the state of FIG. 4B is obtained in accordance with the processes of embodiment 1. That state is shown in FIG. 18A in embodiment 14. The resist masks 333 to 338 are removed next, and a phosphorous doping process is performed to form $n^{--}$ regions. The conditions may be the same as those of the process of FIG. 5A of embodiment 1. In FIG. 18A, regions denoted by reference numerals 1801 to 1803 are regions doped with phosphorous corresponding to an $n^{--}$ region, and regions denoted by reference numerals 1804 and 1805 are $n^{--}$ regions that become Loff regions of a pixel TFT. (See FIG. 18B.)

Resist masks 1807 to 1811 are formed next, and phosphorous is doped under conditions similar to those of FIG. 4C. Regions 1812 to 1818, doped with a high concentration of phosphorous, are thus formed by this process. (See FIG. 18C.)

If further processing of FIG. 5B onward are performed in accordance with the processes of embodiment 1, then a pixel matrix circuit with the structure explained in FIG. 5C can be obtained. When embodiment 14 is used, there is a structure in which a phosphorous of concentration corresponding to an $n^+$ region is not doped into a source region and a drain region of a p-channel TFT that forms a CMOS circuit. Thus the boron concentration necessary for the $p^{++}$ doping process is reduced, and the throughput is increased. On the other hand, provided that a resist was formed to dope phosphorous also into the edge portion of a $p^{++}$ region of an n-channel TFT by the processes of FIG. 18C, then it is possible to perform the gettering process of embodiment 13.

Furthermore, when forming the $n^+$ region or the $p^{++}$ region forming the source region or the drain region, a gate insulating film may be etched before doping the impurity element, exposing a portion of an active layer, and the impurity element may be doped into the exposed portion. The acceleration voltage is lower in this case, and therefore the damage imparted to the active layer is little, and the throughput is increased.

Note that when implementing embodiment 14, cases in which the final concentration of the impurity element contained in the impurity region formed in the active layer differs from that of embodiment 1 are possible, due to the changed process order. However, the essential function of each impurity region does not change, and therefore the explanation of the structure of FIG. 5C can be referred to as is for an explanation of the final structure when implementing embodiment 14.

Note that it is possible to freely combine the structure of embodiment 14 with the structure of any of embodiments 1 to 13.

Embodiment 15

FIGS. 19A to 19C are used in embodiment 15 to explain the case of manufacturing a TFT with a different process order than that of embodiment 1. Note that the processes are the same as those of embodiment 1 up to a certain point, and that identical symbols are used for the same processes. Further, this is an example in which the same impurity element as that doped in embodiment 1 is used.

Figure 3A:
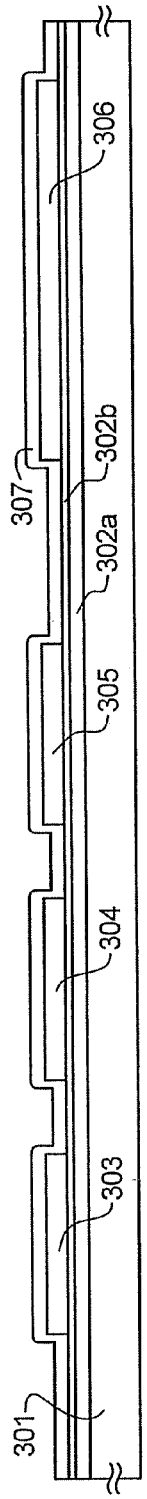
FIGS. 3A to 3D are diagrams showing the manufacturing process of an AM-LCD.
Figure 3B:
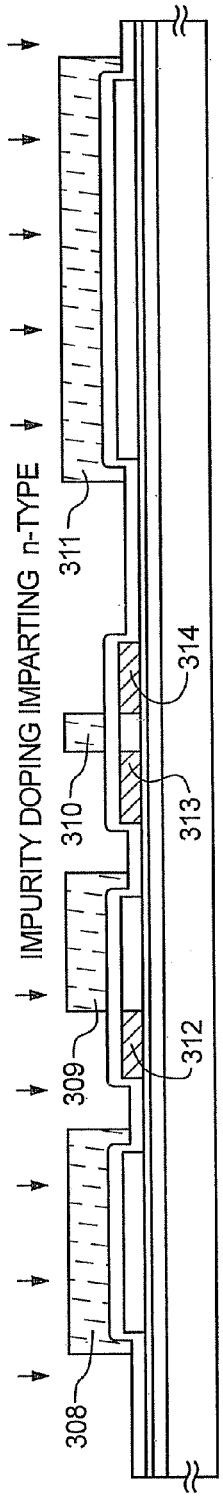
Figure 3C:
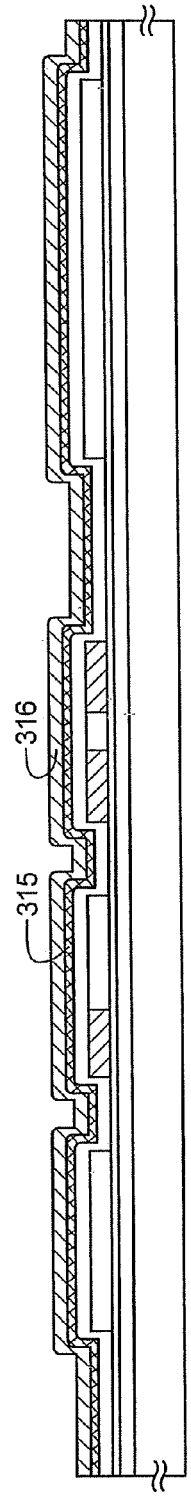
Figure 3D:
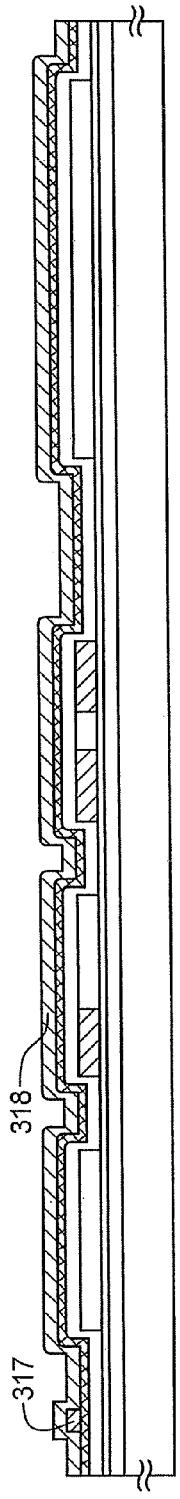

First, the state of FIG. 3D is obtained in accordance with the processes of embodiment 1. Gate wiring of an n-channel TFT and other connection wirings are then formed. In FIG. 19A, reference numerals 1901 and 1902 denote connection wirings, reference numerals 1903 to 1905 denote gate wirings of an n-channel TFT, and reference numeral 1906 is a conductive film for later formation of gate wiring of a p-channel TFT.

Resist masks 1907 to 1911 are formed next, and phosphorous is doped under conditions similar to those of FIG. 4C in embodiment 1. Impurity regions 1912 to 1918, doped with a high concentration of phosphorous, are thus formed by this process. (See FIG. 19A.)

Then, after removing the resist masks 1907 to 1911, resist masks 1919 to 1924 are formed, and a gate wiring 1925 of the p-channel TFT is formed. Boron is then doped under conditions similar to those of FIG. 4A, forming $p^{++}$ regions 1926 and 1927. (See FIG. 19B.)

Phosphorous is doped next with the same conditions as in FIG. 5A, after removing the resist masks 1919 to 1924. This doping process forms $(n^-+n^{--})$ regions 1930 and 1931, and $n^{--}$ regions 1932 to 1935. (See FIG. 19C.)

If further processing of FIG. 5B onward are performed in accordance with the processes of embodiment 1, then a pixel matrix circuit with the structure explained in FIG. 8C can be obtained. When embodiment 15 is used, there is a structure in which a phosphorous of concentration corresponding to an $n^+$ region is not doped into a source region and a drain region of a p-channel TFT that forms a CMOS circuit. Thus the boron concentration necessary for the $p^{++}$ doping process is reduced, and the throughput is increased.

Further, when forming the $n^+$ region or the $p^{++}$ region forming the source region or the drain region, a gate insulating film may be etched before doping the impurity element, exposing a portion of an active layer, and the impurity element may be doped into the exposed portion. The acceleration voltage is lower in this case, and therefore the damage imparted to the active layer is little, and the throughput is increased.

Note that when implementing embodiment 15, cases in which the final concentration of the impurity element contained in the impurity region formed in the active layer differs from that of embodiment 1 are possible, due to the changed process order. However, the essential function of each impurity region does not change, and therefore the explanation of the structure of FIG. 5C can be referred to as is for an explanation of the final structure when implementing embodiment 15.

Note that it is possible to freely combine the structure of embodiment 15 with the structure of any of embodiments 1 to 13.

Embodiment 16

FIGS. 20A to 20C are used in embodiment 16 to explain the case of manufacturing a TFT with a different process order than that of embodiment 1. Note that the processes are the same as those of embodiment 1 up to a certain point, and that identical symbols are used for the same processes. Further, this is an example in which the same impurity element as that doped in embodiment 1 is used.

First, the state of FIG. 3D is obtained in accordance with the processes of embodiment 1, and the state shown in FIG. 19A is obtained in accordance with the processes of embodiment 15. This state is shown in FIG. 20A in embodiment 16. Note that symbols used in FIG. 20A are the same symbols as used in FIG. 19A.

Phosphorous is doped next, under the same conditions as those of FIG. 5A, after removing the resist masks 1907 to 1911. This doping process forms ($n^-$+$n^{--}$) regions 2001 and 2002, and $n^{--}$ regions 2003 to 2006 (See FIG. 20B.)

Resist masks 2007 to 2012 are formed next, and a gate wiring 2013 of the p-channel TFT is formed. Boron is then doped under conditions similar to those of FIG. 4A, forming $p^{++}$ regions 2014 and 2015. (See FIG. 20C.)

If further processing of FIG. 5B onward are performed in accordance with the processes of embodiment 1, then a pixel matrix circuit with the structure explained in FIG. 5C can be obtained. When embodiment 16 is used, there is a structure in which a phosphorous is not doped into a source region and a drain region of a p-channel TFT that forms a CMOS circuit. Thus the boron concentration necessary for the $p^{++}$ doping process is reduced, and the throughput is increased.

Further, when forming the $n^+$ region or the $p^{++}$ region forming the source region or the drain region, a gate insulating film may be etched before doping the impurity element, exposing a portion of an active layer, and the impurity element may be doped into the exposed portion. The acceleration voltage is lower in this case, and therefore the damage imparted to the active layer is little, and the throughput is increased.

Note that when implementing embodiment 16, cases in which the final concentration of the impurity element contained in the impurity region formed in the active layer differs from that of embodiment 1 are possible, due to the changed process order. However, the essential function of each impurity region does not change, and therefore the explanation of the structure of FIG. 5C can be referred to as is for an explanation of the final structure when implementing embodiment 16.

Note that it is possible to freely combine the structure of embodiment 16 with the structure of any of embodiments 1 to 13.

Embodiment 17

FIGS. 21A to 21D are used in embodiment 17 to explain the case of manufacturing a TFT with a different process order than that of embodiment 1. Note that the processes are the same as those of embodiment 1 up to a certain point, and that identical symbols are used for the same processes. Further, this is an example in which the same impurity element as that doped in embodiment 1 is used.

First, the state of FIG. 3D is obtained in accordance with the processes of embodiment 1. Then, without performing the processes of FIG. 4A (formation process of p-channel TFT gate wirings and $p^{++}$ regions), n-channel TFT gate wirings and other connection wirings are formed similarly to FIG. 4B. Note that the symbols used in FIG. 21A are the same as those of FIG. 4B. However, in regards to a region that becomes a p-channel type TFT, a resist mask 2101 is formed, and a conductive film 2102, which becomes a gate wiring of the p-channel type TFT, is left.

Next, with the resist mask remaining as is, phosphorous is doped under the same conditions as in FIG. 5A. This doping process forms ($n^-$+$n^{--}$) regions 2103 to 2105, and $n^{--}$ regions 2106 to 2108 (See FIG. 21B.)

Resist masks 2109 to 2113 are then formed, and phosphorous is doped under the same conditions as those of FIG. 4C of embodiment 1. Impurity regions 2114 to 2120, containing a high concentration of phosphorous, are thus formed. (See FIG. 21C.)

After next removing the resist masks 2109 to 2113, new resist masks 2121 to 2126 are formed, and a gate wiring 2127 of the p-channel TFT is formed. Boron is then doped under conditions similar to those of FIG. 4A, forming $p^{++}$ regions 2128 and 2129. (See FIG. 21D.)

If further processing of FIG. 5B onward are performed in accordance with the processes of embodiment 1, then a pixel matrix circuit with the structure explained in FIG. 5C can be obtained. When embodiment 17 is used, there is a structure in which a phosphorous of concentration corresponding to an $n^+$ region is not doped into a source region and a drain region of a p-channel TFT that forms a CMOS circuit. Thus the boron concentration necessary for the $p^{++}$ doping process is reduced, and the throughput is increased.

Further, when forming the $n^+$ region or the $p^{++}$ region forming the source region or the drain region, a gate insulating film may be etched before doping the impurity element, exposing a portion of an active layer, and the impurity element may be doped into the exposed portion. The acceleration voltage is lower in this case, and therefore the damage imparted to the active layer is little, and the throughput is increased.

Note that when implementing embodiment 17, cases in which the final concentration of the impurity element contained in the impurity region formed in the active layer differs from that of embodiment 1 are possible, due to the changed process order. However, the essential function of each impurity region does not change, and therefore the explanation of the structure of FIG. 5C can be referred to as is for an explanation of the final structure when implementing embodiment 17.

Note that it is possible to freely combine the structure of embodiment 18 with the structure of any of embodiments 1 to 13.

Embodiment 18

FIGS. 22A to 22C are used in embodiment 18 to explain the case of manufacturing a TFT with a different process order than that of embodiment 1. Note that the processes are the same as those of embodiment 1 up to a certain point, and that identical symbols are used for the same processes. Further, this is an example in which the same impurity element as that doped in embodiment 1 is used.

First, the state of FIG. 3D is obtained in accordance with the processes of embodiment 1, and the state shown in FIG. 21B is obtained in accordance with the process of embodiment 17. This state is shown in FIG. 22A in embodiment 18. Note that the symbols used in FIG. 22A are the same as those of FIG. 21B.

After next removing the resist masks, new resist masks 2201 to 2206 are formed, and a gate wiring 2207 of a p-channel TFT is formed. Boron is then doped under conditions similar to those of FIG. 4A, forming $p^{++}$ regions 2208 and 2209. (See FIG. 22B.)

Resist masks 2210 to 2214 are then formed, and phosphorous is doped under the same conditions as those of FIG. 4C. Impurity regions 2215 to 2221, containing a high concentration of phosphorous, are thus formed. (See FIG. 22C.)

If further processing from FIG. 5B onward is performed in accordance with the processes of embodiment 1, then a pixel matrix circuit with the structure explained in FIG. 5C can be obtained. When embodiment 18 is used, there is a structure in which a phosphorous is not doped into a source region and a drain region of a p-channel TFT that forms a CMOS circuit. Thus the boron concentration necessary for the $p^{++}$ doping process is reduced, and the throughput is increased. Furthermore, if phosphorous is also doped into the edge portions of the $p^{++}$ regions 2208 and 2209, then it is possible to perform the gettering process of embodiment 12.

Further, when forming the $n^+$ region or the $p^{++}$ region forming the source region or the drain region, a gate insulating film may be etched before doping the impurity element, exposing a portion of an active layer, and the impurity element may be doped into the exposed portion. The acceleration voltage is lower in this case, and therefore the damage imparted to the active layer is little, and the throughput is increased.

Note that when implementing embodiment 18, cases in which the final concentration of the impurity element contained in the impurity region formed in the active layer differs from that of embodiment 1 are possible, due to the changed process order. However, the essential function of each impurity region does not change, and therefore the explanation of the structure of FIG. 5C can be referred to as is for an explanation of the final structure when implementing embodiment 18.

Note that it is possible to freely combine the structure of embodiment 18 with the structure of any of embodiments 1 to 13.

Embodiment 19

The premise of the manufacturing process examples shown in embodiments 1, and 14 to 18 is that an $n^-$ region that functions later as an Lov region is formed in advance, before forming an n-channel TFT gate wiring. It is then characterized in that $p^{++}$ regions and $n^{--}$ regions are both formed in a self-aligning manner.

However, in order to obtain the effect of the TFT structure of the present embodiment 19, the final structure may be a structure like that shown in FIG. 5C, and there are no limits on the processes for reaching that structure. Therefore, it is possible to form the $p^{++}$ regions and the $n^{--}$ regions by using resist masks, depending upon the circumstances. In that case, the manufacturing process examples of the present invention are not limited to embodiments 1, and 14 to 18, and all combinations are possible.

When doping an impurity element that imparts a single conductivity into an active layer that becomes a TFT active layer in the present invention, four processes are necessary: formation of $n^-$ regions, formation of $n^+$ regions, formation of $n^{--}$ regions, and formation of $p^{++}$ regions. Therefore, twenty-four ways are available even if the order of the manufacturing processes are changed, and the examples shown in embodiments 1, and 14 to 18, are six of those twenty-four ways.

Furthermore, when forming the $n^+$ region or the $p^{++}$ region forming the source region or the drain region, a gate insulating film may be etched before doping the impurity element, exposing a portion of an active layer, and the impurity element may be doped into the exposed portion. The acceleration voltage is lower in this case, and therefore the damage imparted to the active layer is little, and the throughput is increased.

Embodiment 20

Figure 23:
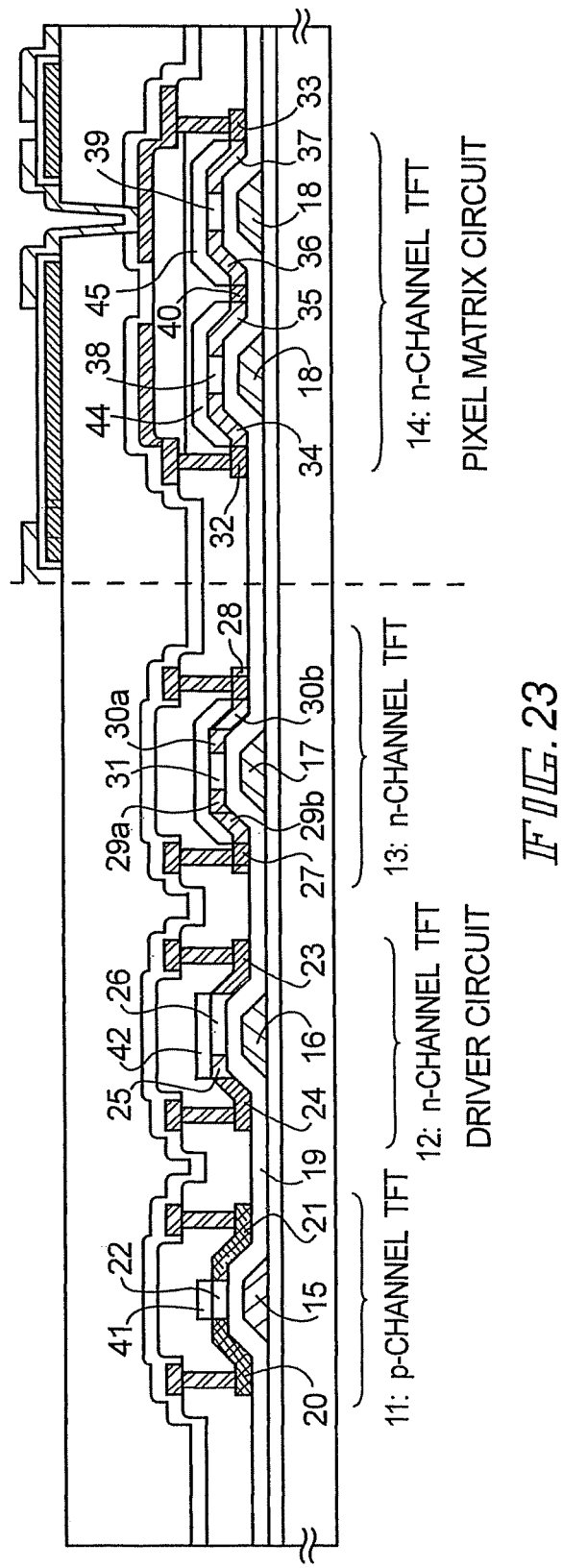
FIG. 23 is a diagram showing the structure of the pixel matrix circuit and the driver circuit.

A case in which a bottom gate type TFT is used for the present invention is explained in embodiment 20. Specifically, the case in which a reverse stagger type TFT is used is shown in FIG. 23. Aside from the difference in the positional relationship between gate wirings and active layers, the use of the reverse stagger type TFT for the present invention does not differ very much from the top gate type TFT of embodiment 1. Therefore, an explanation is made in embodiment 20 which focuses on the points that differ greatly from the structure shown in FIG. 5C, and the explanation of other portions is omitted because it is the same as that of FIG. 5C. A storage capacitor is formed from a shielding film, an anodic oxide film of the shielding film, and a pixel electrode, in the same manner as in embodiment 1. The anodic oxide film is formed by the method shown in the embodiment mode of the present invention.

In FIG. 23, reference numerals 11 and 12 denote a p-channel TFT and an n-channel TFT, respectively, of CMOS circuit forming a shift register circuit etc. Reference numeral 13 denotes an n-channel TFT forming a sampling circuit etc., and reference numeral 14 denotes an n-channel TFT forming a pixel matrix circuit. These TFTs are all formed on a substrate that has a base film formed on it.

Further, reference numeral 15 denotes a gate wiring of the p-channel TFT 11, 16 denotes a gate wiring of the n-channel TFT 12, 17 denotes a gate wiring of the n-channel TFT 13, and 18 denotes a gate wiring of the n-channel TFT 14. The same materials as for the gate wirings explained in embodiment 4 can be used to form the gate wirings here. Further, reference numeral 19 denotes a gate insulating film, and this can also be formed by using the same materials as those of embodiment 4.

An active layer is formed on top for, each of the TFTs 11 to 14. A source region 20, a drain region 21, and a channel forming region 22 are formed in the active layer of the p-channel TFT 11.

A source region 23, a drain region 24, an LDD region (in this case, an Lov region 25), and a channel forming region 26 are formed in the active layer of the n-channel TFT 12.

Furthermore, a source region 27, a drain region 28, LDD regions (in this case, Lov regions 29a and 30a, and Loff regions 29b and 30b), and a channel forming region 31 are formed in the active layer of n-channel TFT 13.

Further, a source region 32, a drain region 33, LDD regions (in this case, Loff regions 34 to 37), channel forming regions 38 and 39, and an $n^+$ region 40 are formed in the active layer of the n-channel TFT 14.

Note that insulating films denoted by reference numerals 41 to 45 are formed with the purpose of protecting the channel forming regions, and with the purpose of forming the LDD regions.

It is easy to apply the present invention to the bottom gate type TFT, typically a reverse stagger type TFT, as above. Note that the manufacturing processes shown in other embodiments described in this specification can be applied to known reverse stagger type TFT manufacturing processes for the manufacture of the reverse stagger type TFT of embodiment 21. Furthermore, it is possible to apply the structure of embodiment 21 to the active matrix type liquid crystal display devices shown in embodiments 5 and 7.

The structure of embodiment 20 can be also applied to cases of forming a gate on a plastic substrate, and the performing anodic oxidation. The adhesiveness between the plastic substrate and a metallic film is poor, similar to its adhesiveness with an organic resin film, and it is appropriate when using the anodic oxidation process described in the embodiment mode of the present invention.

Embodiment 21

A case of applying the present invention to a reflection type liquid crystal display device manufactured on a silicon substrate is explained in embodiment 21. A TFT structure may be realized by doping an impurity element that imparts n-type or p-type conductivity directly into the silicon substrate (silicon wafer) in embodiment 21, instead of into the active layer formed of the crystalline silicon film as in embodiment 1. Furthermore, as a reflection type, a metallic film with a high reflectivity (such as aluminum, silver, or an alloy of these: an Al—Ag alloy) may be used as a pixel electrode.

Namely, a structure having the following structure: at least a pixel matrix circuit and a driver circuit are formed on the same substrate, in which: at least a portion of, or all of, an LDD region of an n-channel TFT forming the driver circuit is arranged so as to overlap a gate wiring of the n-channel TFT; an LDD region of a pixel TFT forming the pixel matrix circuit is arranged so as not to overlap a gate wiring of the pixel TFT; and an n-type conductivity imparting impurity element is contained in the LDD region of the n-channel TFT forming the driver circuit at a higher concentration than in the LDD region of the pixel TFT.

Note that it is possible to freely combine the structure of embodiment 21 with the structure of any of embodiments 1 to 20.

Embodiment 22

It is possible to use the present invention when forming an interlayer insulating film on a conventional MOSFET, and then forming a TFT on that. In other words, it is possible to realize a semiconductor device with a three dimensional structure. Further, it is possible to use an SOI substrate such as SIMOX, Smart-Cut (a trademark of SOITEC corporation), or ELTRAN (a trademark of Cannon, Inc.)

Note that it is possible to freely combine the structure of embodiment 22 with the structure of any of embodiments 1 to 21.

Embodiment 23

It is possible to apply the present invention to an active matrix type EL display. An example of this is shown in FIGS. 24A and 24B, and in FIGS. 33A and 33B.

FIG. 24A is a circuit diagram of an active matrix type EL display. Reference numeral 81 denotes a display region, and an x-direction driver circuit 82 and a y-direction driver circuit 83 are formed in surrounding area. Further, each pixel in the display region 81 has switching TFTs 84, a storage capacitor 85, a current controlling TFT 86, and an organic EL element 87, and the switching TFTs 84 are connected to x-direction signal lines 88a (or 88b) and to y-direction signal lines 89a (or 89b, 89c). Furthermore, power supply lines 90a and 90b are connected to the current controlling TFTs 86.

The TFTs used for the x-direction driver circuits 82 and in the y-direction driver circuits 82 in the active matrix type EL display of embodiment 23 are formed by a combination of the p-channel TFT 501, and the n-channel TFT 502 or 503 of FIG. 5C. Further, the switching TFTs 84 and the current controlling TFTs 86 are formed by the n-channel TFT 504 of FIG. 5C.

A top view of the pixels of an active matrix type EL display is shown in FIG. 24B. In embodiment 23, anodic oxide films are formed on the surface of the power supply lines 90a and 90b by the anodic oxidation method shown in the embodiment mode of the present invention, and a storage capacitor is formed in the region denoted by reference numeral 85.

Figure 33A:
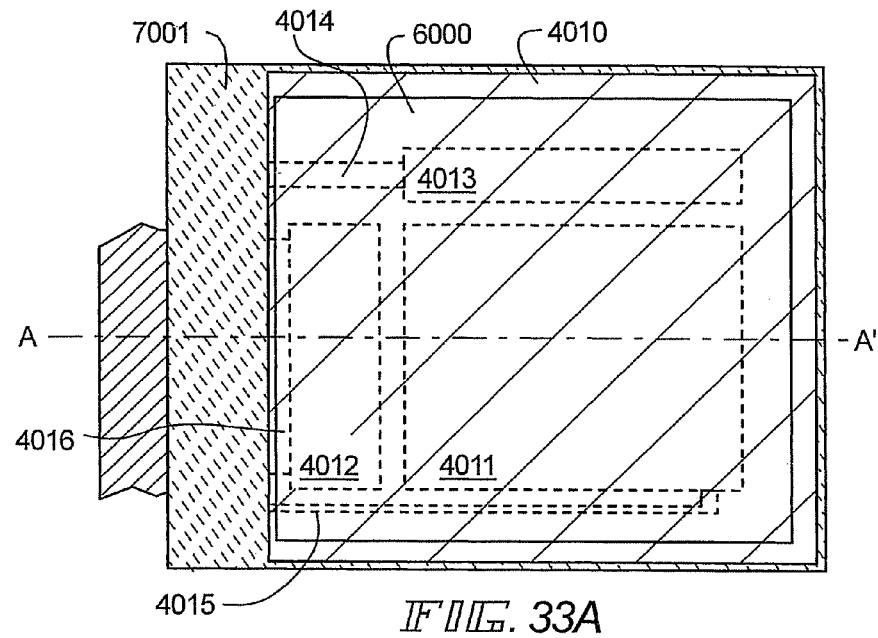
FIGS. 33A and 33B are diagrams showing a top view and a cross sectional diagram, respectively, of an EL display device.

FIG. 33A is a top view of an EL display device using the present invention. In FIG. 33A, reference numeral 4010 denotes a substrate, 4011 denotes a pixel section, 4012 denotes a source side driver circuit, and 4013 denotes a gate side driver circuit. Both driver circuits lead to an FPC 4017 through wirings 4014 to 4016, and thus connect to external equipment.

A cover 6000, a sealing material (also called a housing material) 7000, and a sealant (a second sealing material) 7001 are formed so as to surround at least the pixel section, and preferably both the pixel section and the driver circuits at this point.

Figure 33B:
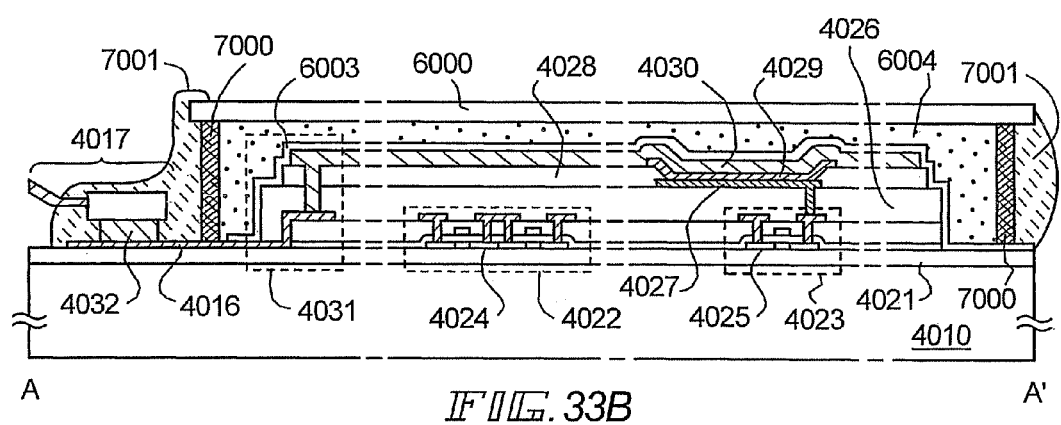

FIG. 33B is the cross sectional structure of the EL display device of embodiment 23. A driver circuit TFT (a CMOS circuit combining an n-channel TFT and a p-channel TFT is shown here) 4022 and a pixel section TFT 4023 (the only TFT that controls the current to the EL element is shown here.) are formed on the substrate 4010 and a base film 4021.

The present invention can be used for the driver circuit TFT 4022 and for the pixel section TFT 4023.

After completing the driver circuit TFT 4022 and the pixel section TFT 4023 using the present invention, a pixel electrode 4027 is formed by a transparent conductive film, on an interlayer insulating film (a flattening film) 4026 made of resin material, in order to electrically connect to the drain of the pixel section TFT 4023. An indium oxide and tin oxide compound (called ITO), or an indium oxide and zinc oxide compound can be used as the transparent conductive film. Then, after forming the pixel electrode 4027, an insulating film 4028 is formed, and an open section is formed on the pixel electrode 4027.

An EL layer 4029 is formed next. Any known EL materials (hole injection layer, hole transport layer, illumination layer, electron transport layer, electron injection layer) may be freely combined and used in a laminate structure or a single layer structure. A known technique may be used to determine the structure type. Further, there are low molecular materials and high molecular materials (polymers) as EL materials. An evaporation method is used for low molecular materials, but it is possible to use an easy method such as spin coating, printing, or ink jet for high molecular materials.

The EL layer is formed in embodiment 23 by an evaporation method using a shadow mask. By using a shadow mask and forming a luminescence layer that can emit different wavelengths of light for each pixel (red light emitting layer, green light emitting layer, and blue light emitting layer), color display is possible. Any other form may be used, such as combining color changing layers (CCM) with color filters, and combining white light emitting layers with color filters. Of course a single color emitting EL display device is also possible.

After forming the EL layer 4029, a cathode 4030 is formed on top. It is preferable to remove as much as possible of the moisture and oxygen existing in the interface between the cathode 4030 and the EL layer 4029. Therefore, it is necessary to form the EL layer 4029 and the cathode 4030 inside a vacuum by successive film deposition, or to form the EL layer 4029 in an inert atmosphere and then form the cathode 4030 without exposure to the atmosphere. It is possible to perform the above film deposition in embodiment 23 by using a multi-chamber system (cluster tool system) deposition device.

Note that a laminate structure of a LiF (lithium fluoride) film and an Al (aluminum) film is used for the cathode 4030 in embodiment 23. Specifically, a 1 nm thick LiF (lithium fluoride) film is formed on the EL layer 4029 by evaporation, and a 300 nm thick aluminum film is formed on top of that. Of course an MgAg electrode, a known cathode material, may be used. Then the cathode 4030 is connected to the wiring 4016 in the region denoted with the reference numeral 4031. The wiring 4016 is a power supply line in order to apply a preset voltage to the cathode 4030, and is connected to the FPC 4017 through a conductive paste material 4032.

The region denoted by reference numeral 4031 electrically connects the cathode 4030 and the wiring 4016, so it is necessary to form contact holes in the interlayer insulating film 4026 and the insulating film 4028. The contact holes may be formed during etching of the interlayer insulating film 4026 (when forming the pixel electrode contact hole) and during etching of the insulating film 4028 (when forming the open section before forming the EL layer). Further, etching may proceed in one shot all the way to the interlayer insulating film 4026 when etching the insulating film 4028. In this case the contact holes can have a good shape provided that the interlayer insulating film 4026 and the insulating film 4028 are the same resin material.

A passivation film 6003, a filler 6004, and a cover 6000 are formed, covering the surface of the EL element thus formed.

In addition, a sealing material is formed on the inside of the cover 6000 and the substrate 4010, so as to surround the EL element section, and the sealant 7001 (the second sealing material) is formed on the outside of the sealing material 7000.

At this point the filler 6004 also functions as an adhesive in order to bond the cover 6000. PVC (polyvinyl chloride), epoxy resin, silicone resin, PVB (polyvinyl butyral), or EVA (ethylene vinyl acetate) can be used as the filler 6004. If a drying agent is formed on the inside of the filler 6004, a moisture absorption effect can be maintained, so this is preferable.

Further, spacers may be included within the filler 6004. The spacers may be of a powdered substance such as BaO, etc., giving the spacers themselves the ability to absorb moisture.

When using spacers, the passivation film 6003 can relieve the spacer pressure. Further, a resin film, etc., can be formed separately from the passivation film 6003 to relieve the spacer pressure.

In addition, a glass plate, an aluminum plate, a stainless steel plate, an FRP (fiberglass-reinforced plastic) plate, a PVF (polyvinyl fluoride) film, a Mylar film, a polyester film, or an acrylic film can be used as the cover 6000. Note that if PVB or EVA is used as the filler 6004, it is preferable to use a sheet with a structure in which several tens of μm of aluminum foil is sandwiched by a PVF film or a Mylar film.

However, depending upon the light emission direction from the EL element (the light radiation direction), it is necessary for the cover 6000 to have light transmitting characteristics.

In addition, the wiring 4016 is electrically connected to the FPC 4017 through the opening among the sealing material 7000, the sealant 7001 and the substrate 4010. Note that an explanation of the wiring 4016 has been made, and the wirings 4014 and 4015 are also connected electrically to the FPC 4017 by similarly passing underneath the sealing material 7000 the sealant 7001.

Note that the structures of any of embodiments 1 to 22 may be combined for the active matrix type EL display of embodiment 23.

Embodiment 24

It is possible to use a variety of liquid crystal materials in a liquid crystal display device manufactured in accordance with the present invention. The following can be given as examples of the such materials: a TN liquid crystal; PDLC (polymer diffusion type liquid crystal); an FLC (ferroelectric liquid crystal); an AFLC (antiferroelectric liquid crystal); and a mixture of an FLC and an AFLC.

For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; and in U.S. Pat. No. 5,594,569 can be used.

In particular, if an antiferroelectric liquid crystal material with no threshold value (thresholdless antiferroelectric LCD: abbreviated TL-AFLC) is used, then there are cases where power supply voltage is on the order of 5 to 8 V because the liquid crystal operating voltage may be reduced to approximately ±2.5 V. Namely, it becomes possible to operate a driver circuit and a pixel matrix circuit at the same power supply voltage, and the entire liquid crystal display device can be made low power consumption.

Further, ferroelectric liquid crystals and antiferroelectric liquid crystals possess an advantage in that they have a high response time compared to TN liquid crystals. It is possible to realize an extremely fast operating speed TFT for a crystalline TFT such as one used by the above embodiment, and therefore it is possible to realize a liquid crystal display device with fast image response speed by sufficiently utilizing the fast response speed of ferroelectric liquid crystals and antiferroelectric liquid crystals.

Note that the liquid crystal display device of embodiment 24 is of course effective when used as an image display of electronic equipment such as a personal computer.

Further, it is possible to freely combine the structure of embodiment 24 with the structure of any of embodiments 1 to 22.

Embodiment 25

Other structures of an active matrix substrate are explained in embodiment 25 by using FIGS. 28A and 28B, and FIGS. 29A and 29B.

Figure 28A:
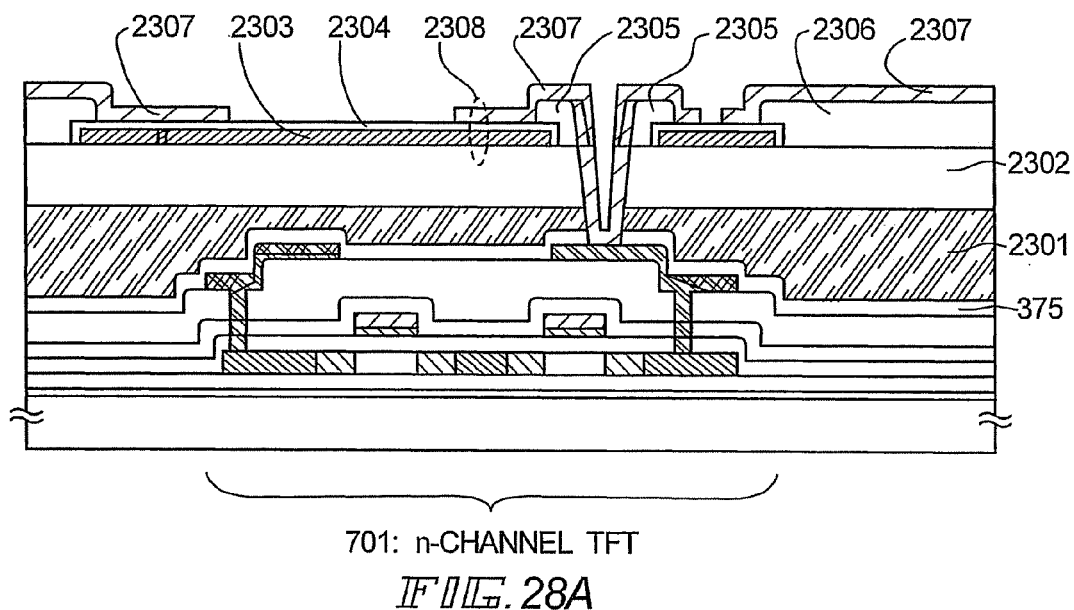
FIGS. 28A and 28B are diagrams showing the structure of pixel matrix circuit equipped with a color filter.

Note that the cross sectional structure of FIG. 28A is exactly the same up to the step of forming the passivation film 375 in accordance with the manufacturing processes explained in embodiment 1, and therefore an explanation will be made in embodiment 25 by focusing only on points that differ from those of embodiment 1. Further, an adhesiveness improving film may be formed to increase the adhesiveness to a color filter. Further, a structure may be used in which a film that possesses the effect to increase the adhesiveness to the color filter, and also a flattening effect, is formed. A structure in which the passivation film 375 is not formed is also acceptable.

Embodiment 25 has a structure in which a color filter 2301, which is colored with the three primary colors R, G, and B, is formed between a pixel TFT and a pixel electrode. The R, G, B color matrix may have a stripe shape or a mosaic shape.

After first forming the passivation film 375 in accordance with embodiment 1, the color filter 2301 is formed on top. The color filter 2301 also has a flattening film function. A second interlayer insulating film 2302 is formed next, and a shielding layer 2303 is formed on top. The same manufacturing method as in embodiment 1 is used for further processing, and an oxide film 2304 is formed, and a third interlayer insulating film 2305 is formed from an organic resin film. The third interlayer insulating film 2305, the second interlayer insulating film 2302, the color filter 2301, and the passivation film 375 are next etched, a contact hole is formed, and a pixel electrode 2307 is formed from the same material as in embodiment 1. A storage capacitor 2308 is structured by the shielding layer 2303, the oxide film 2304, and the pixel electrode.

Thus the state of FIG. 28A is obtained.

Figure 28B:
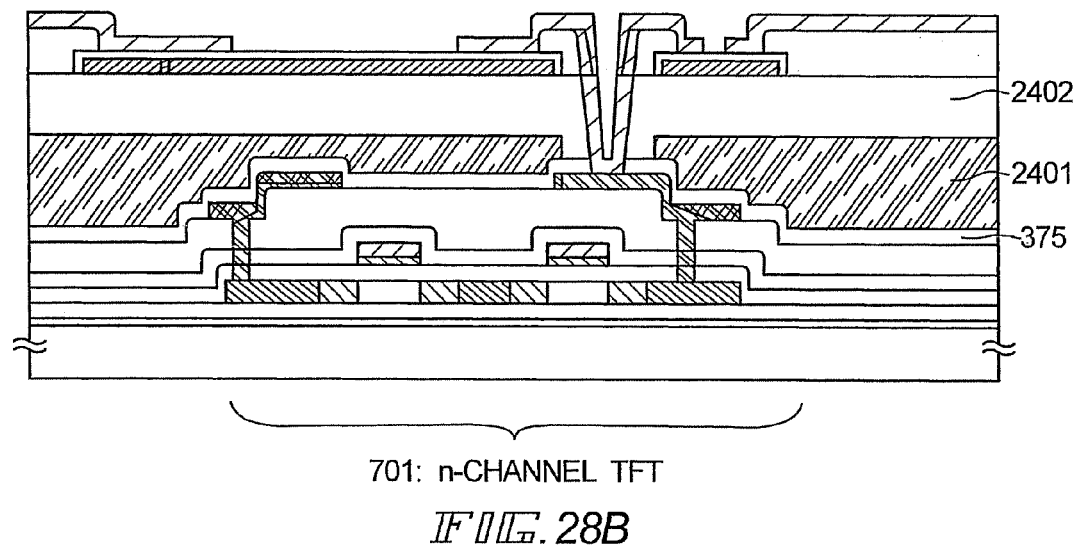

An example of forming an ITO contact opening in advance, at the same time as the color filter 2301 is patterned, or after forming the color filter, is shown in FIG. 28B. The advantages of this type of structure are: the opening film thickness can be kept on the order of 1 μm because the color filter does not exist in the contact area; there is no problem of contamination by impurities contained in the color filter when opening (etching) the contact hole; and this is an extension of a conventional process, and it is not necessary to add new manufacturing equipment.

Note that the alignment error between the pixel electrode and the color filter nearly disappears by use of the color filter, and therefore a high aperture ratio can be realized. Further, this makes it possible to be applied to a small panel with a size of 1 inch or less.

Figure 29A:
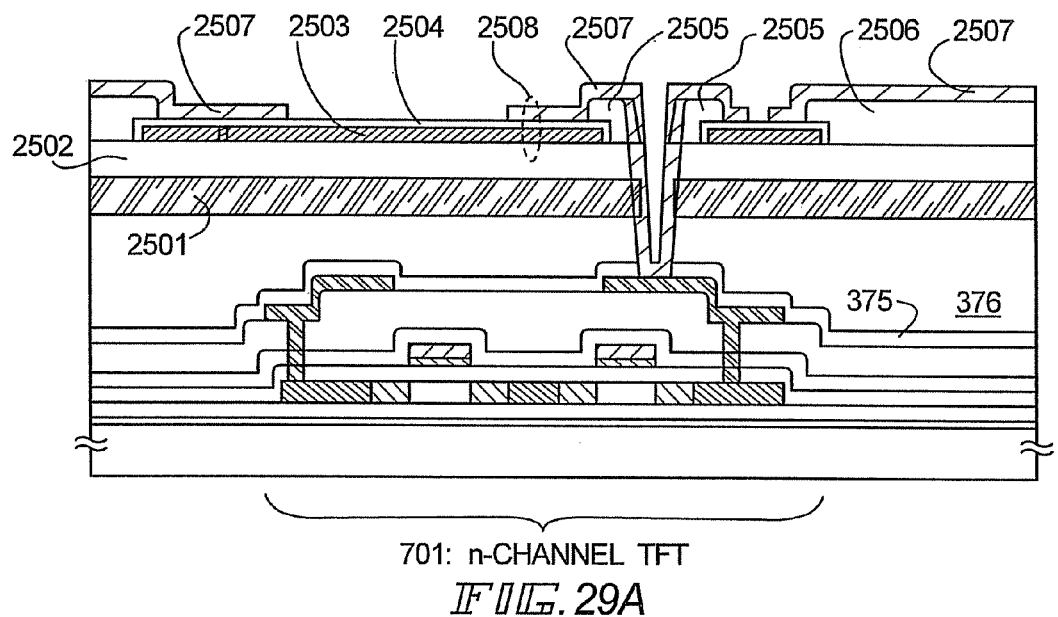
FIGS. 29A and 29B are diagrams showing the structure of the pixel matrix circuit equipped with the color filter.
Figure 29B:
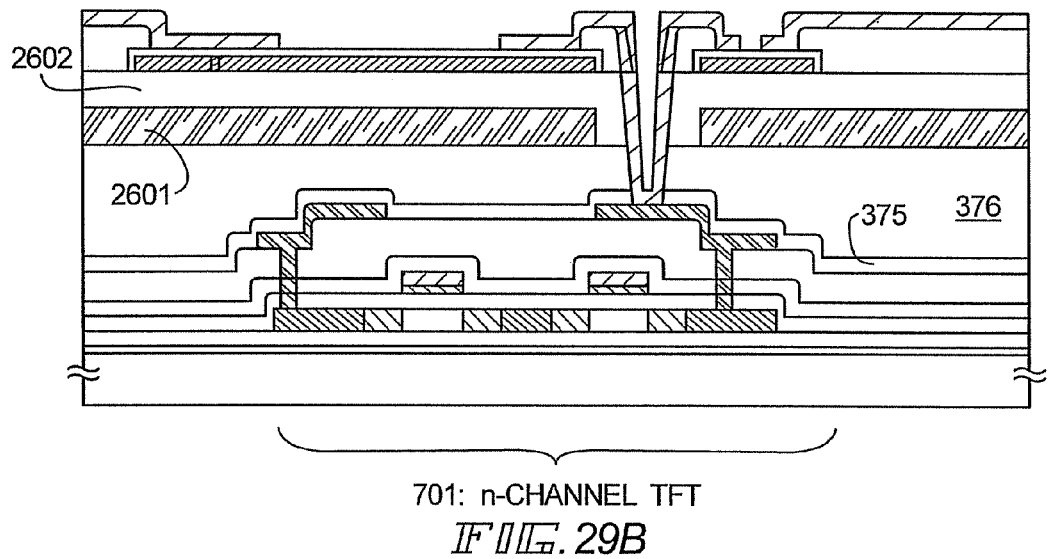

An example that is distinct from the above example is shown in FIGS. 29A and 29B.

Note that the cross sectional structure of FIG. 29A is exactly the same up to the step of forming the second interlayer insulating film 376 in accordance with the manufacturing processes explained in embodiment 1, and therefore an explanation will be made in embodiment 25 by focusing only on points that differ from those of embodiment 1.

After first forming the second interlayer insulating film 376 in accordance with embodiment 1, a color filter 2501 is formed on top. A third interlayer insulating film 2502 is formed next, and a shielding layer 2503 is formed on top. The same manufacturing method as in embodiment 1 is used for further processing, and an oxide film 2504 is formed, and a fourth interlayer insulating film 2505 is formed from an organic resin film. The fourth interlayer insulating film 2503, the third interlayer insulating film 2502, the color filter 2501, the second interlayer insulating film 376, and the passivation film 375 are next etched, a contact hole is formed, and a pixel electrode 2507 is formed from the same material as in embodiment 1. A storage capacitor 2508 is structured by the shielding layer 2503, the oxide film 2504, and the pixel electrode.

Thus the state of FIG. 29A is obtained.

An example of forming a third interlayer insulating film 2602 after forming a color filter 2601 by patterning the color filter 2501, is shown in FIG. 29B. The advantages of this type of structure are: the opening film thickness can be made thinner compared to the structure of FIG. 29A when opening the contact because the color filter does not exist in the contact area; there is no problem of contamination by impurities contained in the color filter when opening (etching) the contact hole; and this is an extension of a conventional process, and it is not necessary to add new manufacturing equipment.

Note that it is possible to freely combine the structure of embodiment 25 with the structure of any of embodiments 1 to 22.

Embodiment 26

CMOS circuits and pixel section formed in accordance with the present invention can be used in various electrooptical devices (active matrix type liquid crystal display, active matrix type EL display, active matrix type EC display). In other words, the present invention can be applied to all of the electronic devices having these electrooptical devices as the display section.

The following can be given as examples of this type of electronic devices: video cameras; digital cameras; projectors (rear type or front type); head mounted displays (goggle type display); car navigation systems; car stereo; personal computers; portable information terminals (such as mobile computers, portable telephones and electronic notebook). Some examples of these are shown in FIGS. 25A to 25F, 31A to 31D and 32A to 32C.

Figure 25A:
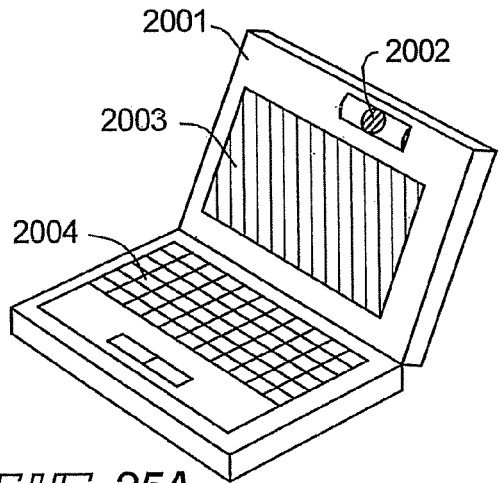
FIGS. 25A to 25F are diagrams showing examples of electronic equipment.

FIG. 25A is a personal computer, and comprises a main body 2001, an image input section 2002, a display device 2003, and a keyboard 2404. The present invention may be applied to the image input section 2002, display device 2003 or other signal control circuits.

Figure 25B:
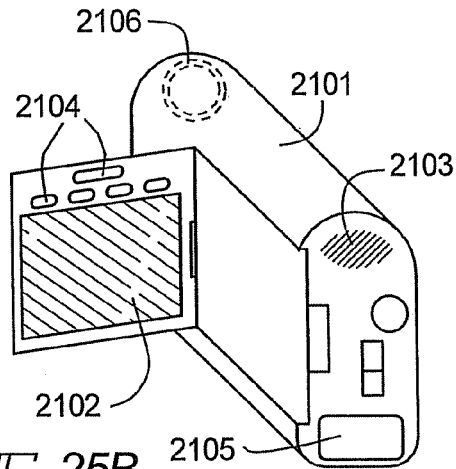

FIG. 25B is a video camera, and comprises a main body 2101, a display device 2102, a voice input section 2103, operation switches 2104, a battery 2105, and an image receiving section 2106 etc. The present invention can be applied to the display device 2102 and other signal control circuits.

Figure 25C:
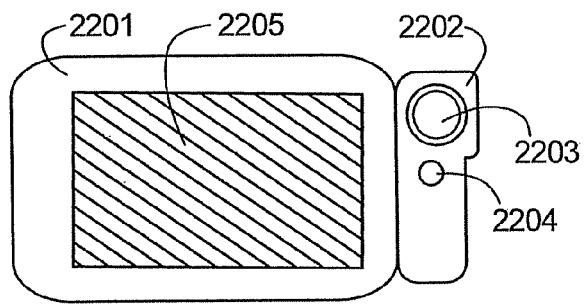

FIG. 25C is a mobile computer, and comprises a main body 2201, a camera section 2202, an image receiving section 2203, operation switches 2204, and a display device 2205 etc. The present invention can be applied to the display device 2205 and other signal control circuits.

Figure 25D:
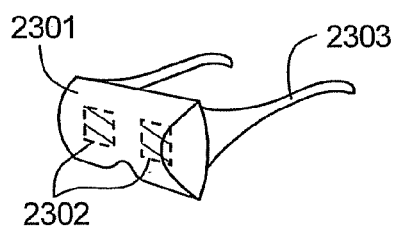

FIG. 25D is a goggle type display, and comprises a main body 2301, display devices 2302, and arm sections 2303 etc. The present invention can be applied to the display device 2302 and other signal control circuits.

Figure 25E:
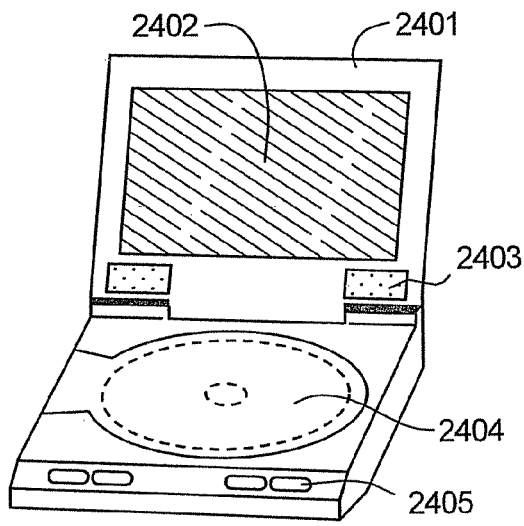

FIG. 25E is a player that uses a recording medium on which a program is recorded (hereinafter referred to as a recording medium), and comprises a main body 2401, a display device 2402, a speaker section 2403, a recording medium 2404, and operation switches 2405 etc. Note that music appreciation, film appreciation, games, and the use of the Internet can be performed with this device using a DVD (digital versatile disk), a CD, etc., as a recording medium. The present invention can be applied to the display device 2402, and to other signal control circuits.

Figure 25F:
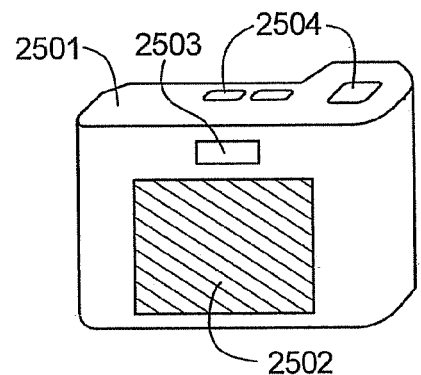
Figure 26:
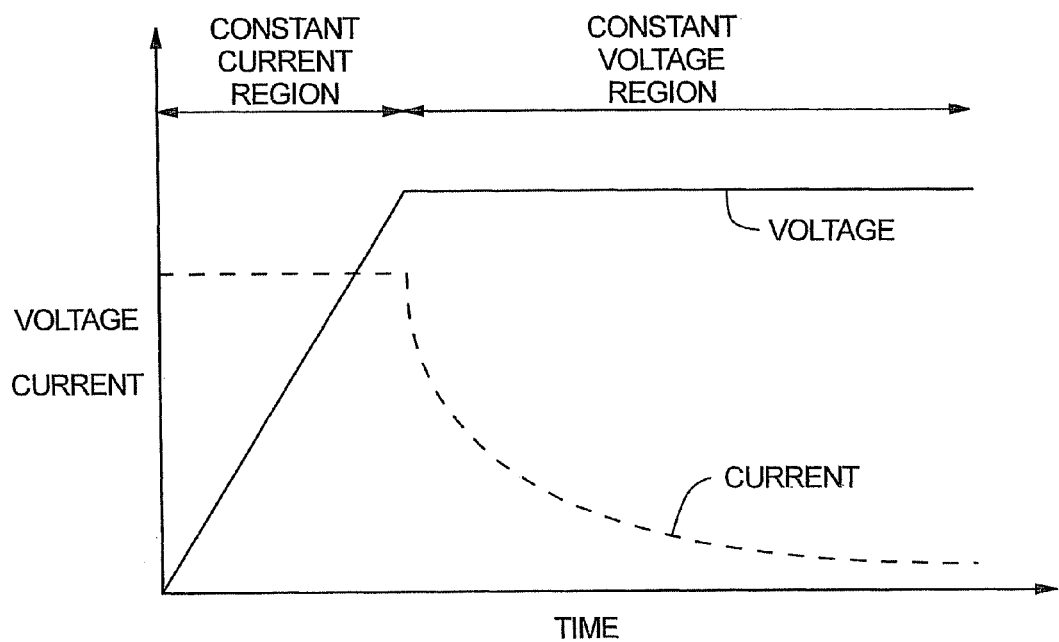
FIG. 26 is a diagram showing the relationship between the applied voltage and the current in the anodic oxidation process of a comparison example.

FIG. 25F is a digital camera, and comprises a main body 2501, a display device 2502, a viewfinder 2503, operation switches 2504, and an image receiving section (not shown in the figure). The present invention can be applied to the display device 2502 and to other signal control circuits.

Figure 31A:
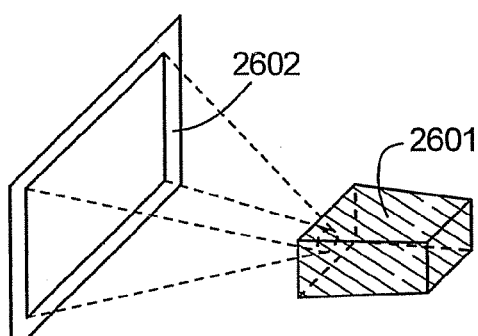
FIGS. 31A to 31D are diagrams showing examples of electronic equipment.

FIG. 31A is a front type projector, and comprises a projector device 2601 and a screen 2602 etc. The present invention can be applied to the liquid crystal display device 2808 that structures a section of the projector device 2601 and to other signal control circuits.

Figure 31B:
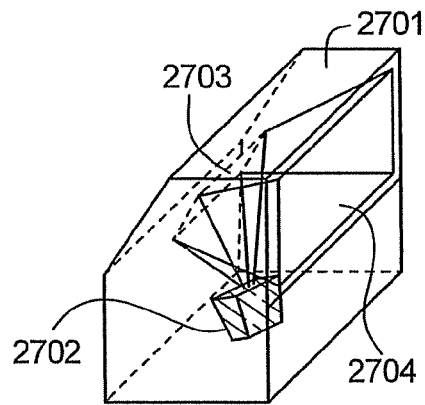

FIG. 31B is a rear type projector, and comprises a main body 2701, a projector device 2702, a mirror 2703 and screen 2704 etc. The present invention can be applied to the liquid crystal display device 2808 that comprises a section of the projector device 2702 and other signal control circuits.

Figure 31C:
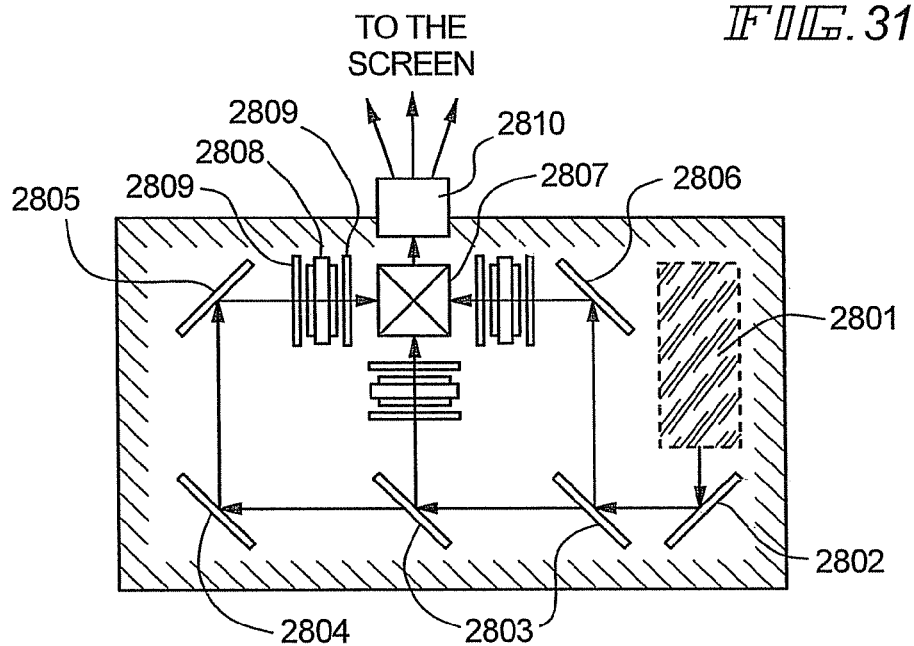

Note that FIG. 31C is a drawing showing one example of the structure of the projector devices 2601 and 2702 from FIGS. 31A and 31B. The projector devices 2601 and 2702 comprises an optical light source system 2801, mirrors 2802 and 2804 to 2806, dichroic mirror 2803, a prism 2807, a liquid crystal display device 2808, phase differentiating plate 2809 and an optical projection system 2810. The optical projection system 2810 is composed of an optical system provided with a projection lens. Embodiment 26 shows an example of triple stage, but there are no special limits and a single stage is acceptable, for example. Further, the operator may set optical systems such as optical lenses, film having polarizing function, film to regulate the phase difference, IR films, etc., suitably within the optical path shown by an arrow in FIG. 31C.

Figure 31D:
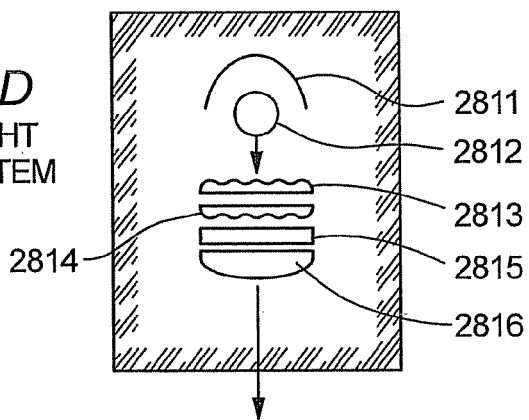

In addition, FIG. 31D shows one example of the structure of the optical light source system 2801 from FIG. 31C. In embodiment 26, the optical light source system 2801 comprises a reflector 2811, light source 2812, lens arrays 2813 and 2814, a polarizing conversion element 2815 and a condensing lens 2816. Note that the optical light source shown in FIG. 31D is merely an example and is not specifically limited to this structure. For example, the operator may suitably place optical lenses, film having polarizing function, film to regulate the phase difference, IR films, etc.

Note that the projector shown in FIGS. 31A to 31D show the case when a transmission type electrooptical device is used, and application example of reflection type electrooptical device and EL display device are not shown.

Figure 32A:
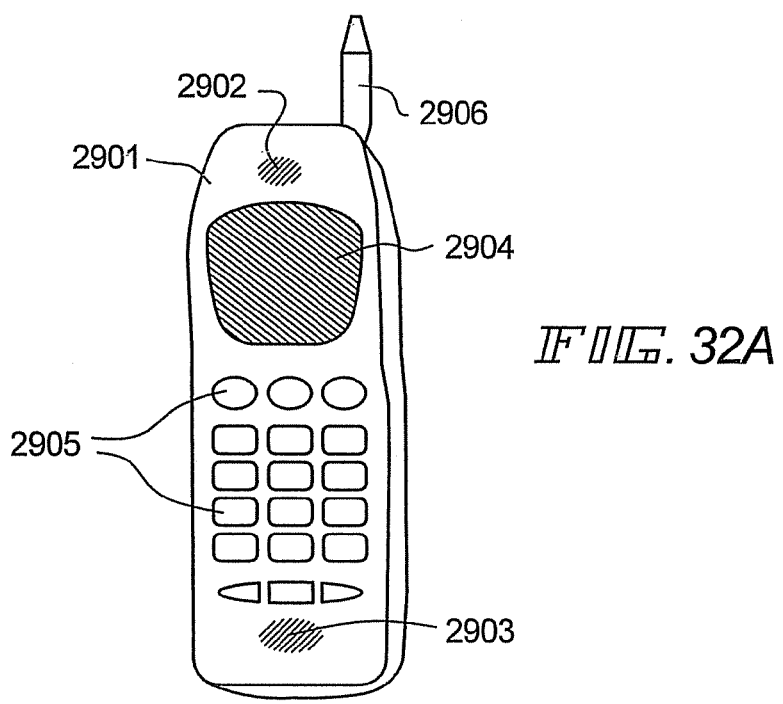
FIGS. 32A to 32C are diagrams showing examples of the electronic equipment.

FIG. 32A is a portable telephone, and comprises a main body 2901, a voice output section 2902, a voice input section 2903, a display device 2904, operation switches 2905, and an antenna 2906 etc. The present invention can be applied to the voice output section 2902, to the voice input section 2903, to the display device 2904, and to other signal control circuits.

Figure 32B:
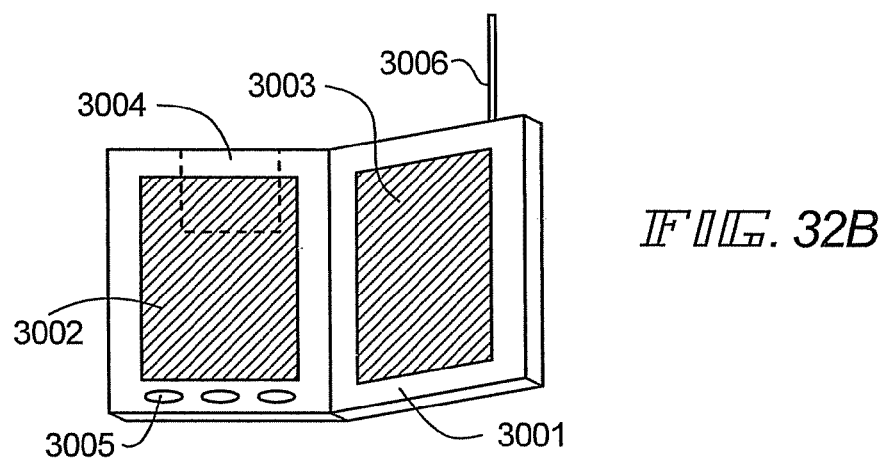

FIG. 32B is a portable book (electronic book), and comprises a main body 3001, display devices 3002 and 3003, a recording medium 3004, operation switches 3005, and an antenna 3006, etc. The present invention can be applied to the display devices 3002 and 3003 and to other signal control circuits.

Figure 32C:
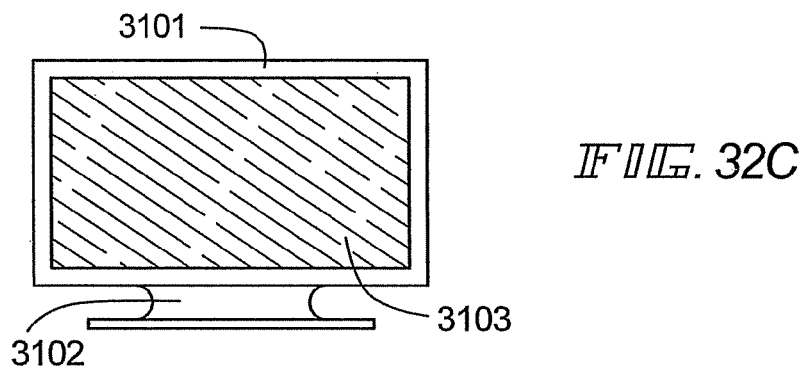

FIG. 32C is a display, and comprises a main body 3101, supporting section 3102, display device 3103. The present invention can be applied to the display device 3103. The display of the present invention is specifically advantageous in large sized display, and it is advantageous in a display over diagonal 10 inch (specifically over 30 inch).

As shown above, the applicable range of the present invention is extremely wide, and it is possible to apply the present invention to electronic equipment in all fields. Further, an electronic device of the present invention can be realized by using structure of any combination of embodiments 1 to 25.

Through use of the present invention, the amount of wrap around X can be reduced to 0.5 μm or less, preferably to 0.1 μm or less, by covering the surface of electrodes formed on the insulating films, especially resin films, used in each circuit of an electro-optical device, typically an AM-LCD, with an anodic oxide film. And a high reliability semiconductor device having an electrode with superior adhesiveness can be manufactured.

Furthermore, a storage capacitor with a small surface area and a large capacitance can be formed in a pixel matrix circuit of the electro-optical device, typically an AM-LCD. Therefore, it is possible to secure a sufficient storage capacitance also in an AM-LCD with a one inch or less diagonal without lowering the opening ratio. Further, the coverage of a pixel electrode formed on top can be made better because the amount of wrap around of the anodic oxide film is 0.5 μm or less, preferably 0.1 μm or less, and the yield can also be increased.

What is claimed is:

1. A semiconductor device comprising:
   a transistor comprising:
      a semiconductor film;
      a gate insulating film adjacent to the semiconductor film; and
      a gate adjacent to the semiconductor film with the gate insulating film interposed therebetween;
   a first wiring electrically connected to the semiconductor film;
   a first insulating film over the transistor and the first wiring, the first insulating film including a first opening over the first wiring;
   a color filter over the first insulating film, the color filter including a second opening over the first opening;
   a second insulating film over the color filter, the second insulating film including a third opening over the first opening; and
   a pixel electrode over the second insulating film, the pixel electrode being in contact with the first wiring through the first to third openings,
   wherein the first insulating film is interposed between the first wiring and the color filter so that the first wiring is not in contact with the color filter in the first to third openings,
   wherein a portion where the pixel electrode is in contact with the first wiring is provided over a first region and a second region,
   wherein the first region and the second region each include a semiconductor, and
   wherein an impurity concentration of the first region is higher than that of the second region.

2. The semiconductor device according to claim 1, wherein the semiconductor film comprises crystalline silicon.

3. The semiconductor device according to claim 1,
   wherein the semiconductor film comprises the first region and the second region, and
   wherein the first region is an LDD region.

4. The semiconductor device according to claim 1, wherein the gate is over the semiconductor film.

5. The semiconductor device according to claim 1, wherein the color filter has a flat upper surface.

6. The semiconductor device according to claim 1, wherein the second insulating film includes an organic compound.

7. The semiconductor device according to claim 1, further comprising a second wiring interposed between the second insulating film and the pixel electrode,
   wherein the second wiring comprises a material capable of anodic oxidation.

8. The semiconductor device according to claim 1, wherein the transistor further comprises another gate.

9. The semiconductor device according to claim 1, wherein the semiconductor device is selected from the group consisting of an active matrix liquid crystal display, a liquid crystal display panel, an active matrix EL display, an active matrix EC display, and an electro-optical device.

10. A semiconductor device comprising a pixel, the pixel comprising:
    a transistor comprising:
       a semiconductor film;
       a gate insulating film adjacent to the semiconductor film; and
       a gate adjacent to the semiconductor film with the gate insulating film interposed therebetween;
    a first wiring electrically connected to the semiconductor film;
    a first insulating film over the transistor and the first wiring, the first insulating film including a first opening over the first wiring;
    a color filter over the first insulating film, the color filter including a second opening over the first opening;
    a second insulating film over the color filter, the second insulating film including a third opening over the first opening; and
    a pixel electrode over the second insulating film, the pixel electrode being in contact with the first wiring through the first to third openings, wherein the first insulating film is interposed between the first wiring and the color filter so that the first wiring is not in contact with the color filter in the first to third openings, wherein a portion where the pixel electrode is in contact with the first wiring is overlapped with a first region and a second region, wherein the first region and the second region each include a semiconductor, and wherein an impurity concentration of the first region is higher than that of the second region.

11. The semiconductor device according to claim 10, wherein the semiconductor film comprises crystalline silicon.

12. The semiconductor device according to claim 10,
wherein the semiconductor film comprises the first region and the second region, and
wherein the first region is an LDD region.

13. The semiconductor device according to claim 10, wherein the gate is over the semiconductor film.

14. The semiconductor device according to claim 10, wherein the color filter has a flat upper surface.

15. The semiconductor device according to claim 10, wherein the second insulating film includes an organic compound.

16. The semiconductor device according to claim 10, further comprising a second wiring interposed between the second insulating film and the pixel electrode,
wherein the second wiring comprises a material capable of anodic oxidation.

17. The semiconductor device according to claim 10, wherein the transistor further comprises another gate.

18. The semiconductor device according to claim 10, wherein the semiconductor device is selected from the group consisting of an active matrix liquid crystal display, a liquid crystal display panel, an active matrix EL display, an active matrix EC display, and an electro-optical device.

19. A semiconductor device comprising a pixel, the pixel comprising:
a transistor comprising:
a semiconductor film;
a gate insulating film adjacent to the semiconductor film; and
a gate adjacent to the semiconductor film with the gate insulating film interposed therebetween;
a first wiring electrically connected to the semiconductor film;
a first insulating film over the transistor and the first wiring, the first insulating film including a first opening over the first wiring;
a color filter over the first insulating film, the color filter including a second opening over the first opening;
a second insulating film over the color filter, the second insulating film including a third opening over the first opening;
a third insulating film interposed between the first insulating film and the color filter the third insulating film including a fourth opening over the first opening; and
a pixel electrode over the second insulating film, the pixel electrode being in contact with the first wiring through the first to fourth openings, wherein the first insulating film is interposed between the first wiring and the color filter so that the first wiring is not in contact with the color filter in the first to fourth openings, wherein a portion where the pixel electrode is in contact with the first wiring is overlapped with a first region and a second region, wherein the first region and the second region each include a semiconductor, and wherein an impurity concentration of the first region is higher than that of the second region.

20. The semiconductor device according to claim 19, wherein the third insulating film includes an organic compound.

21. The semiconductor device according to claim 19, wherein the semiconductor film comprises crystalline silicon.

22. The semiconductor device according to claim 19,
wherein the semiconductor film comprises the first region and the second region, and
wherein the first region is an LDD region.

23. The semiconductor device according to claim 19, wherein the gate is over the semiconductor film.

24. The semiconductor device according to claim 19, wherein the color filter has a flat upper surface.

25. The semiconductor device according to claim 19, wherein the second insulating film includes an organic compound.

26. The semiconductor device according to claim 19, further comprising a second wiring interposed between the second insulating film and the pixel electrode,
wherein the second wiring comprises a material capable of anodic oxidation.

27. The semiconductor device according to claim 19, wherein the transistor further comprises another gate.

28. The semiconductor device according to claim 19, wherein the semiconductor device is selected from the group consisting of an active matrix liquid crystal display, a liquid crystal display panel, an active matrix EL display, an active matrix EC display, and an electro-optical device.

* * * * *